(12) United States Patent
Andrei et al.

(10) Patent No.: US 7,005,852 B2
(45) Date of Patent: Feb. 28, 2006

(54) DISPLAYS WITH ALL-METAL ELECTRONICS

(75) Inventors: Radu Andrei, Monterey, CA (US);
Richard Spitzer, Berkeley, CA (US);
E. James Torok, Shoreview, MN (US)

(73) Assignee: Integrated Magnetoelectronics Corporation, Berkeley, CA (US)

( * ) Notice: Subject to any disclaimer, the term of this patent is extended or adjusted under 35 U.S.C. 154(b) by 0 days.

(21) Appl. No.: 10/806,895

(22) Filed: Mar. 22, 2004

(65) Prior Publication Data

US 2004/0196704 A1    Oct. 7, 2004

Related U.S. Application Data

(60) Provisional application No. 60/460,277, filed on Apr. 4, 2003.

(51) Int. Cl.
*G01R 33/02* (2006.01)
(52) U.S. Cl. ............... 324/252; 365/230.06; 365/158; 257/421
(58) Field of Classification Search ............... 324/252, 324/249; 338/32 R; 360/110, 111, 113; 365/230.06, 158, 173; 257/295, 421–427, 257/52, 359
See application file for complete search history.

(56) References Cited

U.S. PATENT DOCUMENTS

| | | |
|---|---|---|
| 2,911,627 A | 11/1959 | Kilburn et al. |
| 3,972,786 A | 8/1976 | Ballard |
| 4,751,677 A | 6/1988 | Daughton et al. |
| 4,780,848 A | 10/1988 | Daughton et al. |
| 4,829,476 A | 5/1989 | Dupuis et al. |
| 5,051,695 A | 9/1991 | Hunter et al. |
| 5,173,873 A | 12/1992 | Wu et al. |
| 5,251,170 A | 10/1993 | Daughton et al. |
| 5,432,734 A | 7/1995 | Kawano et al. |
| 5,442,508 A | 8/1995 | Smith |
| 5,477,143 A | 12/1995 | Wu |
| 5,477,482 A | 12/1995 | Prinz |
| 5,515,314 A | 5/1996 | Kouhei et al. |
| 5,561,368 A | 10/1996 | Dovek et al. |
| 5,565,236 A | 10/1996 | Gambino et al. |
| 5,585,986 A | 12/1996 | Parkin |
| 5,587,943 A | 12/1996 | Torok et al. |
| 5,640,343 A | 6/1997 | Gallagher et al. |
| 5,640,754 A | 6/1997 | Lazzari et al. |
| 5,650,889 A | 7/1997 | Yamamoto et al. |
| 5,650,958 A | 7/1997 | Gallagher et al. |
| 5,652,445 A | 7/1997 | Johnson |
| 5,654,566 A | 8/1997 | Johnson |

(Continued)

FOREIGN PATENT DOCUMENTS

EP    1 132 917 A2    3/2000

(Continued)

OTHER PUBLICATIONS

Jaquelin K. Spong, et al., "Giant Magnetoresistive Spin Valve Bridge Sensor", Mar. 1996, *IEEE Transactions on Magnetics*, vol. 32, No. 2, pp. 366-371.

(Continued)

*Primary Examiner*—Joseph Williams
(74) *Attorney, Agent, or Firm*—Beyer Weaver & Thomas LLP

(57) ABSTRACT

A display device is described having a panel and all-metal electronics formed on a surface of the panel and operable to control operation of a plurality of basic visible elements associated with the panel.

31 Claims, 42 Drawing Sheets

U.S. PATENT DOCUMENTS

| | | | |
|---|---|---|---|
| 5,661,449 | A | 8/1997 | Araki et al. |
| 5,686,837 | A | 11/1997 | Coehoorn et al. |
| 5,793,697 | A | 8/1998 | Scheuerlein |
| 5,852,574 | A | 12/1998 | Naji |
| 5,892,708 | A | 4/1999 | Pohm |
| 5,903,708 | A | 5/1999 | Kano et al. |
| 5,920,500 | A | 7/1999 | Tehrani et al. |
| 5,929,636 | A | 7/1999 | Torok et al. |
| 5,969,978 | A | 10/1999 | Prinz |
| 5,989,406 | A | 11/1999 | Beetz, Jr. et al. |
| 6,031,273 | A | 2/2000 | Torok et al. |
| 6,134,138 | A | 10/2000 | Lu et al. |
| 6,166,944 | A | 12/2000 | Ogino |
| 6,169,292 | B1 | 1/2001 | Yamazaki et al. |
| 6,278,594 | B1 | 8/2001 | Engel et al. |
| 6,292,336 | B1 | 9/2001 | Horng et al. |
| 6,483,740 | B1 | 11/2002 | Spitzer et al. |
| 2002/0024842 | A1 | 2/2002 | Spitzer et al. |
| 2002/0037595 | A1 | 3/2002 | Hostani |

FOREIGN PATENT DOCUMENTS

| | | |
|---|---|---|
| WO | WO 97/41601 | 6/1997 |
| WO | WO 02/05268 A2 | 1/2002 |
| WO | WO 02/05470 A2 | 1/2002 |
| WO | WO 02/078100 A1 | 10/2002 |

OTHER PUBLICATIONS

Mark Johnson, "*The All-Metal Spin Transistor*", May 1994, *IEEE Spectrum,* pp. 47-51.

Mark Johnson, "*Bipolor Spin Switch*", Apr. 16, 1996, *Science,* vol. 260, pp. 320-323.

J.M. Daughton, "*Magnetoresistive Memory Technology.*" Jul. 28 - Aug. 2, 1991, *Int'l Workshop on Science and Technology of Thin Films for the 21st Century,* vol. 216, pp. 162-168.

K.T.M. Ranmuthu *et al.,* " *New Low Current Memory Modes with Giant Magneto-Resistance Materials,*" Apr. 13, 1993, *Digests of International Magnetics Conference,* 2 pages.

J.L. Brown, "*1-Mb Memory Chip Using Giant Magnetoresistive Memory Cells,*" Sep. 1994, *IEEE Transactions on Components, Packaging, and Manufacturing Technology,* Part A. vol. 17, No. 3, pp. 373-379.

Torok et al., "*Measurement of the Easy-Axis and Hk Probability Desity Functions for Thin Ferromagnetic Films Using the Longitudinal Permeability Hysteresis Loop*", *Journal of Applied Physics,* 33, No. 10, Oct. 1962, pp. 3037-3041.

Torok, et al, "*Longitudinal Permeability in Thin Permalloy Films*", *Journal of Applied Physics,* 34, No. 4, (Part 2), Apr. 1963, pp. 1064-1066.

Paul a. Packan, "*Pushing The Limits*", Sep. 24, 1999. science Mag, vol. 285, pp. 2079-2081.

Pratt, W.P., et al., "*Perpendicular Giant Magnetoresistances of Ag/Co Multilayers*", *Physical Review Letters,* 66 (23): 3060-3063 (Jun. 1991).

Parkin, S.S.P, et al., "*Oscillatory Magnetic Exchange Coupling through Thin Copper Layers*", *Physical Review Letters,* 66(16): 2152-2155 (Apr. 1991).

Jones, K., "*Texas Instruments Plans Large Expansion*", *The New York Times*(Aug. 20, 1993).

Callaby, D.R. et al., Solid State Memory Study Final Report, Technical Report No. RE-0013, National Media Lab, St. Paul, MN (Feb. 1994).

National Media Laboratory Spring Review on Solid-State Memory Technologies, Proc. 1994 Spring Conference on Solid-State Memory Technologies, Pasadena, CA, (May 23-25, 1994), pp. 3-8, 97, 121, 123-133.

Harrison, R.W., "*Laser Scanning Surface Profilomete*", *IBM Technical Disclosure Bullentin,* 13(3): 789-790 (Aug. 1970).

Hylton, T.L., et al, "*Giant Magnetoresistance at Low Fields in Discontinuous NiFe-Ag Multilayer Thin Films*", *Science,* 261:1021-1024 (Aug. 1993).

Xiao, et al., "*Giant Magnetoresistance in Nonmultilayer Magnetic Systems*", *Physical Review Letters,* vol. 68, No. 25, Jun. 22, 1992, pp. 3749-3752.

Zhang, S., "*Theory of Giant Magnetoresistance in Magnetic Granular Films*", *Appl. Phys. Lett.,* 61(15): 1855-1857 (Oct. 1992).

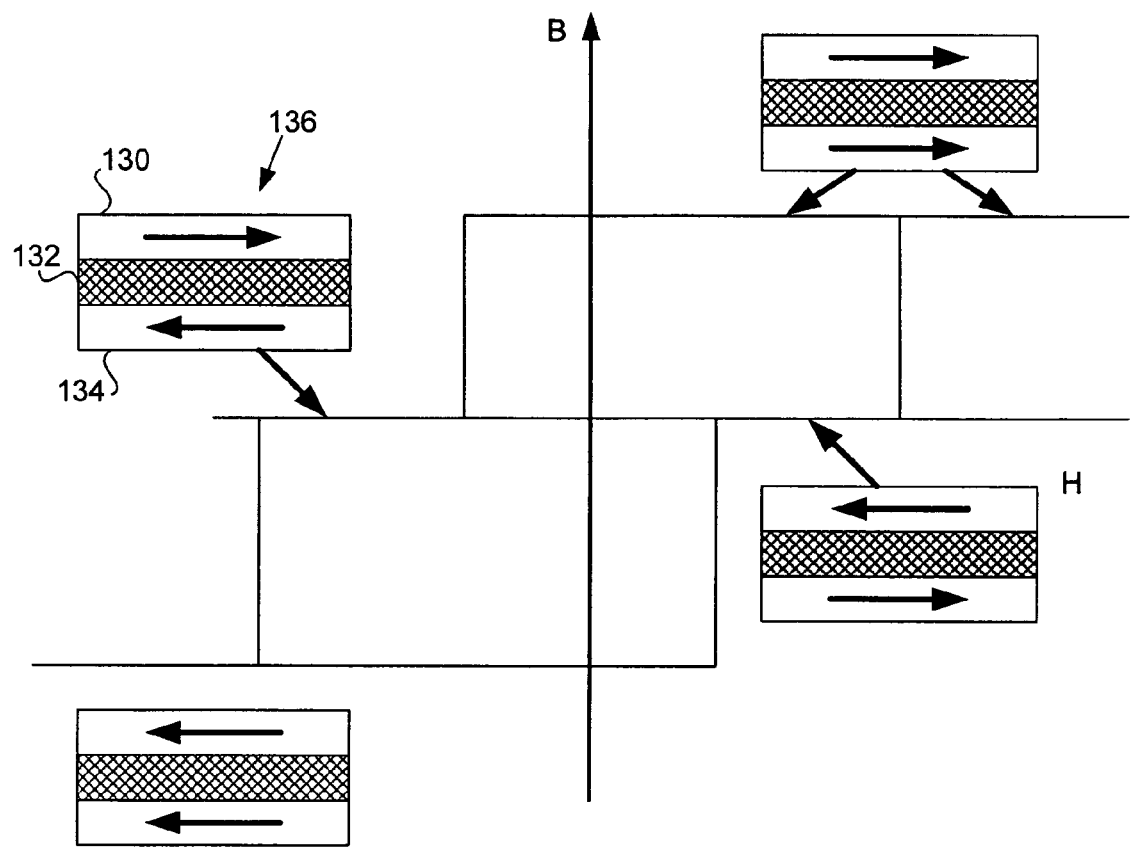
FIG. 2
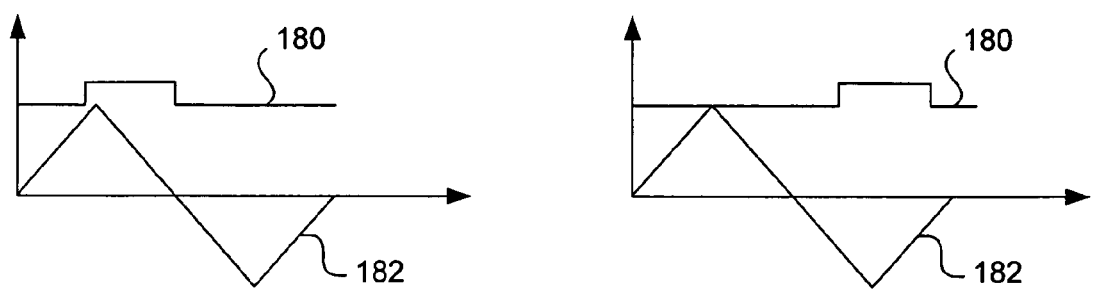
(a)　　FIG. 3　　(b)

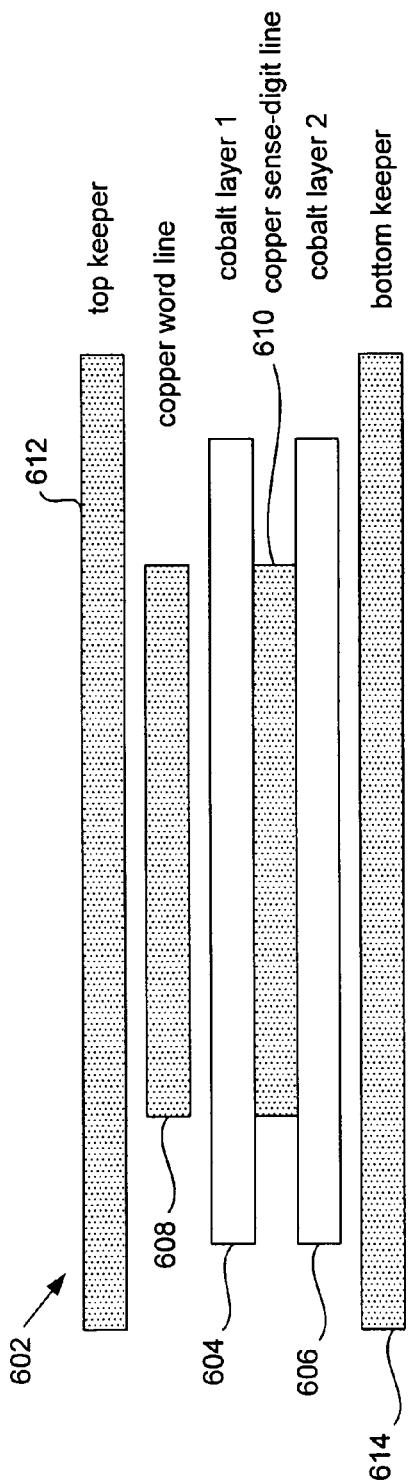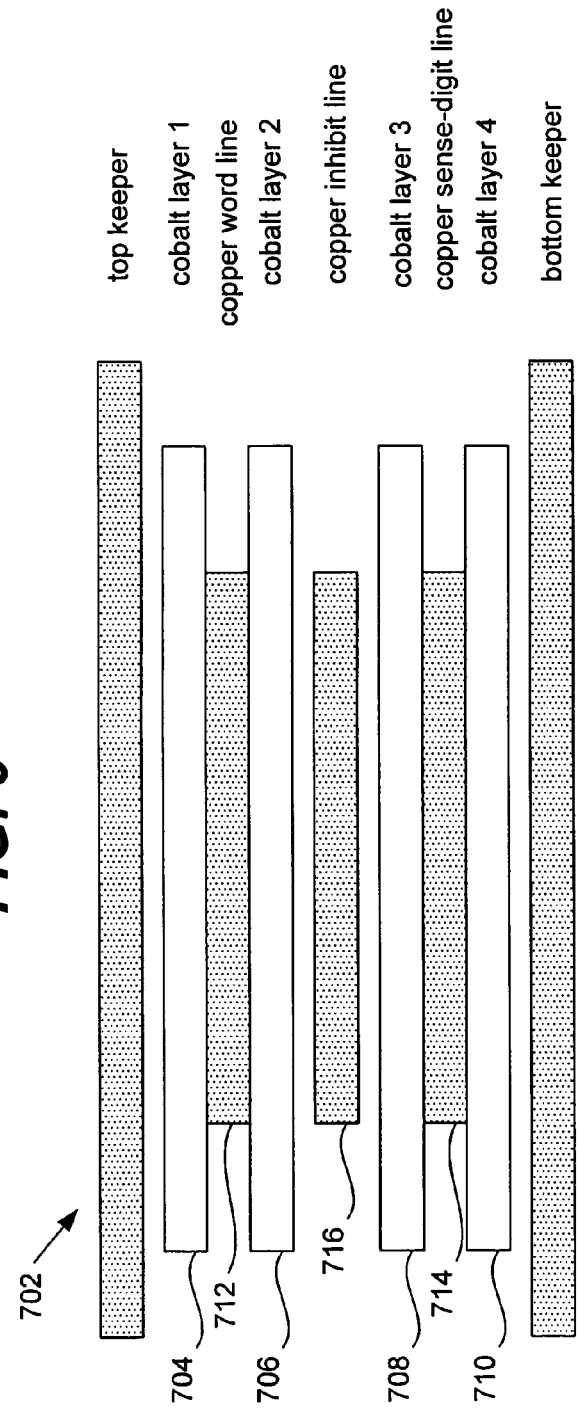
FIG. 6
FIG. 7

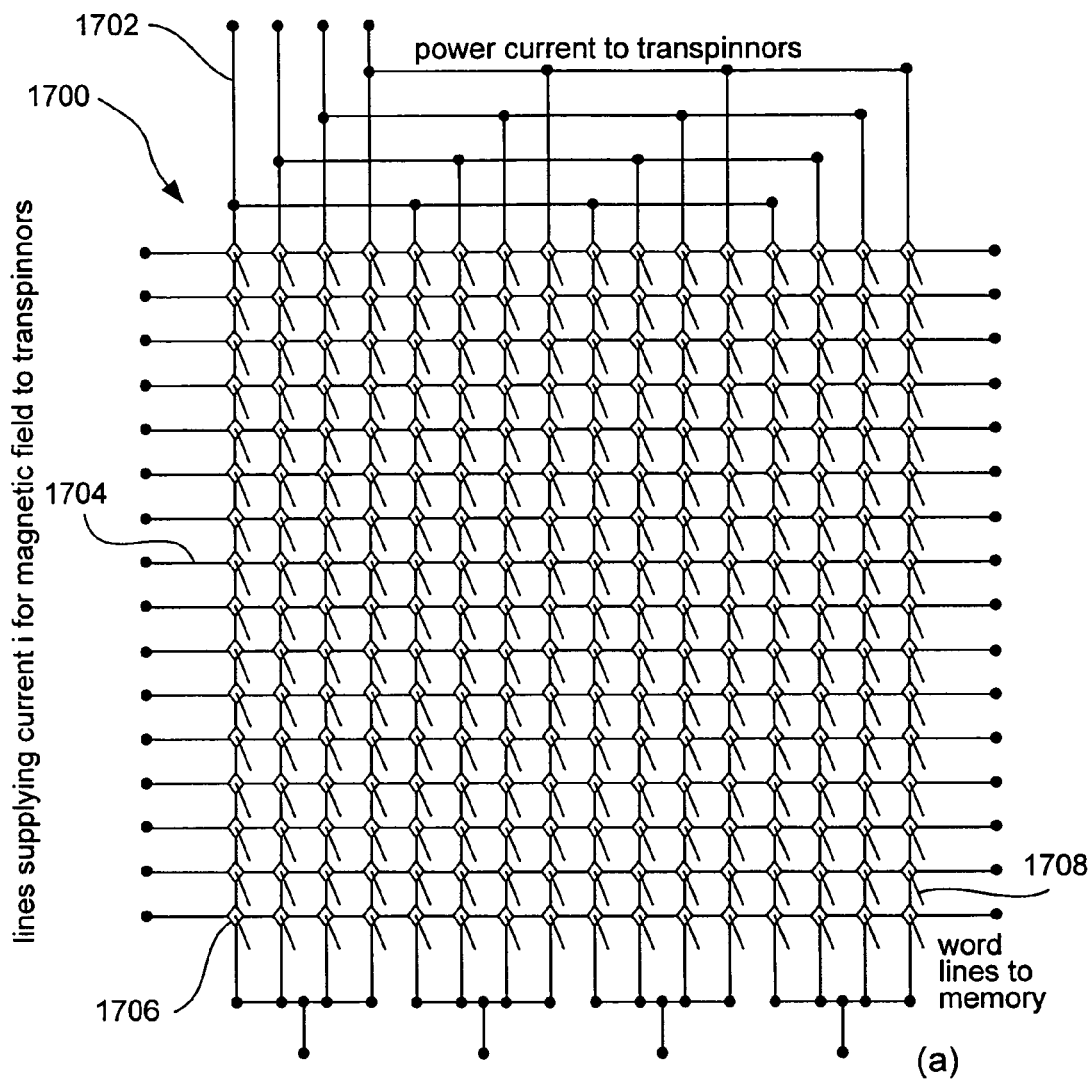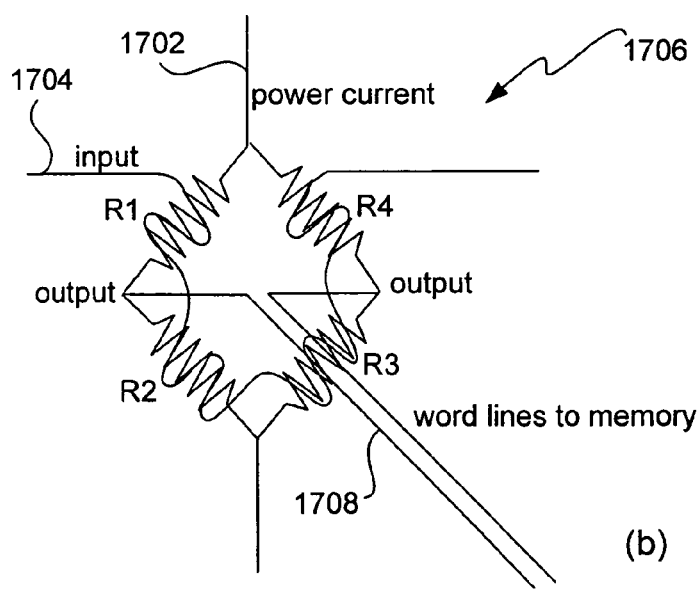
FIG. 17

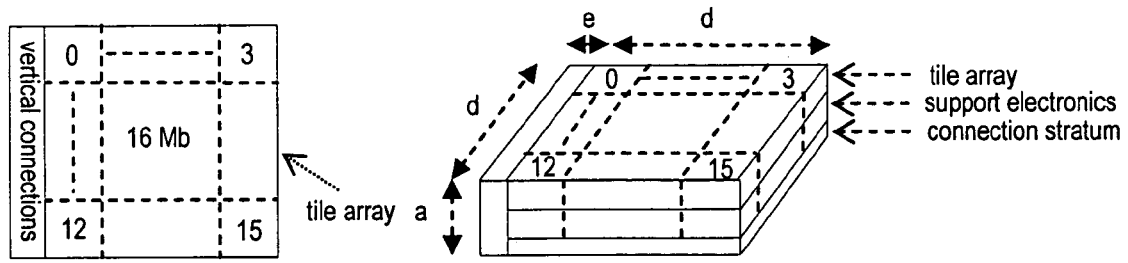
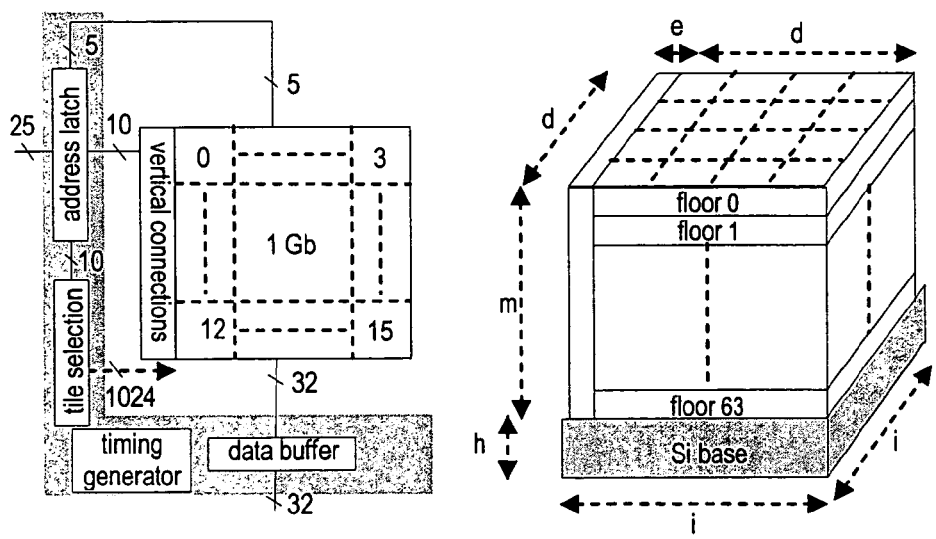
FIG. 37

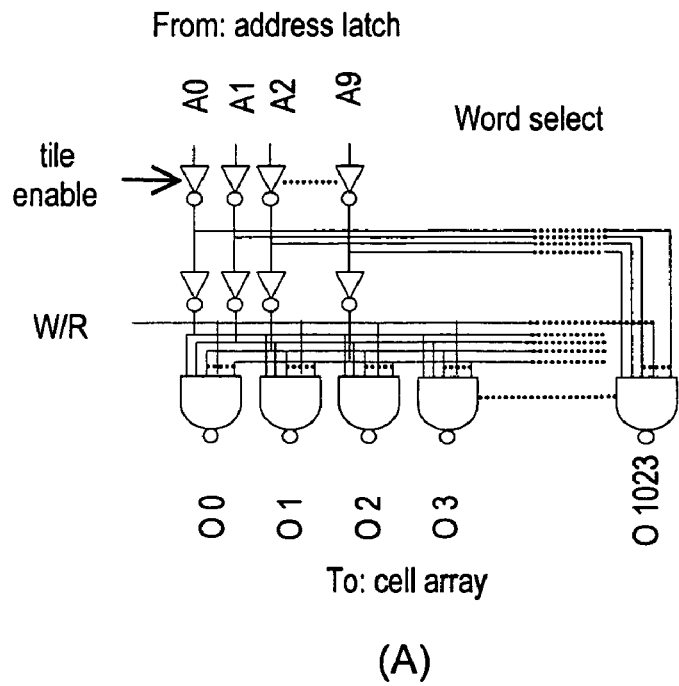
(A)
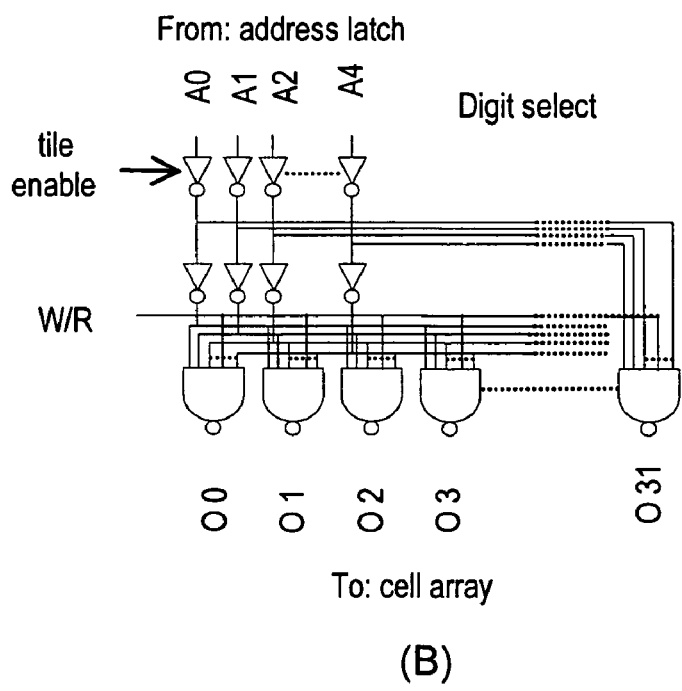
(B)
FIG. 38

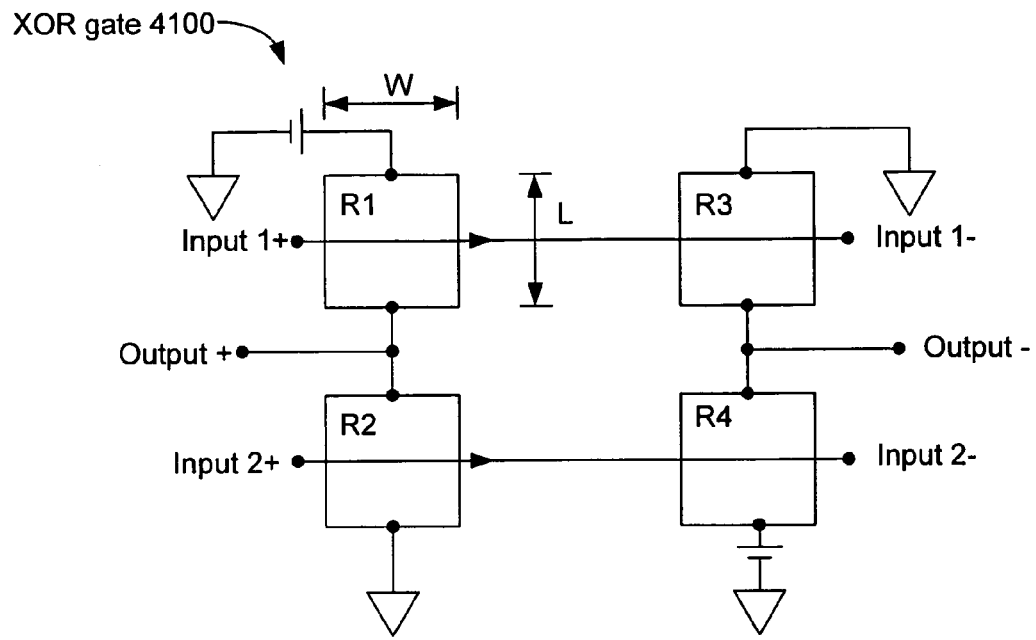
FIG. 41
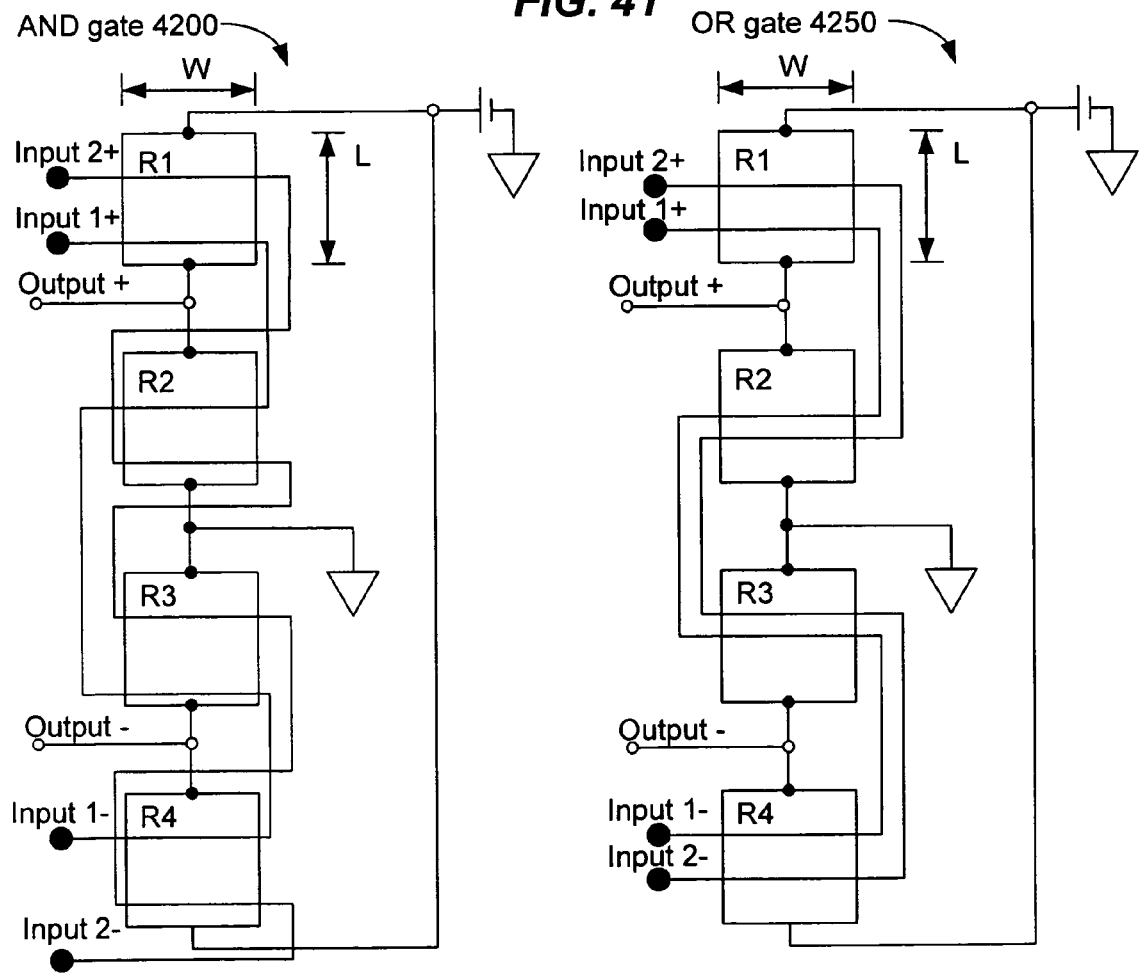
FIG. 42A
FIG. 42B

Cross section of typical LDC.

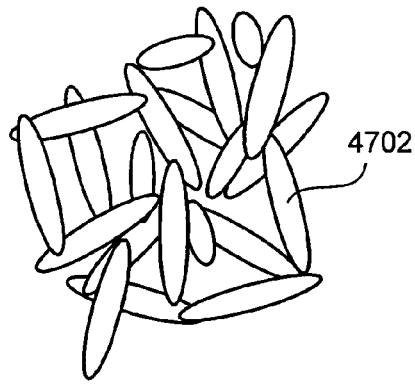
Liquid crystal molecules,
in isotropic phase, with no electric field,
(A)
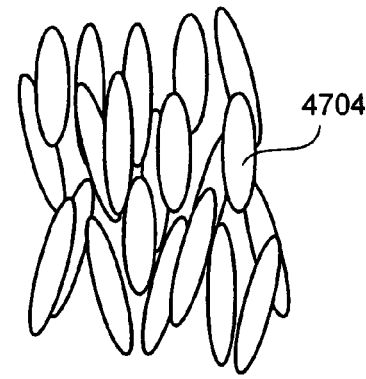
Liquid crystal molecules, in
nematic phase, under applied
electric field.
(B)
Liquid crystal molecules in smectic phase, under applied electric field.
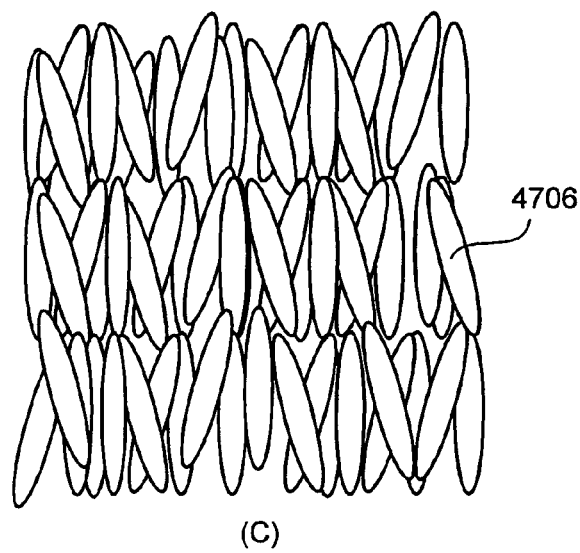
(C)
*FIG. 47*

Schematic of TFT active matrix pixel array

DISPLAYS WITH ALL-METAL ELECTRONICS

RELATED APPLICATION DATA

The present application claims priority from U.S. Provisional Patent Application No. 60/460,277 for ALL-METAL ELECTRONICS FOR LIQUID CRYSTAL DISPLAYS filed on Apr. 4, 2003, the entire disclosure of which is incorporated herein by reference for all purposes.

BACKGROUND OF THE INVENTION

The present invention relates to display devices and system. More particularly, the present invention provides all-metal electronics for such devices and systems. Still more particularly, embodiments of the present invention provide all-metal electronics which may be formed directly on the surface of a display panel.

There is growing awareness of the need for increased functionality of device/circuit technology based not on the decrease of minimum feature size, with its attendant increase of infrastructure costs (roughly doubling at every other technology node), but rather on constraints arising from needs requiring larger areas (macroelectronics). A typical example is a liquid crystal display (LCD) where system size is dictated by the scale of the image accessible to human vision. In view of the utility of the LCD as an exemplary display type, much of the following discussion will be framed with reference to LCDs. However, it will be understood that macroelectronics encompasses a significantly wider set of applications.

The challenge facing current macroelectronics technology is that many applications call for deposition on surfaces other than crystalline silicon. However, state-of-the-art transistors cannot be built on anything other than a crystalline silicon substrate. Two different approaches are presently being taken by the industry to address this problem. Both use silicon variants for the circuitry.

With reference to the display industry, an LCD that can actively control each subpixel (and therefore each pixel) separately is called an active matrix liquid crystal display (AMLCD). Building silicon-based electronic circuits on the glass panel of an LCD presents difficulties in that crystalline silicon cannot be grown on glass.

One approach to fabricating AMLCDs uses polysilicon technology to build thin-film transistors (TFTs). The problem with this approach is that TFT performance is severely degraded compared to that of crystalline transistors. This is mainly due to the very low mobility of electric charges in polysilicon material and the wide dispersion of functional parameters. As a result, the quality of polysilicon transistors is not high enough to build ancillary electronics directly on glass.

A more promising technology currently being developed is to use a polysilicon variant called continuous-grain silicon (CGS) to build the driver transistors directly on glass. The developers expect that this technology will allow building memory cells and ancillary electronics on glass as well. CGS transistors offer a higher level of quality than polysilicon transistors, but are still significantly inferior to the crystalline silicon transistor. As a result, current AMLCD solutions typically implement selection and driver electronics, as well as the frame memory blocks, in separately manufactured silicon ICs which are then attached to the glass panel by using chip-on-glass technology. Thus, only the pixel-controlling transistors are built directly on glass.

The necessity for using chip-on-glass techniques increases manufacturing costs and requires wiring to connect these electronic components to the pixel-controlling transistors. This degrades the analog signals as they must travel at least half the distance of the display dimension. Several companies have now been working on this technology for more than a decade.

The performance and potential of both polysilicon and continuous grain silicon are thus seriously limited. Therefore, there is a need is for display technologies which overcome these limitations.

SUMMARY OF THE INVENTION

According to the present invention, display technology is provided with all-metal electronic circuitry built directly on a display substratum. The invention applies to a variety of display types. According to a specific embodiment, the present invention provides a display device having a substratum and all-metal electronics formed on a surface of the substratum and operable to control operation of a plurality of basic visible elements associated with the substratum.

According to another specific embodiment, liquid crystal display (LCD), light-emitting diode (LED) display, and plasma display devices are provided. Each includes a display panel having a substrate defining a plurality of pixels. All-metal electronics are formed on the substrate of the display panel. The all metal-electronics include pixel control switches for directly controlling operation of the pixels, digital-to-analog converters (DACs) for converting image data to control the pixel control switches, frame memory for storing the image data, and pixel selection circuitry for enabling individual ones of the pixels.

According to yet another embodiment, a computer system is provided which includes at least one central processing unit, main memory, mass storage memory, a display device, display control electronics, and display memory. The at least one central processing unit, the main memory, the mass storage memory, the display electronics, and the display memory are all implemented as all-metal electronics on a surface of the display device.

A further understanding of the nature and advantages of the present invention may be realized by reference to the remaining portions of the specification and the drawings.

BRIEF DESCRIPTION OF THE DRAWINGS

FIGS. 2 and 3 show the operation of a GMR memory cell;

FIG. 6 shows a dibit memory cell;

FIG. 7 shows a triple or quad bit memory cell;

FIG. 12($b$) shows yet another dibit memory cell;

FIG. 17 is a simplified schematic of a memory access line selection matrix for use with specific embodiments of the present invention;

FIGS. 34–37 illustrate various implementations of stacked memory architectures which may be employed with various specific embodiments of the invention;

FIGS. 38 and 39 are schematics of exemplary support electronics for use with various embodiments of the invention;

FIG. 41 is a circuit diagram of a transpinnor XOR gate.

FIGS. 42a and 42b show transpinnors to operate as an AND gate and an OR gate, respectively.

FIGS. 47a–47c illustrate different phases of liquid crystal molecules.

DETAILED DESCRIPTION OF SPECIFIC EMBODIMENTS

Figure 1:
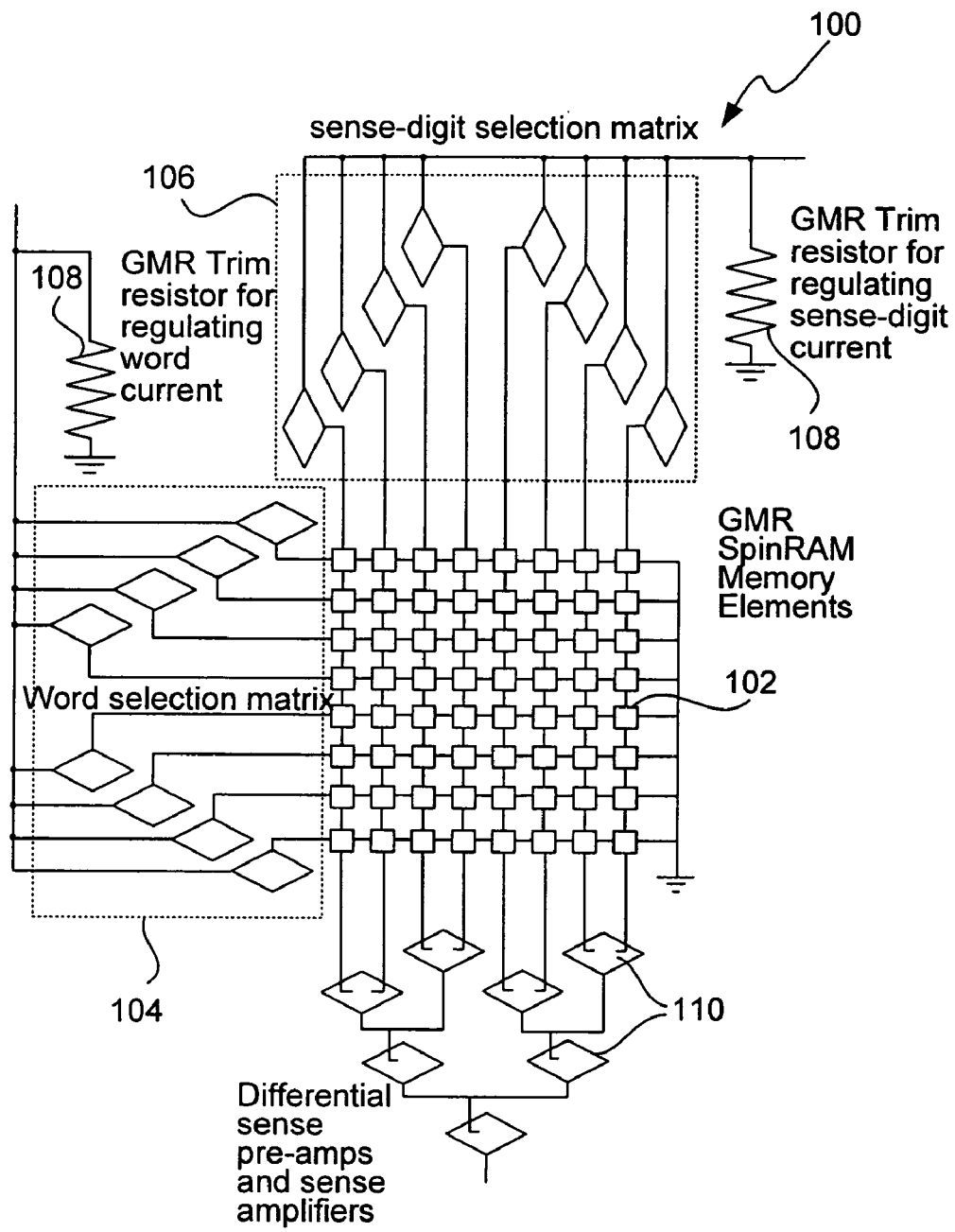
FIG. 1 is a simplified schematic of an all metal GMR memory.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Embodiments of the present invention are characterized by significant technical, system, and economic advantages over the current state-of-the-art, polysilicon-based macro-electronics. According to various embodiments, some or all of the electronic circuitry required to operate a display is implemented in an all-metal technology which is based on giant magnetoresistance (GMR). This allows some or all of the functions of such a display to be built directly on the display panel. According to some embodiments, this approach allows the functions of a computing system, including those of a personal computer, to be built directly on the same display panel.

Exemplary all-metal devices and structures which may be employed to implement specific embodiments of the invention will now be described with reference to FIGS. 1–45. As used herein, the term "all-metal" refers to devices and structures which do not include semiconductor materials but may (and typically do) include non-metal insulating materials.

Various embodiments of the present invention take advantage of recent advances in memory technology and electronics based on the property of giant magnetoresistance (GMR) as well as other technologies based on magnetism and the magnetic properties of materials. Some embodiments of the present invention also utilize three-dimensional (3D) structures which employ all-metal circuit components (e.g., memory cells and electronic circuits) as basic building blocks. Examples of such 3D structures are described in copending U.S. patent application Ser. No. 10/731,732 for ALL-METAL THREE-DIMENSIONAL CIRCUITS AND MEMORIES filed on Dec. 8, 2003, the entire disclosure of which is included herewith as part of this disclosure.

The all-metal electronics employed by these various embodiments of the invention allows memory and logic elements to be built without using silicon. These electronics are based on a nonvolatile memory cell constructed of GMR films, and the transpinnor, a new active element also constructed of GMR films. These electronics can be deposited directly on a variety of surfaces other than silicon. This eliminates the difficulties associated with using semiconductors for macroelectronics.

Exemplary implementations of all-metal memories which may be used with various embodiments of the present invention are described in U.S. Pat. No. 6,483,740 for ALL-METAL GIANT MAGNETORESISTIVE MEMORY issued on Nov. 19, 2002, the entire disclosure of which is incorporated herein by reference for all purposes. FIG. 1 is a simplified diagram of an all metal random access memory 100, also referred to herein as a SpinRAM, which may be employed with various specific embodiments of the invention. For the sake of clarity, only 64 storage cells 102 have been shown. It will be understood, however, that the simplified architecture of FIG. 1 may be generalized to any size memory array desired. It should also be noted that the control lines for the selection electronics have been omitted for the same purpose.

Examples of memory cells for use with the present invention are described in U.S. Pat. No. 5,587,943 for NONVOLATILE MAGNETORESISTIVE MEMORY WITH FULLY CLOSED FLUX OPERATION issued on Dec. 24, 1996, and in U.S. Pat. No. 6,594,175 for HIGH DENSITY GIANT MAGNETORESISTIVE MEMORY CELL issued on Jul. 15, 2003, both of which are incorporated herein by reference in their entireties for all purposes. Specific examples of such storage cells and basic theories of operation will be described below.

FIG. 2 shows the major hysteresis loop of a GMR exchange-coupled triple-layer film which may be used as a storage element with various specific embodiments of the present invention. Two magnetic layers 130 and 134 are separated by a nonmagnetic layer 132. The two magnetic layers have coercivities that differ by more than the exchange coupling between them such that layer 130 has a high coercivity (e.g., cobalt) and layer 134 has a low coercivity (e.g., permalloy). Film cross sections 136 show the magnetization at each part of the loop.

Beginning at the upper right quadrant, both top and bottom layers 130 and 134 are saturated in the same direction. If the applied field H is reduced to substantially zero and then reversed in direction, the layer having the lower coercivity switches first, as shown by the cross section in the upper left quadrant. The switching occurs when the field is equal to the sum of the coercivity of the lower coercivity film plus the coupling field.

As the applied field H is increased in the negative direction, the film layer having a higher coercivity switches directions, as depicted in the lower left quadrant. This switching occurs when the field magnitude is equal to the coercivity of the higher-coercivity film less the value of the exchange coupling. Thus, switching is carried out in such films in a two-step process.

Readout of the memory cell of FIG. 2 is achieved in a nondestructive fashion by measuring the resistance change in response to the change in the magnetization obtained by applying a field from a word line. The application of the field switches the lower-coercivity film. FIGS. 3(a) and 3(b) depict the resistive signals 180 when a triangular word current 182 is applied. FIG. 3(a) shows the signal corresponding to a "zero" state and FIG. 3(b) shows the signal corresponding to a "one" state.

Figure 4:
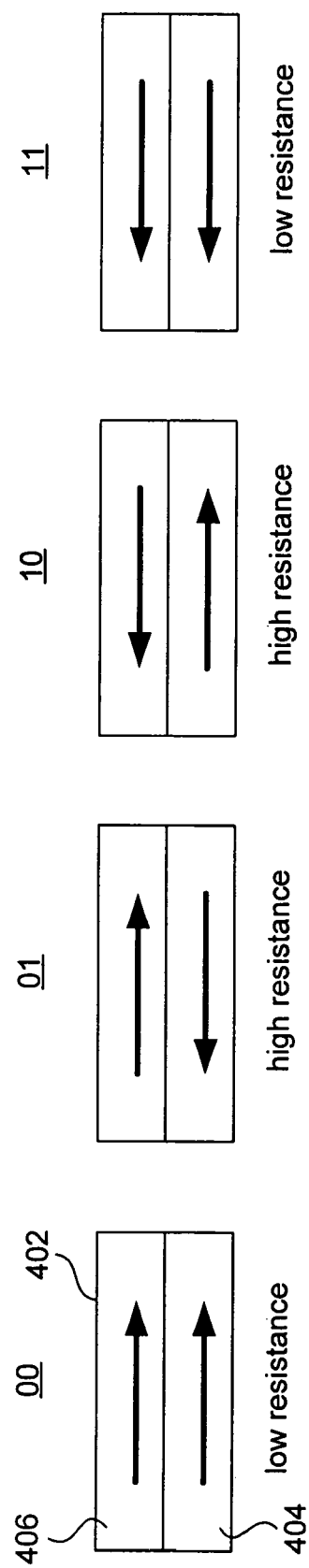
FIG. 4 shows the magnetization states of a GMR memory cell.

FIG. 4 shows four magnetization states of a memory cell 402 having a low coercivity storage layer 404 and a high coercivity storage layer 406. As indicated in the figure, each of the states represents a unique two-bit combination. That is, the state "00" is shown as both storage layers being magnetized to the right while the state "11" is shown as both layers being magnetized to the left. Because the magnetization vectors in this states are parallel, they exhibit relatively low resistance. By contrast, the states "01" and "10" are both characterized by the magnetization vectors oriented in opposite directions, i.e., a relatively high resistance state as compared to the parallel vectors due to the GMR effect.

Those of skill in the art will understand how each of the states may be written to memory cell 402. That is, layer 406 is magnetized first by the application of a magnetic field which overcomes the layer's coercivity. Because of its lower coercivity, layer 404 is also magnetized in the same direction, at least initially. The antiparallel state of layer 404 may then be written by application of a second magnetic field of the opposite orientation which is sufficient to overcome the coercivity of layer 404 but not layer 406.

Figure 5:
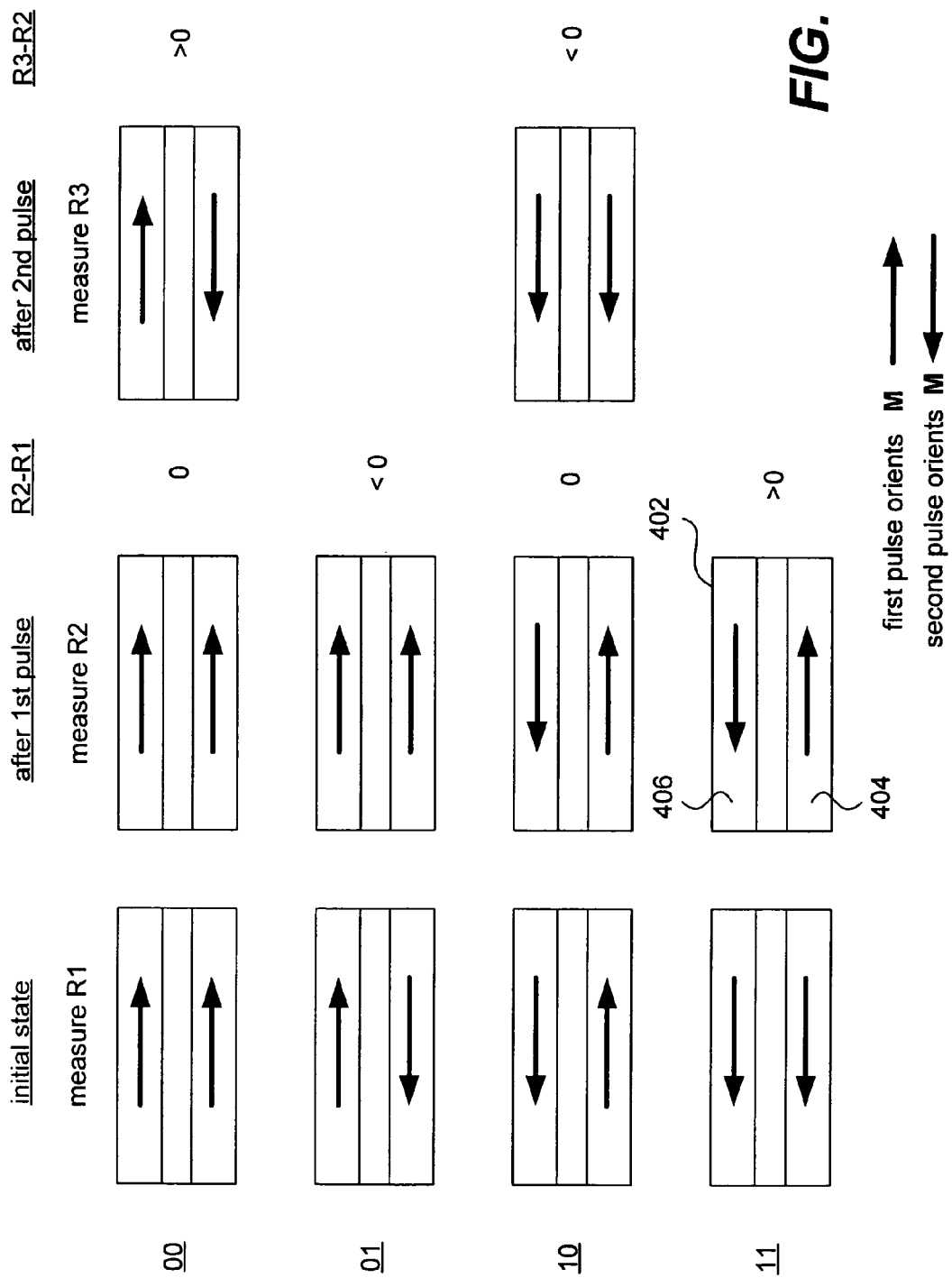
FIG. 5 illustrates operation of a GMR memory cell.

The reading of the information stored in memory cell 402 will now be described with reference to FIG. 5. As will be described, the read out process may vary depending upon the initial state of the cell. Initially, a resistance value $R_1$ associated with the multi-layer cell is measured while the cell is in an initial state (column 1). A magnetic field is then applied which is sufficient to overcome the coercivity of layer 404 and magnetize layer 404 in a particular direction, e.g., to the right as shown. A resistance value $R_2$ is then measured after the application of the magnetic field (column 2), and the difference between $R_1$ and $R_2$ determined (column 3). In the example shown, if $R_2-R_1$ is less than zero, then the initial state of the cell is determined to be the "01" state. Similarly, if $R_2-R_1$ is greater than zero, the initial state corresponds to the "11" state. The initial state is then rewritten to the cell.

If, on the other hand, there is no difference between $R_1$ and $R_2$, the initial state could have been either "00" or "10". If all that is desired is to determine the state of the low coercivity layer 404, i.e., "0" in both instances, no further action need be taken. However, if the state of layer 406 must be determined, a second magnetic field may be applied in the direction opposite to the first magnetic field, e.g., to the left in this example, and a third resistance value $R_3$ measured (column 4). If $R_3-R_2$ is greater than zero, the initial state is determined to be "00"; if less than 0, the initial state is determined to be "10" (column 5). The initial state is then rewritten to the cell.

Although specific implementations (such as the one described above with reference to FIG. 5) refer to layers having different coercivities (e.g., layers 404 and 406), it should be noted that other implementations suitable for use with the invention employ layers having the same coercivities, relying on alternative mechanisms to effect storage and readout. An example of such a mechanism is the use of localized fields to switch one layer without switching a nearby layer having the same coercivity. Examples of such implementations are described below.

According to various other implementations, memory cell designs are provided in which multiple bits of information may be stored in one memory cell. Specific implementations will be described below in which 2, 3, or 4 bits of information may be stored in one memory cell and which employ either destructive read out (DRO) and nondestructive read out (NDRO). It will be understood, however, that particular ones of these designs may be generalized to store more bits of information than described.

Three implementations which employ DRO will now be described with reference to FIGS. 6 and 7. Each of the described implementations employs cobalt storage layers, copper access lines, and a double keeper. However, it will be understood that a variety of materials may be employed for various ones of these elements.

FIG. 6 shows a memory cell 602 configured to store two bits of information. Cobalt layers 604 and 606 are provided in which the individual bits of information are to be stored as represented by the magnetization vector associated with each. According to a specific implementation, the coercivities of layers 604 and 606 are substantially equal. A copper word line 608 and a combined copper sense-digit line 610 are provided to provide read and write access to cell 602. Top and bottom keepers 612 and 614 are provided to ensure that memory cell 602 is a substantially closed flux structure. Such a double keeper configuration cancels any demagnetizing field from a magnetic film but does not impede the field from a strip line. Other cell structures with substantially closed flux structures may be constructed without the use of either or both keeper layers.

It should be noted that insulation layers are represented by the blank spaces between the layers shown. These layers were omitted for purpose of clarity. In addition, the various layers are shown having different widths for illustrative purposes. However, the layers of actual implementations are typically the same width. Finally, it will be understood that the vertical dimension of the figures of the application are often exaggerated for illustrative purposes.

A memory module based on the memory cell of FIG. 6 may be similar to a memory module based on the single-bit memory cell of U.S. Pat. No. 5,587,943 incorporated by reference above. That is, such a memory module may have serpentine word lines generally oriented in the x-direction and sense-digit lines generally oriented in the y-direction as shown, for example, in FIG. 11. In such implementations, the word and sense-digit lines run in the same direction at each bit location. Selection matrices are provided for selecting the word and sense-digit lines as well as low level gates and sense amps for the sense-digit lines. According to other implementations, memory cells and modules are designed such that the word lines are straight and orthogonal to separate sense and digit lines as shown, for example, in FIGS. 12(a) and 12(b).

One can understand how to write to the dibit memory cell 602 of FIG. 6 by application of the right hand rule. That is, when the current in word line 608 is parallel to that in sense-digit line 610 and the amplitudes are equal, the field between these lines is zero, i.e., cobalt layer 604 experiences no applied field. However, the field experienced by cobalt layer 606 is the sum of the field contributions from the two lines. Thus, cobalt layer 606 may be written using coincident currents of the same polarity in lines 608 and 610, each of which may generate a field which by itself could not overcome the coercivity of layer 606 (i.e., less than $H_C$), but which, when combined with the field from the other line is sufficient to impose a magnetization on layer 606 (i.e., greater than $H_C$).

When, on the other hand, the current in word line 608 is antiparallel to that in sense-digit line 610 and the amplitudes of the currents are substantially equal, the combined field outside of lines 608 and 610 is effectively zero while the field between the lines, i.e., the field experienced by cobalt layer 604, is doubled. Thus, cobalt layer 604 may be written using coincident currents in the word and sense-digit lines of opposite polarity, each of which may have a field less than $H_C$ but whose combined sum is greater than $H_C$.

According to a specific implementation, the procedure for reading dibit memory cell 602 involves several steps. Initially, the resistance of sense-digit line 610 is measured. A logic state, e.g., a "1", is then written to cobalt layer 604 with coincident currents in access lines 608 and 610 as described above. The resistance of sense-digit line 610 is then measured again. If it has changed, it is determined that the initial state of layer 604, i.e., the bit of information originally stored in layer 604, is different than the current state, e.g., if the layer was written as a "1" it must have previously been a "0". If the resistance has not changed, the opposite conclusion is established, i.e., that the bit of information originally stored in layer 604 is the same as in the current state.

The state of layer 606 may subsequently be determined by reversing the state of layer 604 and comparing the resulting resistance to the last resistance measurement. The state of layer 606 may then be determined from whether the resistance increases or decreases. For example, if the top layer is switched from a "1" to a "0" and the resistance decreases, the bottom layer must be a "0", i.e., the magnetization vectors of the two layers are now aligned. By contrast, if in such a scenario the resistance increased after such a switch, the bottom layer must be a "1", i.e., the magnetization vectors of the two layers are now antiparallel. After a read operation, the original states of layers 604 and 606 may be rewritten as required. Of course, it will be understood that a read operation may be performed to determine the state of both of the storage layers as described above, or to determine the state of either of the films separately.

It will be understood that variations on the structure of memory cell 602 may be made. For example, the respective coercivities or compositions of storage layers 604 and 606 may be varied. In addition, the current amplitudes of the current used to access memory cell 602 need not necessarily be equal to enable operation.

FIG. 7 shows a memory cell 702 which may be configured according to various specific implementations to store three or four bits of information. As with memory cell 602 of FIG. 6, insulating layers in the gaps between layers are not shown and the vertical dimension is exaggerated for clarity. In addition, in an actual implementation, the films and access lines would likely be the same width but are differentiated here for illustrative purposes.

Memory cell 702 has four cobalt storage layers 704, 706, 708 and 710 each of which is capable of storing one bit of information. The cell access lines include a copper word line 712, a copper sense-digit line 714, and a copper inhibit line 716. The term "inhibit line" is used in reference to the inhibit line of the old ferrite core memories which employed three wires per cell. According to a specific implementation, an inhibit line allows a 3:1 ratio of field at selected to unselected locations, which is larger than the 2:1 ratio when there is no inhibit line. According to some implementations, the inhibit line links all of the bits in an array. According to other implementations, the inhibit line does not link all bits in the array. Rather they are configured to run diagonally through the array and are furnished with their own selection matrix.

As will become apparent, in three-bit implementations, the magnetization states of storage layers 704 and 710 (and thus the information stored therein) are not independent. That is, each is magnetized in the opposite direction of the other. According to other implementations (discussed below), this symmetry can be broken using a variety of techniques such that each of the four storage layers may be written and read independently.

According to the three-bit implementation, the storage layers of memory cell 702 are characterized by substantially equal coercivities and may be written by the application of different combinations of coincident currents in the three access lines. The fields generated as a result of the applied currents are given by:

$$H_1 = k\{-I_w - I_i - I_d\} \tag{1}$$

$$H_2 = k\{I_w - I_i - I_d\} \tag{2}$$

$$H_3 = k\{I_w + I_i - I_d\} \tag{3}$$

$$H_4 = k\{I_w + I_i + I_d\} \tag{4}$$

where $I_w$, $I_i$, and $I_d$ correspond to the currents in the word, inhibit, and sense-digit lines, respectively, $H_1$–$H_4$ are the fields in layer 704–710, respectively, and k is a constant of proportionality inversely proportional to the line width and equal to $2\pi$ Oe per ma for a 1 micron width.

From these equations, it can be seen that layers 706 and 708 may each be switched with a current pulse combination that will not switch any other film in the cell. For example, if $I_w = +H_c/3$ k and $I_i = I_d = -H_c/3$ k, then the field at layer 706 is $H_c$, while the field at layers 704 and 708 is $H_c/3$ and the field at layer 710 is $-H_c/3$. That is, there is a three-to-one ratio between the field at the desired storage layer and each of the other storage layers. It can also be seen, however, that in this particular implementation where the coercivities of layers 704 and 710 are substantially equal, these layers do not switch independently. That is, a field combination that switches one of these two layers will switch the other in the opposite direction. Thus, in such an implementation where layers 704 and 710 are interdependent in this way, only three bits of information may be stored in or retrieved from memory cell 702.

To effect reading of the information in three-bit memory cell 702, the control electronics for word line 712 and sense-digit line 714 are the same. That is, low-level gates and pre-amps are situated at the ends of each making the word lines, in effect, word-sense lines. The reading of an individual cobalt storage film is achieved in much the same way as described above with regard to dibit memory cell 602. That is, the resistance of the access line to which the storage film of interest is attached is measured. A logic state is then written to the storage film of interest and the resistance of the associated access line measured again. If the resistance changes, the storage film was originally in the opposite state of the logic state that was just written. If the resistance does not change, then the current logic state is the same as the original logic state. Also as described above with reference to dibit memory cell 602, the state of the other storage film associated with the same access line may be determined by switching the first film again and determining whether the resistance goes up or down.

According to various specific implementations, memory cell 702 is modified such that all four storage layers may be used to store independent bits of information. That is, memory cell 702 has enough storage layers to store four bits of information. However, as discussed above, if the coercivities of the layers are substantially equal, any current pulse sequence which writes storage layer 704 to a particular logic state will also write storage layer 710 to the opposite state.

According to a first implementation, memory cell 702 becomes a four-bit memory cell with the addition of another access line (placed, for example, above cobalt layer 1) to break the symmetry which results in the interdependency of layers 704 and 710. This implementation requires an additional masking level and an additional selection matrix to control the added access lines.

According to a second implementation, the compositions of storage layers 704 and 710 are made sufficiently different such that their switching thresholds require different field strengths for switching. This may be accomplished, for example, by depositing a permalloy layer directly over the cobalt film of storage layer 704. This will give layer 704 a lower coercivity than layer 710. Thus, when coincident currents are applied to the access lines, the resulting fields will write layer 704 before writing layer 710.

According to a third implementation, the separation spacing between the keepers and the cobalt storage films is adjusted such that demagnetizing fields become significant enough to break the symmetry. This implementation takes advantage of the fact that even a perfect keeper doesn't completely cancel the demagnetizing field of a finite size magnetic film spaced a nonzero distance from the keeper. Such a demagnetizing field is proportional to the distance between the magnetic filed and the keeper. This demagnetizing field can be used to break the symmetry and allow both layer 704 and layer 710 to be written to the same state. For example, if one wishes to write a "0" to both layers 704 and 710, a pulse combination may first be applied which writes a "1" to layer 704 and a "0" to layer 710. A "1" is then written into each of layers 706 and 708. This results in a demagnetizing field which tends to bias layers 704 and 710 toward the "0" state. Thus, when a subsequent pulse combination is applied which tends to write layer 704 in the "0" state and layer 710 in the "1" state, only layer 710 is switched. This leaves both layers 704 and 710 in the same state, e.g., "0". Layers 706 and 708 may then be written independently.

According to a fourth implementation, a keeper layer replaces a portion of the center of line 716. This shields layers 704, 712 and 706 from the field generated by currents in layer 708, 714 and 710, and vice versa. This removes the redundancy and allows four bits of information to be independently stored.

The four-bit implementation of memory cell 702 may be read in much the same way as the three-bit implementation described above. According to a specific implementation, this may be done by switching only the interior bits (i.e., layers 706 and 708) and using the read procedure described with reference to the dibit memory cell 602 of FIG. 6.

Figure 8:
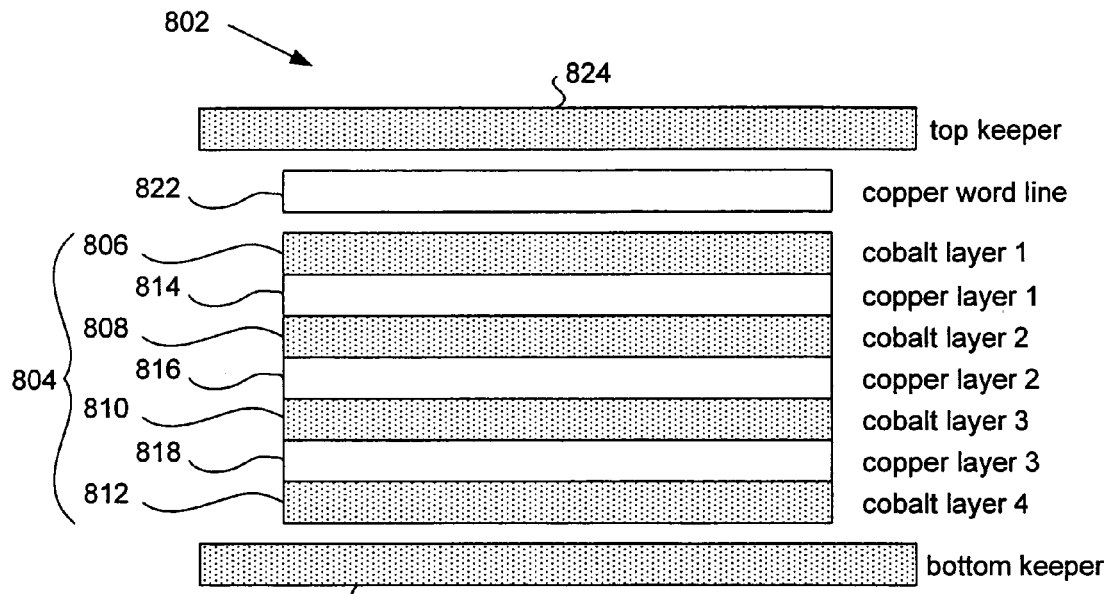
FIG. 8 shows a dibit memory cell.

According to further implementations, multi-layer memory cells are stacked to achieve increased information storage density. A double-density stacked memory cell 802 designed according to one such implementation is shown in FIG. 8. According to various implementations, this structure may be employed for 2-bit NDRO or 4-bit DRO. Memory cell 802 includes a GMR film structure 804 which functions as the sense-digit line of the cell. According to the specific implementation shown, structure 804 is a multi-layer GMR structure having four cobalt layers 806, 808, 810, and 812, separated by three copper layers 814, 816, and 818. The cell also includes a copper word line 822 and top and bottom keepers 824 and 826. The purpose of the double keeper is to cancel the demagnetizing fields from the magnetic films while not impeding the fields from the access lines. For illustrative purposes, insulating layers located in the blank spaces between noncontiguous layers are not shown and the vertical dimension of the cell is exaggerated.

The reading and writing of memory cell 802 will now be described with reference to the FIGS. 9(a) and 9(b) which show the resulting magnetic fields from opposing currents in multi-layer GMR structure 804. Current flowing out of the page through GMR structure 804 generates a magnetic field 902 as shown in FIG. 9(a). The field is oriented to the left in the top two cobalt storage layers 806 and 808 and to the right in the bottom two cobalt storage layers 810 and 812. As will be understood, magnetic field 902 is stronger at layers 806 and 812, weaker at layers 808 and 810, and zero at the center of the structure.

In FIG. 9(b), the direction of the current is reversed, i.e., into the page, and reduced in magnitude such that the coercivities of the inner layers 808 and 810 are not overcome by magnetic field 904. This results in the switching of layers 806 and 812 but not layers 808 and 810 as shown. The result is that each cobalt film is magnetized antiparallel to its neighbor(s), a configuration which yields the highest magnetoresistance of sense-digit line 804.

Because the conductivity of copper is much larger than that of cobalt, the approximation that all of the current in sense-digit line 804 is carried by the copper layers may be made. Using this approximation, it can be seen that the magnitudes of the fields in layers 806 and 812 are approximately three times the magnitudes of the fields in layers 808 and 810. For example, the field experienced by cobalt layer 808 from copper layer 814 is cancelled by the field from copper layer 816, leaving only the field component from copper layer 818. By contrast, cobalt layer 806 experiences positive field contributions from each of the copper layers. This difference in field magnitude is the basis for operating such stacked memory cells.

Figure 9:
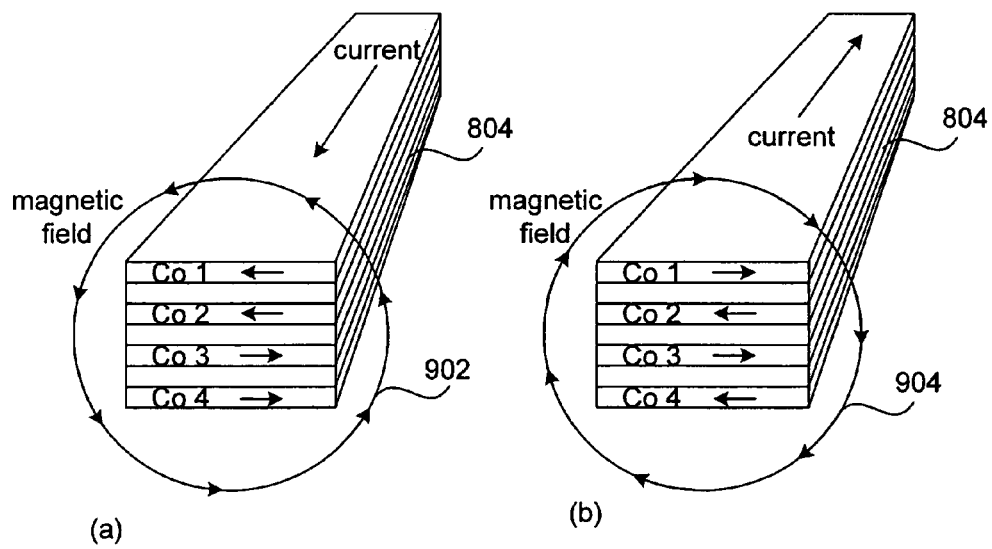
FIG. 9 shows the relationship between magnetic fields and current in a GMR thin film structure.

The writing of the dibit memory cell 802 will now be described with reference to FIGS. 8 and 9. According to this implementation, the two inner cobalt layers 808 and 810 are used to store the information, and the two outside cobalt layers 806 and 812 are used to read out the information nondestructively, i.e., NDRO. The memory cell is written with a coincidence of currents in word line 822 and sense-digit line/GMR structure 804. Because, as discussed above, a current in sense-digit line 804 results in a much larger field at the outer cobalt layers than at the inner cobalt layers, it is possible to switch the outer layers without disturbing the inner ones.

A current in sense-digit line 804 will result in a magnetic field in cobalt layer 808 which is equal and opposite to the field experienced by cobalt layer 810. When a coincident current is applied to word line 822, the resulting field will add to the field in one of layers 808 and 810 and subtract from the other. This makes it possible to write to either one of layers 808 or 810 without disturbing the other. So, for example, to write to layer 810, a current which produces a field of magnitude $H_C/2$ at layer 810 is applied to sense-digit line 804 in the direction out of the page (see FIG. 9). A current one-third as large is coincidentally applied to word line 822 in the same direction resulting in another field of magnitude $H_C/2$ at layer 810. The combined field has a magnitude $H_C$ which is sufficient to switch layer 810. However, because the first field contribution at layer 808 is $-H_C/2$, the two fields cancel and layer 808 does not switch.

To read the information stored in dibit memory cell 802 the magnitude of the read current in sense-digit line is ⅓ that of the write current. This results in a field of $H_C/2$ at layer 806 and $-H_C/2$ at layer 812. The resulting fields at layers 808 and 810 are of magnitude $H_C/6$ and will therefore not cause any switching of these layers. To read the information in layer 808, layer 806 is written, i.e., magnetized, in a first direction and the resistance of sense-digit line 804 is measured. Layer 806 is then written in the other direction and the resistance measured again. The two resistance measurements are then compared. The resistance will be lower when layers 806 and 808 are magnetized in the same direction, and higher when they are magnetized in opposite directions. Therefore, the direction of magnetization of layer 808, i.e., the logic state stored in layer 808, may be determined from the comparison of the resistance values. The reading of layer 810 is achieved using the same procedure with layer 812.

Figure 10:
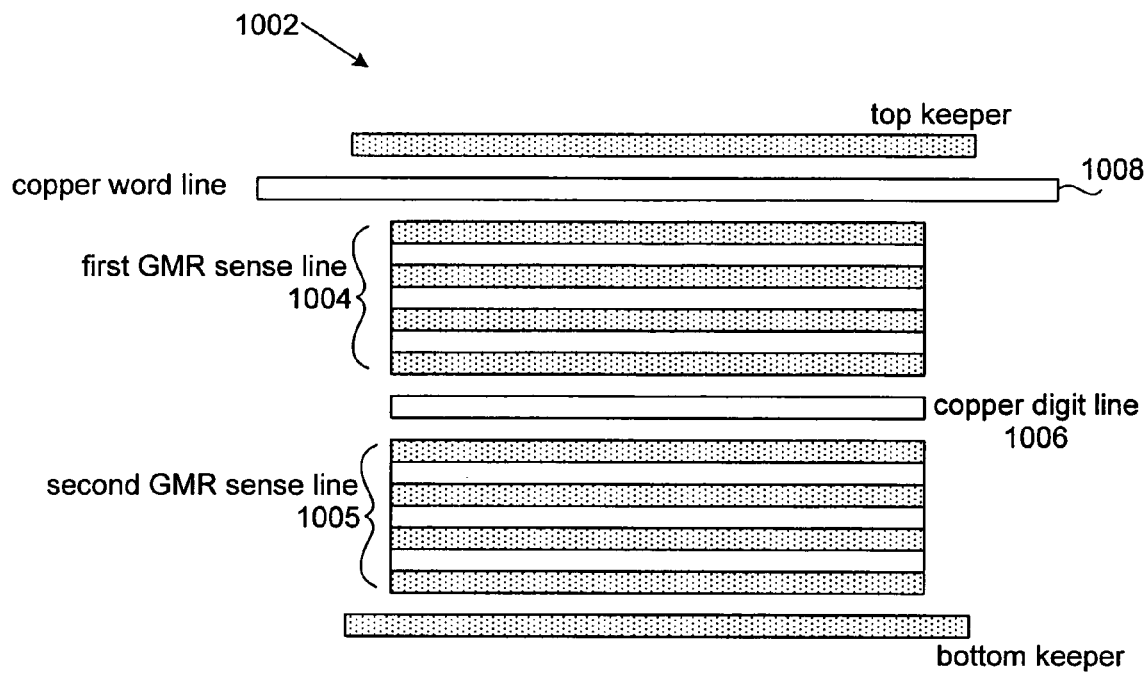
FIG. 10 shows a quad bit memory cell.

A quadruple-density stacked memory cell 1002 is shown in FIG. 10. Memory cell 1002 includes two GMR film structures 1004 and 1005 which function as sense lines of the cell. According to a specific implementation, each of structures 1004 and 1005 is designed similarly to the GMR film structure 804 shown in FIGS. 8, 9(a) and 9(b). That is, the implementation shown in FIG. 10 stacks two of the single GMR structure of dibit memory cell 802 of FIG. 8 to effect storage of 4 bits of information NDRO or 8 bits DRO.

As with dibit cell 802, the four bits of information of quadbit cell 1002 are stored in the two center cobalt layers of each of sense lines 1004 and 1005. The fields on the top and bottom data bit layers of sense line 1004 will be denoted $H_1$ and $H_2$, respectively. The fields on the top and bottom data bit layers of sense line 1005 will be denoted $H_3$ and $H_4$, respectively. The term k will be used to represent the constant of proportionality between the magnetic field and current on the surface of a stripline having the width of those in the memory (k=2π Oe/ma for a line 1 micron wide, and is inversely proportional to the width of the stripline). The current in top sense line 1004 will be denoted $i_1$. The current in copper digit line 1006 will be denoted $i_2$. The current in bottom sense line 1005 will be denoted $i_3$. Using these definitions, the four fields at the four information storage layers are given by:

$$H_1 = k(i_1/3 + i_2 + i_3) \quad (5)$$

$$H_2 = k(-i_1/3 + i_2 + i_3) \quad (6)$$

$$H_3 = k(-i_1 - i_2 + i_3/3) \quad (7)$$

$$H_4 = k(-i_1 - i_2 - i_3/3) \quad (8)$$

NDRO quadbit cell 1002 has the same control electronics for each of its two sense lines 1004 and 1005 as sense-digit line 804 of dibit cell 802, i.e., low level gates and preamps. From equations 5–8, it can be seen that each of the four information storage layers of quadbit cell 1002 may be written independently of the others by the appropriate combination of coincident current pulses in sense lines 1004 and 1005, digit line 1006 and word line 1008.

The read and write techniques described above with reference to dibit memory cell 802 of FIG. 8 may also be used to read the information stored in NDRO quadbit memory cell 1002. So, for example, a read would begin with measurement of the resistance of the sense line of which the storage layer of interest is a part. A particular logic state, e.g., a "1", is then written to the outside cobalt layer nearest the storage layer of interest, i.e., the outside layer is magnetized in a specific direction. The resistance of the sense line is then measured and compared to the resistance prior to the first pulse. If there is a change in resistance, the bit value of the inner storage layer is determined from a comparison of the two resistance measurements. That is, if a "1" was written to the outside layer and a positive change in the resistance of the sense lines is measured, then the inner layer is storing a "0", i.e., magnetized antiparallel to the outer layer; if a negative resistance change is measured, then the inner layer is storing a "1". On the other hand, if there is no change after the first pulse, then the opposite logic state, e.g. a "0", is written to the outside film, the resistance of the sense line is again measured, and the bit value is determined from a comparison of the three resistance measurements. That is, if the resistance change after the second pulse is positive, the inner layer is a "1", i.e., magnetized parallel to the outer layer; if the resistance change is negative, the inner layer is a "0". See FIG. 5. Note that this procedure can be used to read out all eight bits of a DRO 8-bit cell. If cell 1002 is used as an 8-bit DRO nonvolatile cell, the center copper digit line 1006 should be replaced by three layers, the top and bottom made of copper and the center a permalloy keeper.

Figure 11:
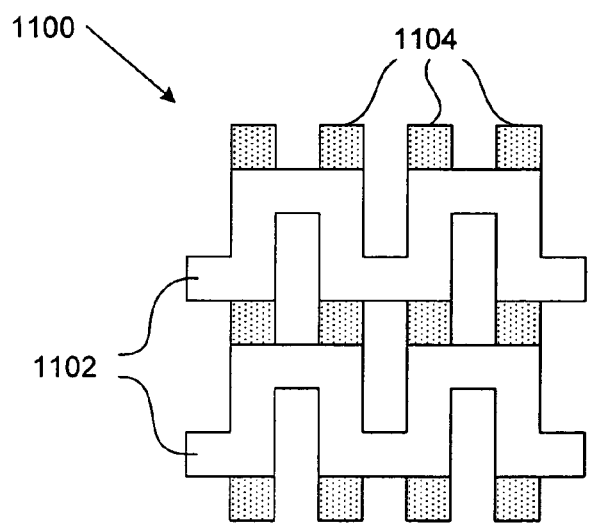
FIG. 11 is a simplified diagram of an array of memory cells.

According to a specific implementation, various memory cells designed as described herein may be configured into a memory array 1100 as shown in FIG. 11. The memory cells of the array are situated where serpentine word lines 1102 coincide with the vertical access lines 1104 which may comprise, for example, multi-layer sense-digit lines as in dibit cell 802, or separate sense and digit lines as in quadbit cell 1002.

According to other implementations, the bit density of the dibit and quadbit memory cells described herein may be further doubled by changing the shape of the word lines in an array 1100 of such devices and using separate sense and digit lines. This may be understood with reference to FIGS. 12(a) and 12(b). According to such implementations word lines 1202 are straight and orthogonal to separate sense and digit lines (1204 and 1206, respectively). FIG. 12(b) shows a dibit cell implementation. However, it will be understood that the same principle may be applied to a quadbit cell implementation.

Figure 12A:
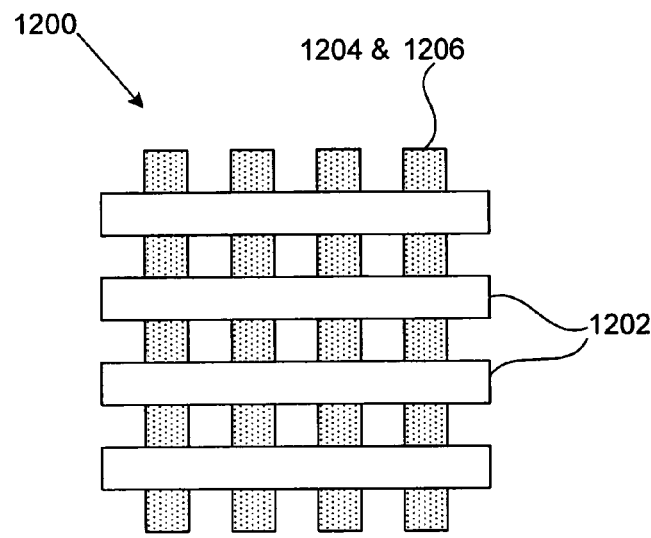
FIG. 12($a$) is a simplified diagram of another array of memory cells.
Figure 12B:
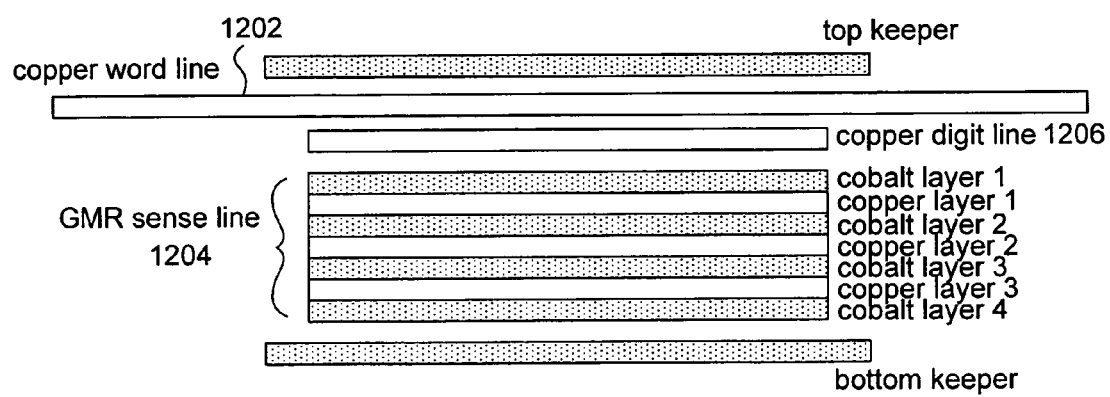

As can readily be seen by comparing the array design of FIGS. 11 and 12(a), the spacing between the word lines in array 1200 is decreased by a factor of two as compared to array 1100 with an attendant twofold increase in bit density. It should be noted that although the field from the word lines in array 1200 is perpendicular to the film easy axis, this field lowers the switching threshold of the cells beneath it with the result that only the portions of the magnetic films under an activated word line get switched. This enables one to switch one and only one bit in a given sense line.

Referring back to FIG. 1, the support electronics which provide random access to each of memory cells 102 are implemented with the GMR-based device referred to herein as a "transpinnor." A transpinnor is a multifunctional, active GMR device with characteristics similar to both transistors and transformers. Like a transistor, it can be used for amplification, logic, or switching. Like a transformer, the transpinnor can be used to step voltages and currents up or down, with the input resistively isolated from the output. Like a transistor, a transpinnor can be integrated in a small space. Unlike conventional transformers, a transpinnor has no low frequency cutoff, the coupling being flat down to and including DC. In addition, the operational characteristics of the transpinnor (including amplification, current requirements, and speed) tend to improve as its dimensions get smaller. For more information on transpinnors, please refer to U.S. Pat. Nos. 5,929,636 and 6,031,273 for ALL-METAL, GIANT MAGNETORESISTIVE, SOLID-STATE COMPONENT, the entire disclosures of which are incorporated herein by reference for all purposes.

Figure 13:
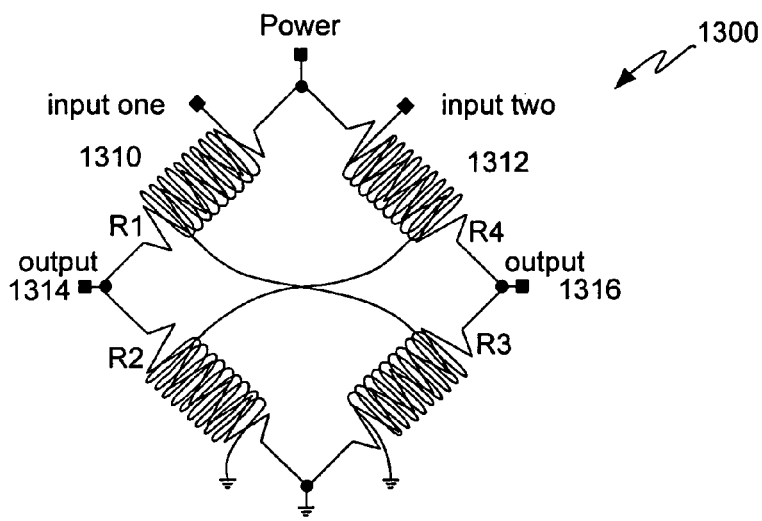
FIG. 13 is a simplified circuit diagram of a transpinnor for use with specific embodiments of the present invention.

A specific implementation of a transpinnor 1300 is shown in FIG. 13. Four resistive elements $R_1$–$R_4$ comprising GMR film structures are configured as a Wheatstone bridge. Current in either of input lines 1310 or 1312 creates a magnetic field of one or more of GMR films $R_1$–$R_4$. This unbalances the bridge and creates an output signal between output terminals 1314 and 1316. In the transpinnor implementation of FIG. 13 input lines 1310 and 1312 are shown magnetically (i.e., not electrically or resistively) coupled to resistive elements $R_1$–$R_4$ with coils. According to other integrated circuit implementations, this coupling is achieved using striplines.

As mentioned above, the resistance of each leg of transpinnor 1300 may be changed by application of a magnetic field to manipulate the magnetization vectors of the respective GMR film's layers. Such fields are generated by the application of currents in input lines 1310 and 1312 which are electrically insulated from the GMR films. Input line 1310 is coupled to and provides magnetic fields for altering the resistance of GMR films $R_1$ and $R_3$. Input line 1312 is coupled magnetically to and provides magnetic fields for altering the resistance of GMR films $R_2$ and $R_4$. If the resistances of all four GMR films are identical, equal currents in input lines 1310 and 1312 change the resistances equally and do not unbalance the bridge, thus resulting in zero output. If, however, unequal currents are applied, an imbalance results, thus resulting in a nonzero output.

Figure 14:
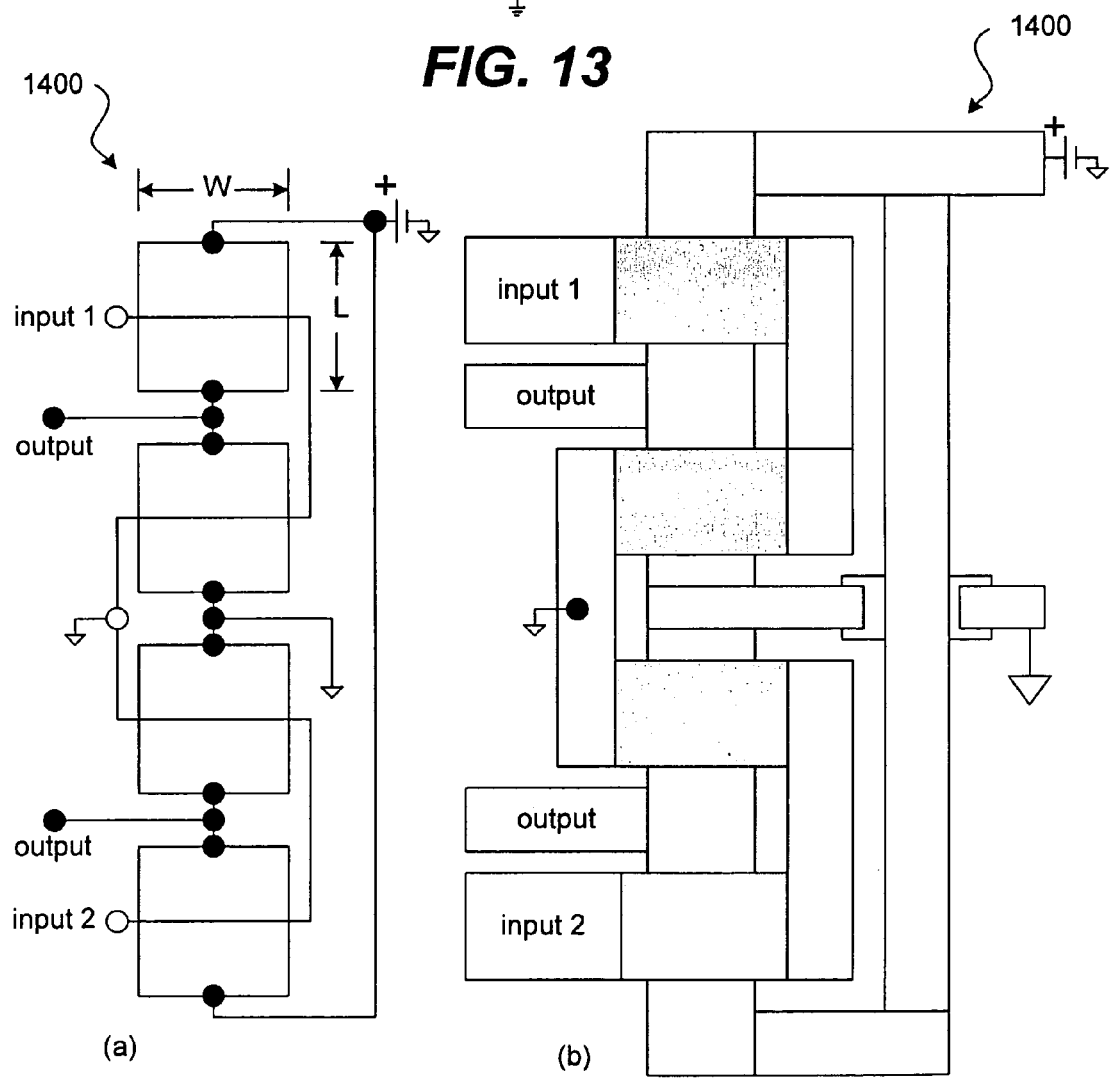
FIGS. 14(a) and 14(b) are simplified representations of a differential transpinnor for use with specific embodiments of the present invention.

FIG. 14 shows a circuit diagram (a) and an integrated circuit layout (b) of an integrated circuit implementation of a differential transpinnor 1400 which may be used with specific embodiments of the present invention.

The relationship between the output voltage of transpinnor 1300 and a variety of other parameters including power supply voltage, input current, GMR value, leg resistance values, and output resistance will now be described. This analysis assumes the ideal case where the resistance of each of four resistive elements $R_1$–$R_4$ (when in identical magnetic states) is identical, and denotes this resistance value as r. When a positive current is applied at input 1 and a negative current is applied at input 2, the various resistances are given by:

$$R_1 = r(1-\delta) \quad (9a)$$

$$R_2 = r(1+\delta) \quad (9b)$$

$$R_3 = r(1-\delta) \quad (9c)$$

$$R_4 = r(1+\delta) \quad (9d)$$

Where $$\delta = f(H)\, gmr/2 \quad (10)$$

gmr is the decimal equivalent of GMR (i.e., gmr=GMR/100), and f(H) is a number less than or equal to one, representing the fraction that a layer has switched.

The output resistance of transpinnor 1300 is denoted $r_5$. The current in each of resistive elements $R_1$–$R_4$ and $r_5$ denoted $i_1$–$i_5$, respectively. The voltage drop across the entire bridge, i.e., the voltage applied to the power lead) is denoted V. From Kirchoff's laws we then have $$i_1 - i_2 - i_S = 0 \tag{11a}$$

$$i_4 - i_3 + i_S = 0 \tag{11b}$$

and from symmetry, $$i_1 = i_3 \tag{12a}$$

$$i_2 = i_4 \tag{12b}$$

Because the voltage drop over any path between the power lead and ground must be V, $$(1-\delta)ri_1 + (1+\delta)ri_2 = V \tag{13}$$

$$(1-\delta)ri_1 + i_S r_S + (1-\delta)ri_1 = V \tag{14}$$

Combining equations (11), (13), and (14), $$i_S = 2i_1 \delta / [1 + \delta(r_S/r)] \tag{15a}$$

This equation represents the output current of transpinnor 1300.

Also of interest is the dependence of the amplification factor, $$A = \text{output current/input current} \tag{16}$$

on the power supply to transpinnor 1300 and the line width of the GMR films. For this analysis will use the approximation that $r_S/r \ll 1$. This is due to the fact that the input and output lines of transpinnor 1300 are much thicker than the GMR films (e.g., 20 nm of copper and 300 nm of AlCu vs. 2–4 nm of copper). In addition, $\delta \ll 1$ also (see equation 10). In the case of complete switching, equation 15a then becomes $$i_S = 2i_1 \delta = i_1 \text{ gmr} \tag{15b}$$

The input current must be sufficient to switch the lower coercivity, e.g., permalloy layer of the GMR films, i.e., sufficient to produce a magnetic field equal to the layer coercivity, $H_C$. The field H produced by a current i in a stripline of width w and length L is found from Maxwell's equation, curl H=J', to be $$H = 2\pi i / w \text{ Oe} \tag{17}$$

where i is in mA and w is in microns. (In changing units from Maxwell's equation to those in equation (17) it should be noted that $4\pi$ Oe=$10^3$ amps/meter.) Thus, the input current required to produce a field $H_C$ is $$\text{input current} = (1/2\pi)H_C w \text{ mA}/(\text{Oe-micron}) \tag{18}$$

To derive the output current, it should be noted with reference to FIG. 13 that the power voltage V is applied to $R_1$ and $R_2$ in series, and that because $i_S$ is small, the current in resistive elements $R_1$ and $R_2$ can be approximated as $i_1$. Thus, the current $i_1$, according to Ohm's law, is the ratio of V (in volts) to the sum of $R_1$ and $R_2$, or 2r (in ohms). So, $i^1 = 10^3 \text{ V}/(2r)$ mA, and therefore according to equation (15b) the output current is $$\text{output current} = 10^3 \text{ gmr } V/(2r) mA \tag{19}$$

The amplification factor is then $$A = \pi 1000 \text{ gmr } V/(rH_C w) \tag{20a}$$

It is further useful to write the resistance r as the sheet resistivity, $R_{sq}$ (ohms per square) multiplied by the number of squares. The number of squares of one of the GMR resistive elements of FIG. 14 is L/w. Thus, the amplification may be written $$A = \pi 1000 \text{ gmr } V/(H_C L R_{sq}) \tag{20b}$$

where $H_C$ is in Oe, and w and L are in microns.

As discussed above, transpinnors form the basis for the all-metal support electronics for memory 100 of FIG. 1. That is, transpinnors are used to select the word lines to be activated (104), select the sense-digit and reference lines to activated (106), regulate the voltage to the drive lines (108), amplify the difference in current between selected sense-digit and reference line pairs (110), and perform further sense amplification in successive stages.

It turns out that the transpinnor is extremely effective for applications in which a physical signal is to be read above an offset arising from the difference between two unevenly matched input lines. It functions as a transformer at its input, rejecting the common-mode signal between the two lines, and as a differential amplifier at its output, amplifying the physical signal. In memory 100 there is a differential transpinnor 110 coupled to each sense-digit/reference line pair such that the sense-digit line is connected to input 1 of the transpinnor and the corresponding reference line is connected to input 2 (see FIGS. 13 and 14). As discussed above, inputs 1 and 2 of each transpinnor are only magnetically coupled to its GMR film resistive elements (as opposed to electrical or resistive coupling), the input being DC isolated from the output.

When the sense-digit and reference lines of a pair are in the same magnetic state, the output of the differential transpinnor 110 should be zero. However, because of imperfections arising in the fabrication process, the resistance of a sense-digit line will typically be different than that of its reference line. Consequently, when the same voltage is applied to the two lines, different currents enter the two inputs of the associated differential transpinnor 110 causing a nonzero output, and thus the potential for error. According to a specific implementation, the differential transpinnor 110 for each sense-digit/reference line pair may be trimmed to compensate for this imbalance.

That is, compensation for the resistive imbalance is achieved by reducing the output of the transpinnor through at least partial reversal of one of the high coercivity, i.e., cobalt, layer. According to a specific implementation, the other side of the transpinnor is operated with the high coercivity layer(s) saturated. The low coercivity layer(s) remains free to react to the input current, thereby producing the dynamic output. By reversing just the right percentage of the cobalt layer, the output of the transpinnor can be made to go to zero when the reference and sense-digit lines are in the same magnetic state, i.e., when it is supposed to be zero.

Equation (15b) represents the case where the currents of inputs 1 and 2 are equal in magnitude and of opposite polarity. When the currents are of the same polarity and different magnitude, the equation becomes $$i_S = i_1(\delta_1 - \delta_2) \tag{21}$$

Since the two fractional resistance changes are unequal, $i_S$ is nonzero. In equation (10), f(H) is the fraction of the film for which the magnetization of the high coercivity layer and the low coercivity layer (i.e., the cobalt layer and the permalloy layer) are antiparallel less that for which they are parallel. We can therefore write f(H) as the product of two terms, one representing the high coercivity layer and one representing the low coercivity layer, $$f(H) = f_c(H) f_p(H) \tag{22}$$

where $f_c(H)$ is the fraction of the cobalt layer magnetized in the positive direction less that magnetized in the negative direction and $f_p(H)$ is the corresponding fraction for the permalloy layer. This assumes that the layers switch independently of one another which is a reasonable assumption in that the coercivity of cobalt is much higher than that of the permalloy, and the transpinnor is typically operated at low field where only the magnetization of the permalloy changes and that of the cobalt remains fixed. That is, $$f_c(H) = \text{constant} \quad (23)$$

but the values of $f_c(H)$ will in general be different for the two inputs.

The transpinnor can be set up so that the response of the permalloy to the applied field (from the current in the input line) is relatively linear for the current range of interest, i.e., $$f_p = k I |f_p| < 1 \quad (24)$$

where the value of the proportionality constant k is determined by the shear of the loop. Denote the current from the reference line by $i_{ref}$ and the current from the sense-digit line by $i_{sense}$. Then $$\delta_1 = f_{c1} f_p \, \text{gmr}/2 = f_{c1} k \, i_{sense} \, \text{gmr}/2 \quad (25)$$

$$\delta_2 = f_{c2} f_p \, \text{gmr}/2 = f_{c2} k \, i_{ref} \, \text{gmr}/2 \quad (26)$$

Then, by equations (21), (25), and (26), the output current 15 of the transpinnor is given by $$i_5 = i_1(\delta_1 - \delta_2) = i_1 k(\text{gmr}/2)(f_{c1} i_{sense} - f_{c2} i_{ref}) \quad (27)$$

Equation (27) reveals that even if the sense current is different than the reference current when the line are in the same magnetic state, the output current $i_5$ can be made zero by adjusting the magnetization in the cobalt film. Thus, for example, if the current in a sense-digit line is greater than that in the corresponding reference line, the currents can be balanced by saturating the cobalt in the reference leg of the transpinnor in the positive direction so that $f_{c2}=1$ and partially reversing the cobalt in the sense-digit leg of the transpinnor such that $f_{c1} = i_{ref}/i_{sense}$. This balances the input, even though the lines have different resistances. The adjustment is facilitated by the fact that the two cobalt layers can be adjusted independently. It should be noted that this technique can compensate for virtually any resistive inequality in a given sense-digit/reference line pair. This is even the case where the difference in resistance is much greater than the films' gmr values.

According to various specific implementations, there are a number of ways in which a transpinnor may be connected to a sense-digit/reference line pair. Four of these options will now be described with reference to FIG. 15. Each option is shown using coils. However, it will be understood that implementations using striplines are also contemplated. In addition, for the purpose of clarity, each of the implementation s is shown with only the transpinnor's input lines, i.e., omitting the resistive elements.

FIG. 15(a) shows the input lines 1502 and 1504 of a transpinnor configured such that each of the transpinnor's four resistive elements (not shown) is influenced by current from both sense-digit line 1506 and reference line 1508. In the figure this is shown as the coils being configured concentrically with the coils slightly displaced from one another. In a stripline implementation, the input lines would be striplines deposited on top of the other layers with insulation in between. This configuration has the highest sensitivity for differential amplification of the four shown, but has relatively low sensitivity for trimming unless the overlap of the input lines is only partial.

FIG. 15(b) shows input lines 1512 and 1514 of a transpinnor configured such that the current from sense-digit line 1516 goes through only input line 1512 which supplies magnetic fields to two of the transpinnor's resistive elements, while current from reference line 1518 goes through only input line 1514 which supplies magnetic fields to the other two resistive elements of the transpinnor. Transpinnor 1300 of FIG. 13, for example, is configured for such a connection.

FIG. 15(c) shows input lines 1522 and 1524 of a transpinnor connected in series between the midpoints of sense-digit line 1526 and reference line 1528. In this configuration, the current flowing through the two input lines is proportional to the difference in resistance between them.

FIG. 15(d) shows input line 1532 coupled between sense-digit line 1536 and reference line 1538. Input line 1534 is used to compensate for any intrinsic difference in resistance between them, i.e., to eliminate any offset. This configuration is the least sensitive of the four shown for differential amplification.

Figure 15:
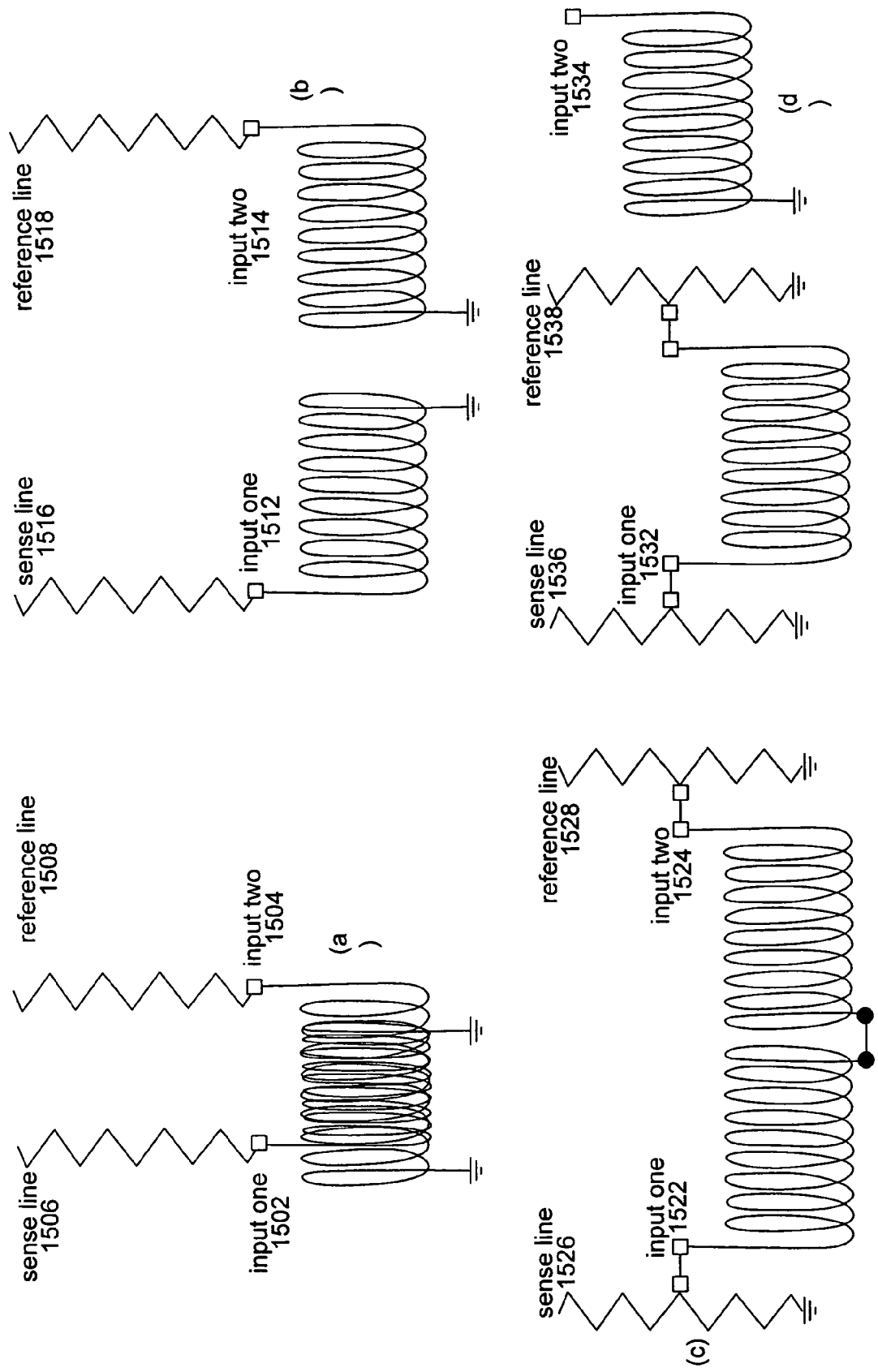
FIGS. 15(a)–15(d) illustrate four different implementations in which a transpinnor is used to balance a sense-digit/ reference line pair.

The four configurations of FIG. 15 lead to four different methods of using transpinnors for resistive trimming.

A differential transpinnor exhibits hysteresis unless operated in a specific way. This hysteresis can be avoided if the transpinnor is biased in the hard direction of the low coercivity (e.g., permalloy) layer with a field greater than or equal to the anisotropy field. This eliminates the hysteresis and the permeability becomes very large. The high coercivity (e.g., cobalt) layer is largely unaffected because its anisotropy field is typically much larger than that of the low coercivity layer. The signal field is applied by the input lines of the transpinnor and is in the easy-axis direction.

A second method which requires no bias field is to fabricate the transpinnor with the easy axis of the low coercivity layer perpendicular to the easy axis of the high coercivity layer. The low coercivity layer thus undergoes uniform magnetization rotation rather than wall-motion switching.

A third method of dealing with transpinnor hysteresis is to initialize the transpinnor the same way before each read operation. For example, each read operation could be started by the application of a negative pulse which switches all the low coercivity layers but not any of the high coercivity layers. This erases any previous low coercivity layer history.

According to a fourth method, the low coercivity layer of the transpinnor is initialized antiparallel to the high coercivity layer, leaving it on the very steep part of the device's hysteresis curve where a small input current will produce a large output.

According to a specific implementation, when a transpinnor is used to balance a sense-digit line against its reference line, the resistive elements of the transpinnor are adjusted such that when the sense-digit and reference lines are in identical magnetic states (i.e., with the same number of ones and zeros in the storage layers of the two lines and at the corresponding locations in each, and with the same corresponding magnetizations in the readout layers of the two lines), the transpinnor gives zero output. When a bit is changed on the reference line but not the sense-digit line, the ratio of resistances changes and the transpinnor gives a nonzero output. That is, the transpinnor is adjusted to give zero output not when both input currents are equal, but when the sense-digit line and the reference line are in the same magnetic state. Note that the voltages applied to the two lines are equal, but because the resistances are unequal, the currents in the lines are unequal. Thus, though the supply to the line pair is a constant current, the individual currents in the pair may be different.

During a read operation, the read current through the trimming transpinnor is large enough to switch its low coercivity layer, but not its high coercivity layer. Therefore, the trimming adjustment is made to the high coercivity layer (which remains in the partially switched state during the read operation), not the low coercivity layer (which needs to be free to change in response to the read current). The high coercivity layer in the transpinnor is not affected by write operations because the resistive elements of the transpinnors are not physically connected to the sense-digit lines.

FIGS. 16(a)–16(e) illustrate the effect of the trimming technique described herein on the balancing of sense-digit/ reference line pairs according to a specific implementation thereof. Each set of three diagrams corresponds to a transpinnor with specific characteristics. In each set the left most diagram represents the transpinnor output, the middle diagram the output from read signal for a "1," and the right most diagram the output from a read signal for a "0."

When the transpinnor associated with a particular sense-digit/reference line pair is well balanced, i.e., the sense-digit line and the reference line have equal resistances, the outputs for a "1" and a "0" are as shown in FIG. 16(a). When the resistance of the sense-digit line is smaller than that of the reference line, the result is an input current offset represented by the vertical dashed line in FIG. 16(b). The creates the "pedestal" of FIG. 16(b) as a result of which the output for a "0" can be mistaken for that of a "1." If, however, a prep pulse of the appropriate magnitude is applied, the response curve of the transpinnor is shifted as shown in FIG. 16(c), as a result of which the pedestal of FIG. 16(b) is removed.

Similarly, if the resistance of the sense-digit line is greater than that of its corresponding reference line, the result is a pedestal of the opposite polarity as illustrated in FIG. 16(d). This pedestal may also be eliminated by the application of a prep pulse of the appropriate magnitude which moves the response curve of the transpinnor to the left as shown in FIG. 16(e).

Figure 16:
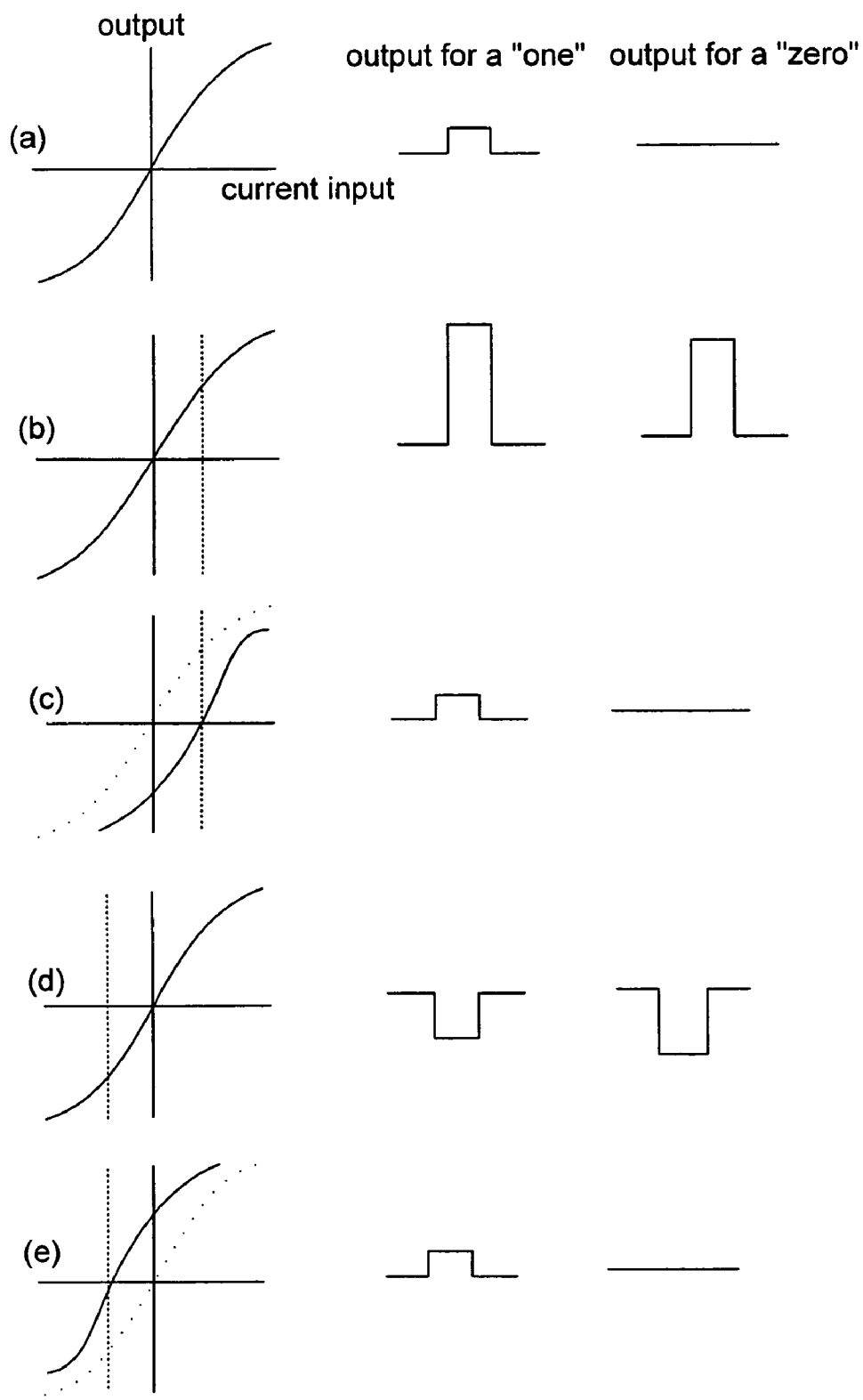
FIGS. 16(a)–16(e) illustrate the effect of a trimming technique on the balancing of sense-digit/reference line pairs.

It will be understood with reference to the diagrams of FIG. 16 that by properly balancing a transpinnor coupled to a sense-digit/reference line pair, the additional steps otherwise required for removing the read operation pedestal may be eliminated and the read time correspondingly reduced.

Referring once again to FIG. 1, three types of GMR structures are shown working together to create an operational all metal random access memory or SpinRAM 100. As discussed above, memory cells 102 comprise multi-layer thin film elements each of which stores one or more bits of information. Word and sense-digit selection electronics (104 and 106) and amplifiers 110 comprise transpinnors. Trim resistors 108 are provided for regulating the current to the memory access lines and comprise GMR films the resistance of which may be trimmed by controlling the percentage switching of the films' high coercivity layers (as discussed above with regard to the balancing of a transpinnor).

According to specific implementations, it is desirable that the GMR films for each of the SpinRAM memory elements 102 have high GMR values to achieve a favorable signal-to-noise ratio. Relatively low coercivities may also be desirable for both the high and low coercivity layers of the memory elements to ensure low switching currents, although the difference in coercivity between the high and low coercivity layers should be sufficiently large to maintain satisfactory operating margins.

The characteristics of the GMR films for the transpinnor-based elements (i.e., 104, 106, and 110) may be similar to those discussed above for the memory elements, but may differ in some respects. That is, like the memory elements, high GMR values are desirable, as is a relatively low coercivity for the low coercivity layers. However, the coercivity of the high coercivity layers can be significantly larger than that which would be acceptable for the corresponding layers of the memory elements. In addition, it is desirable that the GMR values and coercivities of the layers of GMR resistors 108 be relatively high to ensure stability.

A simplified schematic of a transpinnor-based selection matrix is shown in FIG. 17. FIG. 17(a) shows a word line selection matrix 1700 the design for which, it will be understood, may also be used as a sense-digit line selection matrix. It will also be understood that although the implementation shown selects from among 256 word lines, many variations of the size of the selection matrix are contemplated.

At each intersection of a power current line 1702 and a transpinnor selection line 1704 is a transpinnor 1706 which delivers current to a selected word (or sense-digit) line 1708. A simplified representation of a transpinnor 1706 is shown in FIG. 17(b). The input selection line 1704 is shown coupled to the individual GMR resistive elements via a plurality of coils in FIG. 17(b) for didactic reasons. It will be understood, however, that the input selection line is fabricated as a stripline in integrated circuit implementations. At the output of each transpinnor 1706 is one of 256 word (or sense-digit) lines 1708. According to a specific implementation, the configuration of selection matrix 1700 is advantageous in that power need only be supplied to one column of transpinnors (i.e., the one corresponding to a selected word line) at one time. Transpinnors 1706 function as the gates of selection matrix 1700, a particular word or sense-digit line being selected in the following manner.

A power current is applied to the column of transpinnors 1706 which includes the transpinnor corresponding to the line 1708 to be selected via one of power current lines 1702. Power being applied to each resistively balanced transpinnor results in zero output. As discussed above, individual transpinnors may be balanced to achieve this zero output using the technique referred to herein as magnetoresistive trimming. Exemplary trimming techniques which may be employed with various embodiments of the invention are described in U.S. Pat. No. 6,469,927 for MAGNETORESISTIVE TRIMMING OF GMR CIRCUITS issued on Oct. 22, 2002, the entire disclosure of which is incorporated herein by reference for all purposes.

Coincident with the application of the power current, a current is transmitted via the input selection line 1704 corresponding to the transpinnor 1706 to be selected. The field associated with this current unbalances the selected transpinnor by at least partially reversing the magnetization of at least one of the transpinnor's low coercivity layers, and thereby changing the resistance of the corresponding GMR element. The transpinnor imbalance results in a corresponding output current which is delivered to the memory array via the word (or sense-digit) line 1708 connected to the transpinnor output.

Most computer systems are based on the use of volatile main memory which is typically implemented using dynamic random access memory (DRAM) technology. The volatile nature of DRAM and its relatively high cost per bit of storage capacity has, in turn, led to the development of magnetic disk technology as the basis for the permanent mass storage component of computer memory systems. This hybrid architecture has some well known disadvantages which include, among other things, the relatively long access time for magnetic disks, increased operating system complexity, and the risk of data loss during power failures.

Figure 18:
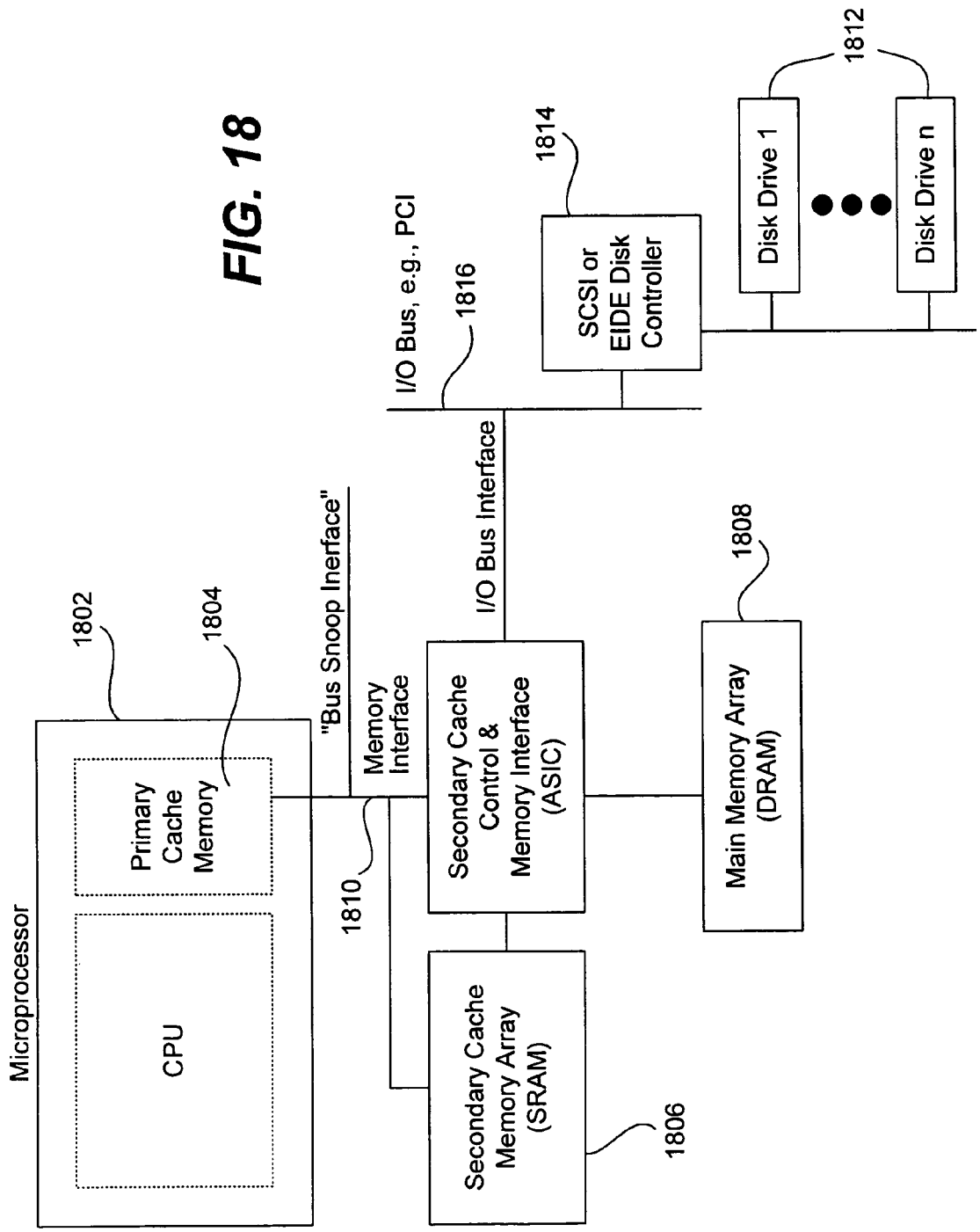
FIG. 18 shows a generalized computer memory hierarchy.

The block diagram of FIG. 18 shows a generalized computer memory hierarchy associated with a microprocessor 1802. Several types of memory technologies which serve a variety of functions are employed. A high performance primary cache 1804 is integrated with microprocessor 1802. A secondary cache 1806 is also provided. Cache memories are usually small (e.g., 256K), power hungry SRAM devices. They greatly enhance system performance by providing the microprocessor with a small block of information which may be accessed at speeds rivaling the speed of operation of the microprocessor itself. Storing a small block of data in cache memory allows most microprocessor requests (e.g., >90%) to be filled at SRAM speeds (e.g., 10 ns).

If a requested piece of information is not present in the cache, the information must be retrieved from main memory 1808. Main memory 1808 communicates with microprocessor 1802 via memory interface 1810, is typically much larger (e.g., 16M) and slower (e.g., access times of 70 ns) than cache memory, and is typically implemented in DRAM. This main memory provides microprocessor 1802 with relatively fast access to large blocks of data as well as stores and streams data to the display.

If a requested piece of information is not present in main memory, the information must be retrieved from mass storage. Such mass storage may be provided by one or more magnetic disks 1812 which are coupled to microprocessor 1802 via disk controller 1814 and I/O bus 1816 which may be, for example, an ISA, EISA, PCMCIA, PCI, or CompactPCI bus. The typical storage capacity of such magnetic disk technology is on the order of gigabytes, but the access times are orders of magnitude slower than the other levels of the memory hierarchy (e.g., 12 ms).

An architecture may be constructed in which each of the memories outside of microprocessor 1802 may be implemented with the all-metal giant magnetoresistive memories described herein. These memories will also be referred to herein as SpinRAMs®. The SpinRAM technology replacement for DRAM/FLASH is also referred to as SpinRAM2 and the replacement for rotating disk storage is referred to as SpinRAM3. SpinRAM1 is the replacement for SRAM such as that used in cache memories.

Figure 19A:
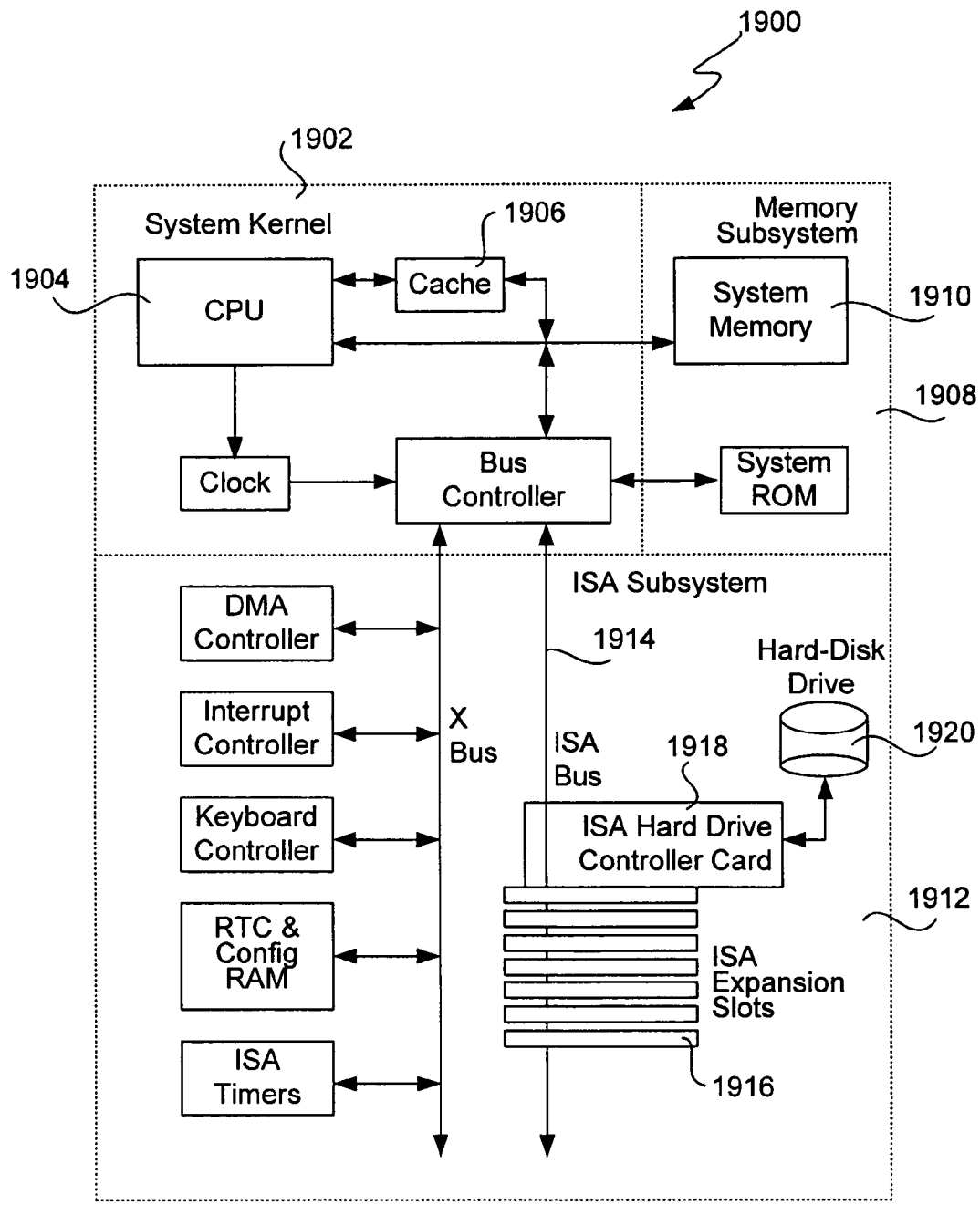
FIGS. 19(a) and 19(b) are is functional block diagrams of ISA-bus IBM compatible personal computer systems which may be employed with specific embodiments of the invention.

An example of a specific implementation of a unified memory architecture designed will now be described with reference to FIGS. 19(a) and 19(b). FIG. 19(a) is a functional block diagram of an ISA-bus IBM compatible personal computer system 1900. System kernel 1902 includes CPU 1904 and cache memory 1906 which may be the CPU's primary cache or, where the CPU includes an integrated primary cache, the CPU's secondary cache. Memory subsystem 1908 includes the main system memory 1910. ISA subsystem 1912 includes an ISA bus 1914 along which are disposed ISA expansion slots 1916. At least one of the expansion slots is coupled to an ISA hard drive controller card 1918 which controls magnetic hard disk drive 1920.

Figure 19B:
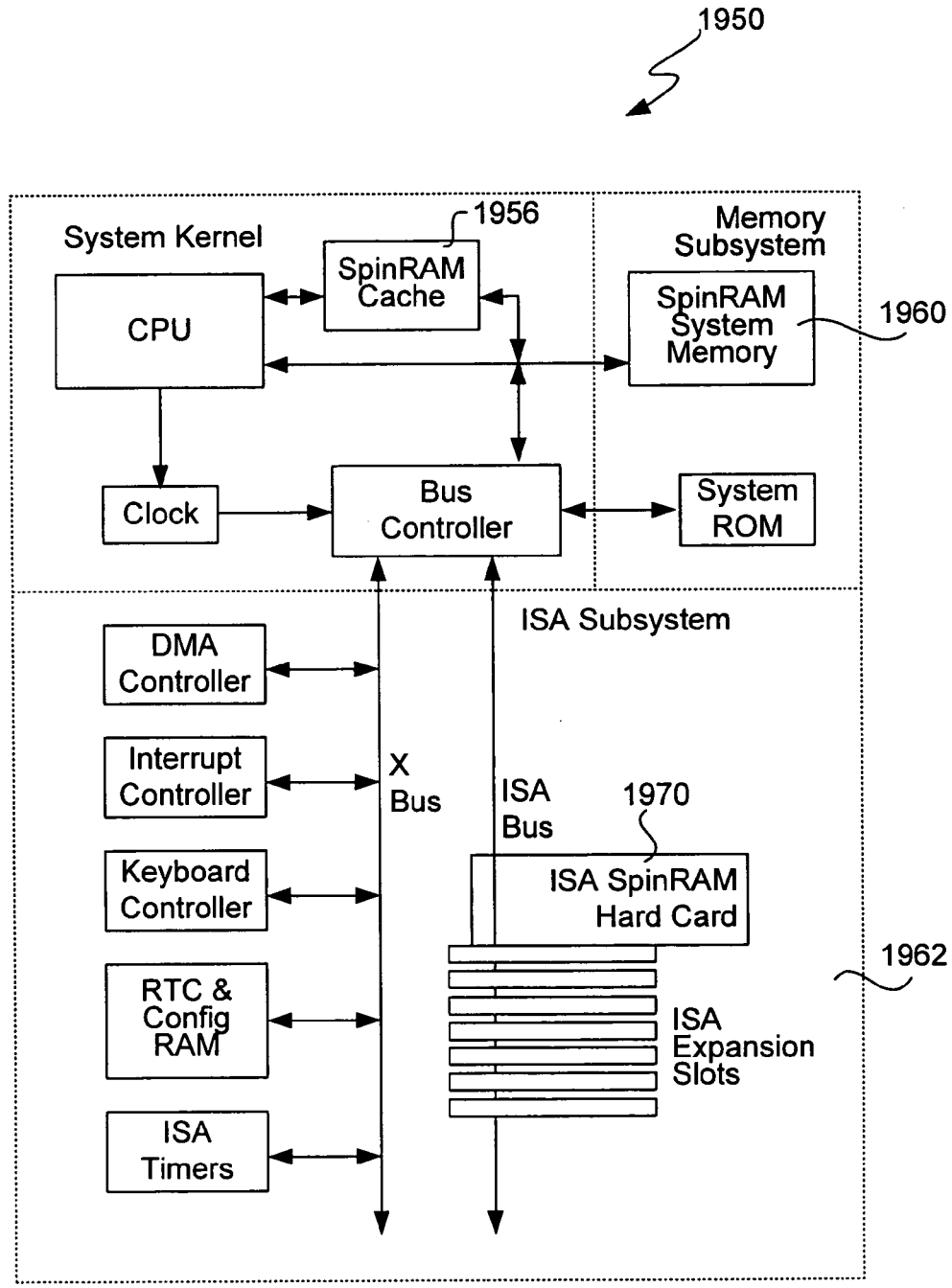

FIG. 19(b) is a functional block diagram of an ISA-bus IBM compatible computer system 1950 having a memory architecture designed according to a specific implementation in which the cache, system, and hard disk memories of computer system 1900 have been replaced with the all-metal giant magnetoresistive memories. It will be understood that, although an ISA system is shown in this example, the same principles may be applied to virtually any computer system, e.g., EISA, PCI, CompactPCI, etc.

It should also be noted that, although all three of the cache, system and hard disk memories are replaced in this example, some other subset of these memories (e.g., just the disk drive and system memory) may be replaced by the all-metal giant magnetoresistive memory technology described herein.

With reference to ISA subsystem 1962, ISA SpinRAM hard card 1970 replaces the disk drive and controller of system 1900. The memory architecture of SpinRAM hard card 1970 may be, for example, any of the architectures and memory designs described above with reference to FIGS. 1–17. As with other solid-state memory disk replacement schemes, this implementation eliminates the need for both the disk and its controller card. In addition to reducing size, weight, and power consumption, SpinRAM hard card 1970 drastically reduces access time and eliminates mechanical failures. And, unlike a FLASH-based hard card solution, the memory array of SpinRAM hard card 1970 may be configured to be byte-alterable, has virtually unlimited read/write cycles, and sub-microsecond read and write times.

Figure 20:
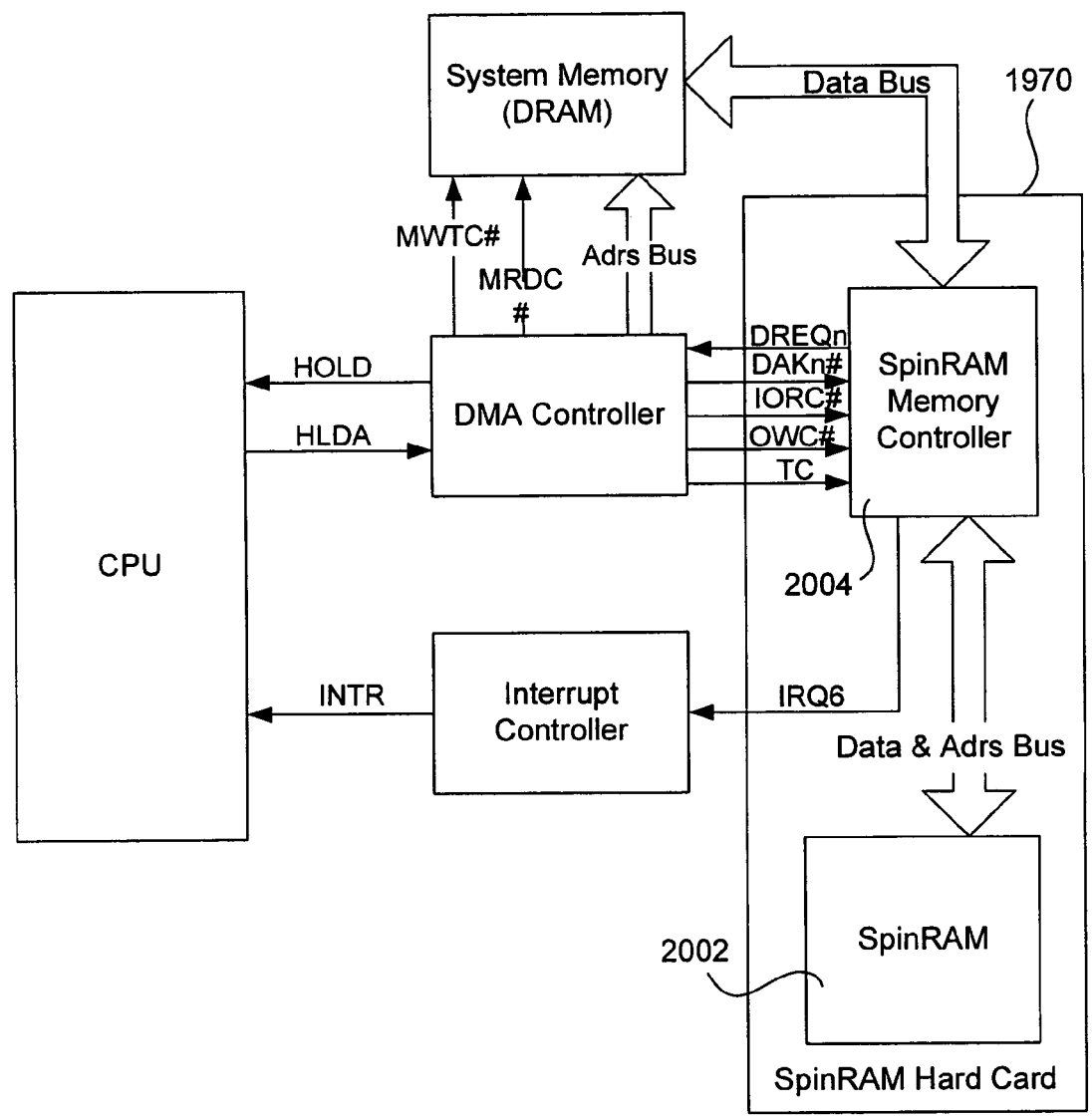
FIG. 20 is a block diagram of a specific implementation of a SpinRAM hard card which may be employed with specific embodiments of the invention.

A block diagram of a specific implementation of a SpinRAM hard card 1970 is shown in FIG. 20. SpinRAM memory array 2002 (e.g., memory 100 of FIG. 1) is controlled by SpinRAM memory controller 2004 which, according to a specific implementation, is located on the same hard card. In PC-bus implementations such as the ISA implementation of FIG. 19(b), the bus interface of controller 2004 mimics that of a standard hard disk controller. By contrast, the memory array interface of controller 2004 does not resemble the corresponding interfaces of currently available hard disk controllers. That is, for example, unlike FLASH memories and as described above, SpinRAM technology is current controlled and random access. Controller 2004 is therefore configured to facilitate access to the memory cells to SpinRAM memory array 2002 according to the techniques described above.

The desired functionality of SpinRAM controller 2004 may be implemented, for example, by modifying an existing chip set, using discrete components, or designing a custom controller ASIC. The final interface between controller 2004 and the actual memory cells of SpinRAM array 2002 comprise module interface circuits (not shown) such as, for example, selection matrices 104 and 106 of FIG. 1. According to various implementations and as described above with reference to the all-metal memory technology, such module interface circuits may be fabricated on the same wafer or substrate as the memory cells themselves using the same processes. According to other implementations, such module interface circuits may be implemented in separate integrated circuits, in which case, SpinRAM memory array 2004 could be packaged as a multi-chip module.

Referring back to FIG. 19(b), SpinRAM cache memory 1956 and SpinRAM system memory 1960 replace the cache and system memories of system 1900. As with SpinRAM hard card 1970, memories 1956 and 1960 may comprise any of the architectures and memory designs described above with reference to FIGS. 1–17.

Figure 21:
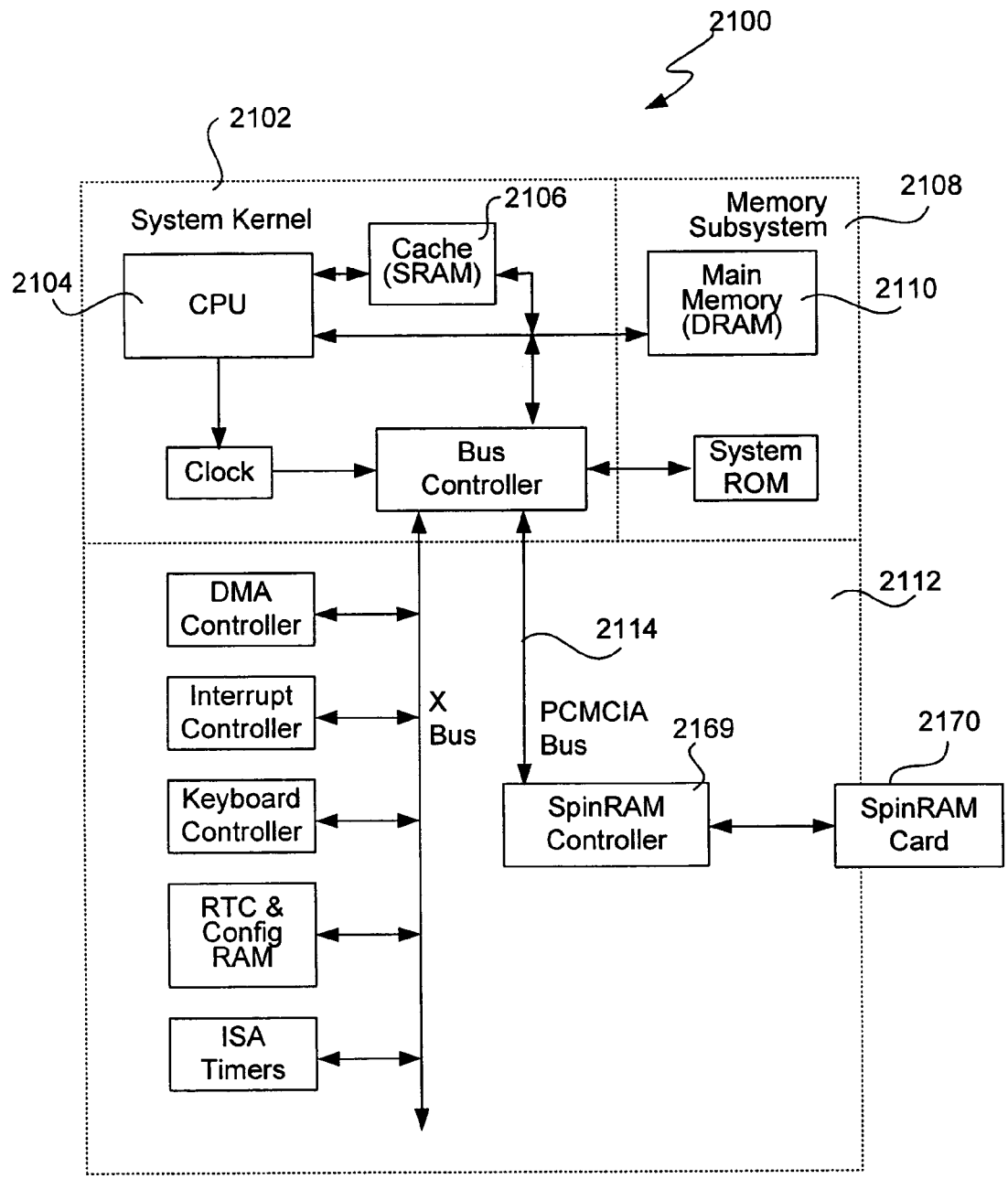
FIG. 21 is a functional block diagram of a personal computer system having a PCMCIA architecture which may be employed with specific embodiments of the invention.

FIG. 21 is a functional block diagram of a personal computer system 2100 having a PCMCIA architecture in which a conventional hard disk drive and its controller (typically coupled to PCMCIA bus 2114 have been replaced by SpinRAM controller 2169 and SpinRAM card 2170. System kernel 2102 includes CPU 2104 and cache memory 2106 which may be the CPU's primary cache or, where the CPU includes an integrated primary cache, the CPU's secondary cache. Memory subsystem 2108 includes the main system memory 2110. PCMCIA subsystem 2112 includes PCMCIA bus 2114 which is coupled to SpinRAM controller 2169.

It should be noted that the examples of specific memory architectures described above are tailored to replace an existing installed base of computer systems in which the ways in which the different types of memories are connected to the system are artifacts of the characteristics of the memory technologies themselves, and may not take full advantage of the performance capabilities of the SpinRAM technology described herein. That is, for example, although plugging a SpinRAM hard card as a replacement for a hard disk drive may represent a simple and fast integration of giant magnetoresistive memory technology into the vast installed base of IBM compatible PCs, a more fundamental memory architecture shift is contemplated which will more readily exploit the advantages of the memories described herein.

This may be understood with reference to the architectural constraints of the PC bus system. Because the time required for a CPU to retrieve data from a conventional hard disk is primarily a function of disk access time rather than propagation delay through the bus controller, there is little or no penalty associated with connecting the hard disk to the CPU through the controller. Of course, this is not the case for cache and system memory which are directly connected (architecturally) to the CPU. With the fast access times of the SpinRAM technology, it is desirable to connect SpinRAM-based mass storage to the CPU in such a way to avoid the penalty imposed by conventional PC bus architectures. Such an implementation is shown in FIG. 22.

Figure 22:
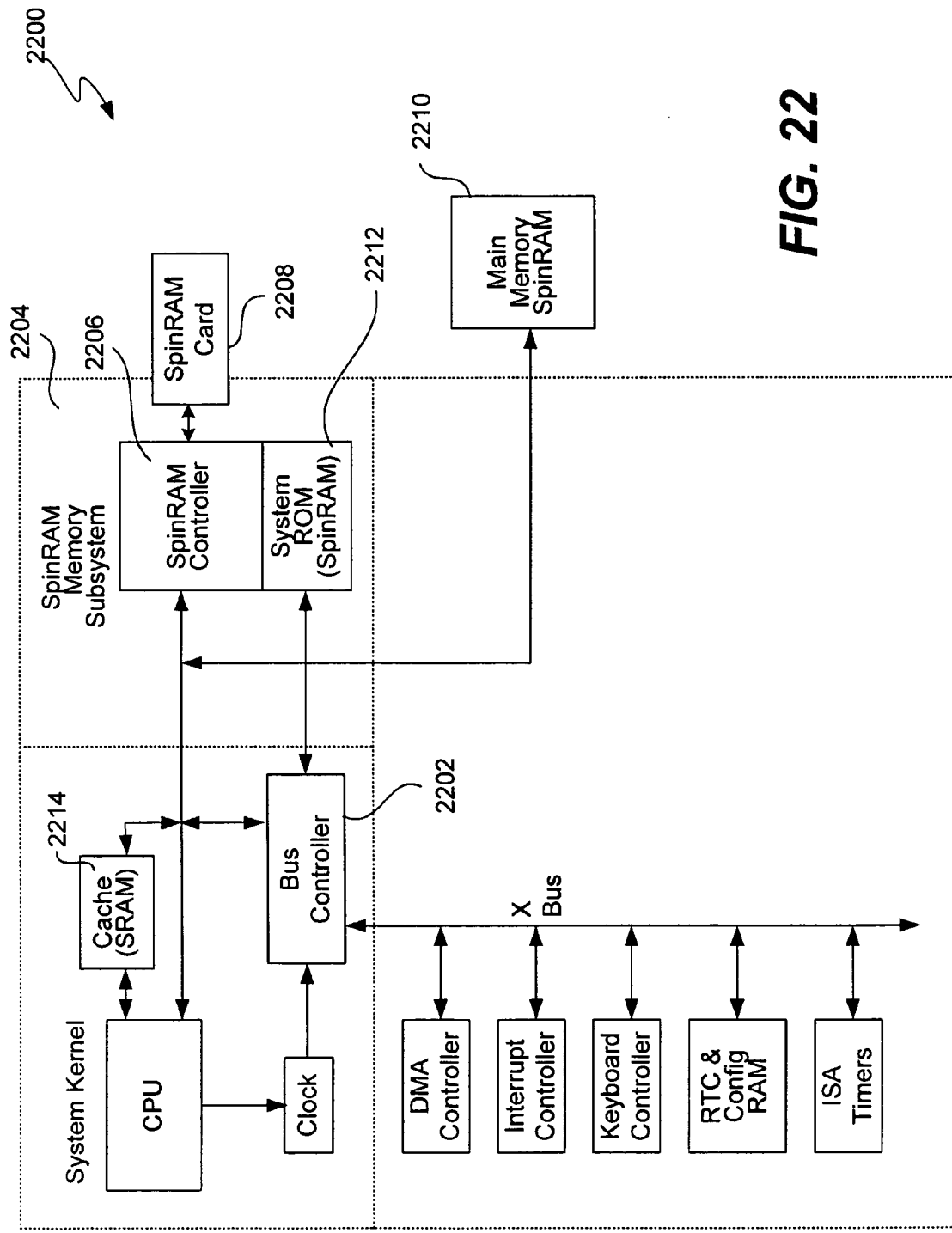
FIG. 22 is a block diagram of computer system using SpinRAM technology which may be employed with specific embodiments of the invention.

FIG. 22 is a block diagram of computer system 2200 using SpinRAM technology for system memory, system ROM, and mass storage. According to this implementation, the architecture of computer system 2200 is designed with the capabilities of giant magnetoresistive memory technology in mind, e.g., access to mass storage via bus controller 2202 and a PC bus is eliminated. A SpinRAM memory subsystem 2204 comprises SpinRAM controller 2206 to which SpinRAM card 2208 connects. SpinRAM card 2208 may, for example, be implemented as discussed above with reference to SpinRAM card 1970. Main memory 2210 is also part of memory subsystem 2204 and comprises a SpinRAM array.

System ROM 2212 is also implemented as a giant magnetoresistive SpinRAM array. System ROM 2212 may be used, for example, to store a PC's BIOS code or user applications for a palm top device. Using the byte alterable SpinRAM for system ROM allows the capability of updating what is typically hard coded information in many of today's computer systems. According to another implementation, cache memory 2214 may also be implemented using the SpinRAM technology.

It will be understood that SpinRAM memory subsystem 2204 may be configured in a variety of ways. That is, subsystem 2204 may comprise different subsets of memories 2208, 2210, 2212 and 2214. In addition, different subsets of these memories may be integrated in the same device or configured as separate modules.

It will be understood that the various memory architectures described herein are merely exemplary and should not be construed as limiting the scope of the invention. For example, specific implementations have been described herein with reference to a selection matrix implemented using single input transpinnors (e.g., see FIG. 17). It will be understood, however, that a two input transpinnor such as transpinnor 1300 of FIG. 13 may also be used to implement such a selection matrix. That is, two-line selection striplines could supply magnetic fields to the two-input transpinnors in the matrix array with a separate power current input.

In addition, it will be understood that the number of memory access lines required to access information in the individual memory cells in a memory array may vary in accordance with the structure of the memory cells and the number of bits stored in each. The number and types of access lines for a given memory cell structure may be determined by one of skill in the art of memory technology from, for example, the descriptions of various GMR memory cells herein.

Furthermore, although an example of a unified memory architecture has been described herein in the context of specific architecture types, it will be understood that a wide variety of memory architectures for computers and other systems may be employed.

As discussed above, in one such architecture a rotating disk is physically but not logically replaced with a SpinRAM array. That is, a memory controller is configured such that the rest of the system operates as if it is connected to a rotating disk, but the controller interacts with the SpinRAM array. Such an architecture eliminates the disadvantages of rotating disk memories (e.g., long access times, susceptibility to environmental conditions) without the need for extensive retrofitting or redesign of installed computer base.

Another contemplated architecture involves the partial replacement of system memory with the SpinRAM technology. The SpinRAM portion of the system memory could, for example, be used to store data that must be preserved in the event of a power failure. According to a specific implementation, the SpinRAM portion of the system memory store a small RAM file system which provides very fast access to a subset of the system's overall file stores.

Of course full replacement of system memory with SpinRAM technology is contemplated as well. This would allow expansion of the use of system memory to include data which must be maintained through power loss and system reboots. Such a system could recover much faster than conventional systems after a power down has occurred. All that would need to be done is the normal processor power-up diagnostics and the restoration of the internal machine state. No time would be wasted reloading information from mass storage to system memory.

Another contemplated architecture replaces both system DRAM and magnetic disk storage with SpinRAM technology. The replacement of both of these memories makes possible the unified memory architecture in which most or all of a computer system's memory is implemented using a single technology, i.e., SpinRAM. Further variations of such an architecture include the replacement of other memories with SpinRAM technology including, for example, cache memory and system ROM.

Figure 23:
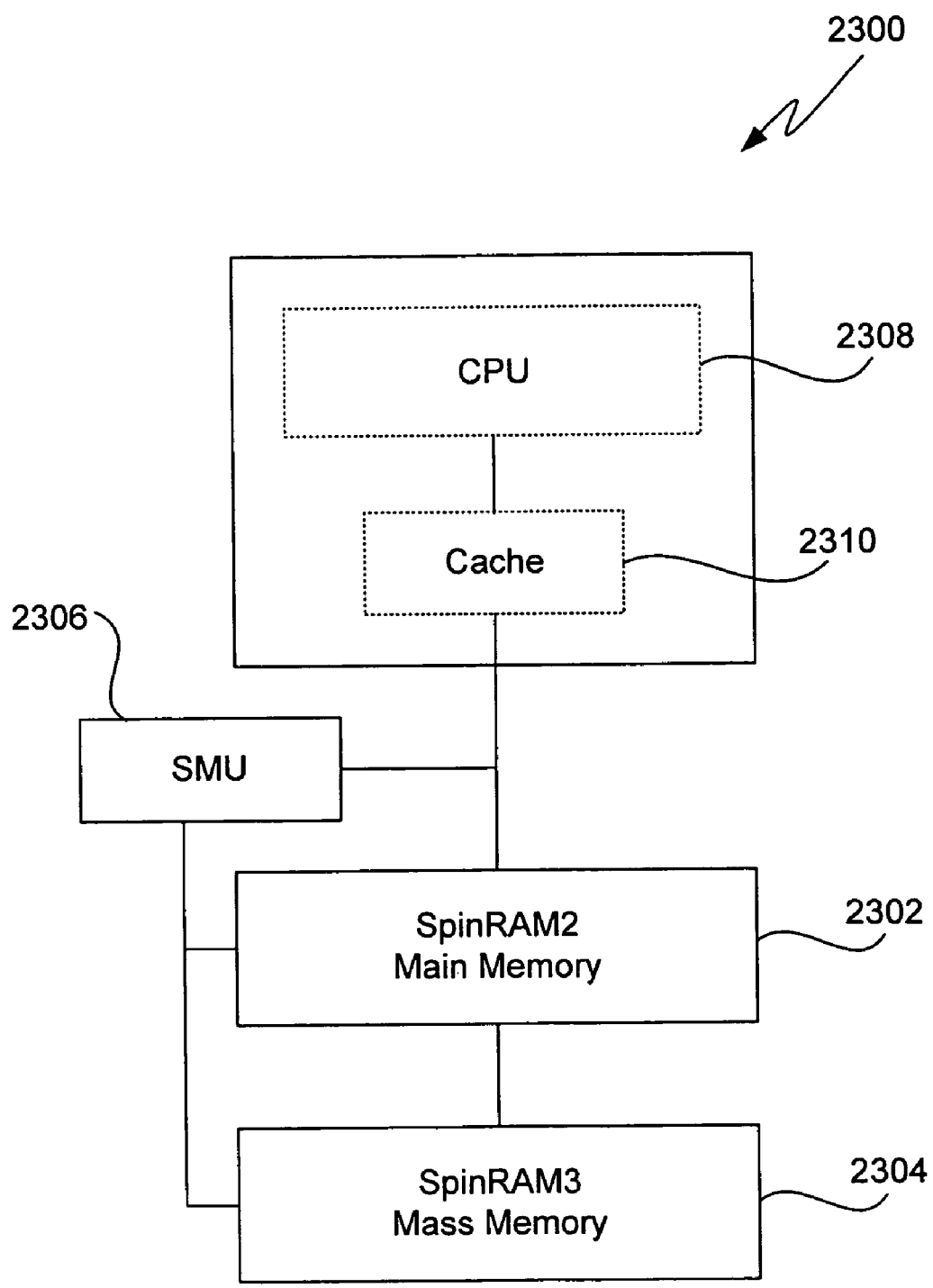
FIG. 23 is a simplified block diagram of a generalized computer system based on SpinRAM technology which may be employed with specific embodiments of the invention.

A simplified block diagram of a generalized computer system based on the SpinRAM technology is shown in FIG. 23. The design of system 2300 is based on a two-tier architecture incorporating at least SpinRAM2 (2302) and SpinRAM3 (2304), i.e., SpinRAM replacements for DRAM and rotating disk, respectively. The main memory pool is based on SpinRAM2 (RAM speed memory), and secondary file storage on SpinRAM3 (disk density). A SpinRAM Management Unit (SMU) 2306 handles transfers between memories 2302 and 2304 and CPU 2308, providing much the same functionality as a conventional cache management unit in a computer system employing the cache memory paradigm. A cache memory 2310 may be provided close to CPU 2308 and may comprise SpinRAM1 technology. An level one cache memory (not shown) may be provided integrated with CPU 2308.

It should be noted that SpinRAM technology allows the cache paradigm to be carried throughout system 2300 regardless of the number of SpinRAM levels. Thus, for example, CPU 2308 receives data from its level one cache. The level one cache receives data from the level two cache (e.g., cache 2310). The level two cache receives data from main memory 2302. Main memory 2302 acts as a level three cache in concert with SMU 2306. Finally, main memory 2302 receives data from mass storage memory 2304 which acts as a fourth level cache.

As mentioned above, building silicon-based three-dimensional structures is problematic. This is primarily due to the fact that crystalline-silicon ICs can only be reliably built as planar two-dimensional structures on the top surface of the wafer. Attempts to build electronic functions in amorphous silicon structures or partially crystalline structures have been largely unsuccessful, such circuits being difficult to manufacture and being characterized by a wide dispersion of functional parameters and significant performance degradation.

By contrast, a wide variety of three-dimensional integrated circuits are made possible by the all-metal electronics and memories described herein. According to various implementations, such structures are fabricated by a purely additive process of stacking a circuit layer on top of another similar or dissimilar structure. Because of the nature of the all-metal circuit components in these circuit layers (e.g., transpinnors, SpinRAM memory cells), this may be done without performance degradation or an increase in circuit area. And because of the ability to expand in a third dimension, such implementations also allow scaling to higher densities without having to decrease feature size, thus avoiding the exponential increase in cost and technical hurdles associated with migrating to ever finer manufacturing geometries.

Figure 24:
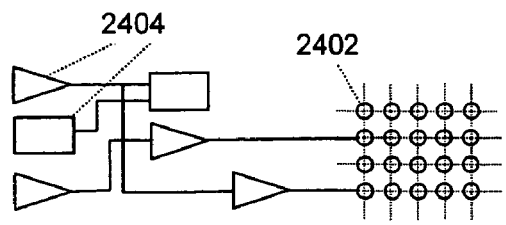
FIG. 24 is a simplified block diagram of an all-metal circuit which may be employed with various embodiments of the invention.

As discussed above, the transpinnor is an all-metal active device. Transpinnor-based circuits can be fabricated on almost any substrate including, for example, other all-metal circuits and components, glass, and any form of silicon. And specifically, they may employ, but do not require a semiconductor substrate. SpinRAM memory cells also may employ, but do not need a semiconductor substrate. Both the transpinnor and SpinRAM cell are constructed of several layers of magnetic and non-magnetic materials deposited on top of each other. As referred to herein, an integrated circuit structure includes a collection of transpinnors and SpinRAM cells wired to perform a predetermined function. A partial schematic diagram of an exemplary transpinnor and SpinRAM integrated circuit is shown in FIG. 24. An array of SpinRAM cells 2402 is shown with support electronics comprising a variety of transpinnor-based circuits 2404.

Figure 25:
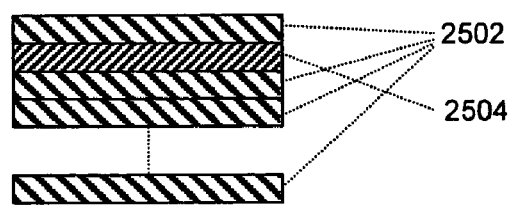
FIGS. 25–27 are simplified representations of cross-sections of three-dimensional structures which may be employed with various specific embodiments of the invention.
Figure 26:
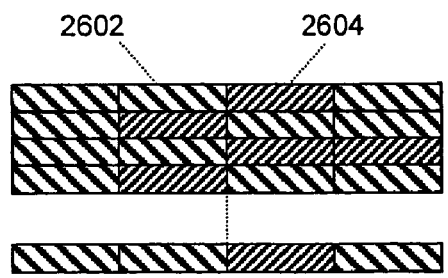

The fact that no special substrate is needed to build a transpinnor or a SpinRAM cell allows both individual transpinnors and SpinRAM cells, or transpinnor and SpinRAM cells-based structures, to be stacked vertically and electrically connected, as needed, by linking the layers through wires. The vertical disposition of transpinnor or SpinRAM cells, as well as of transpinnor and SpinRAM-based structures modifies the physical deployment of the system building blocks without affecting the logical and electronic functionality of the system. FIG. 25 illustrates a cross section of a structure in which transpinnor circuits 2502 and SpinRAM cells 2504 are deployed vertically. FIG. 26 illustrates a cross section of a more complex structure in which transpinnor circuits 2602 and SpinRAM cells 2604 are deployed both vertically and horizontally.

Figure 27:

The vertical manufacturing techniques enabled by the all-metal electronics and memories described herein enable the fabrication of nonvolatile memory structures with all-metal support electronics. Such support electronics may include, but not limited to, sense amplifiers, decode circuitry, bit drivers, word drivers and data buffers. As shown in FIGS. 25 and 26 and as will be discussed below, these support electronics may be deployed above, below, or alongside the memory cell array(s). In a memory block structure in which the memory cell array and the support electronics are deployed on separate layers (as shown in FIG. 27), the area occupied by the memory block may be reduced to the larger of the two layers (e.g., memory cell array 2702 or support electronics layer 2704). This could significantly reduce the overall physical area of the memory component while potentially increasing the area density by orders of magnitude.

Figure 28:
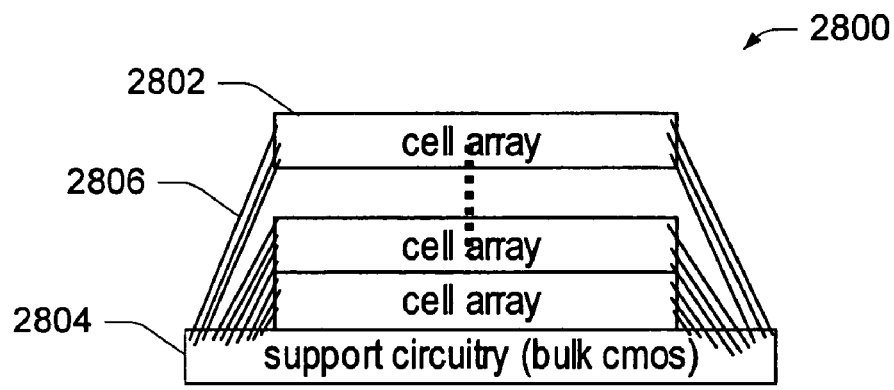
FIG. 28 is a simplified representation of a stacked three-dimensional structure which may be employed with various specific embodiments of the invention.
Figure 29:
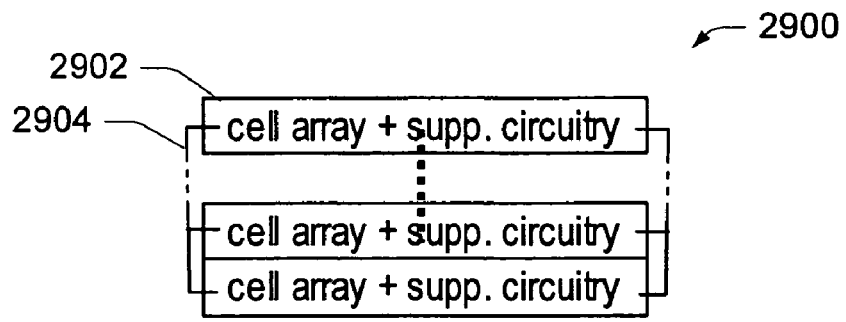
FIGS. 29 and 29A are simplified representations of all-metal stacked three-dimensional structures which may be employed with various specific embodiments of the invention.

FIGS. 28 and 29 show two different approaches to constructing a block of memory. In FIG. 28, a hybrid memory block 2800 includes memory cell arrays 2802 stacked on top of a bulk CMOS semiconductor substrate 2804 in which the support circuitry for arrays 2802 is implemented. Vertical connectivity between substrate 2804 and the individual arrays 2802 is provided by signal lines 2806. This solution entails increasing loss of performance of the memory cells with increasing distance from the silicon substrate. This limits the number of stacked layers. In FIG. 29, an all-metal memory block 2900 includes all-metal levels 2902 interconnected by interconnect 2904. And although the depicted structure indicates that each level includes both memory cells and support circuitry, it will be understood that these may be deployed on alternate levels as described above with reference to FIGS. 25 and 26.

The all-metal structure of FIG. 29 may enjoy several advantages over the hybrid structure of FIG. 28. For example, because support electronics in memory block 2900 may be included on the same or an adjacent level with the corresponding memory array, the likelihood of signal degradation or skew is reduced as compared to memory block 2800 in which the distance between each successive cell array and the support circuitry in substrate 2804 increases. In addition, the semiconductor portion of memory block 2800 makes it more susceptible to intense radiation environments as compared to the uniformly radiation hard structure of memory block 2900. Moreover, because of the increasing length of the upper-level wires, signal delays and degradation will limit the number of layers that can be stacked. Finally, memory block 2800 requires the high temperature fabrication processes by which semiconductor processing is characterized as compared to the relatively low temperature deposition processes by which the all-metal levels of memory block 2900 may be fabricated.

Figure 29A:
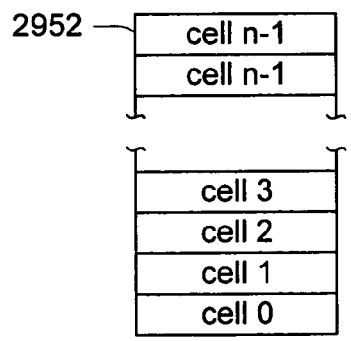
Figure 30:
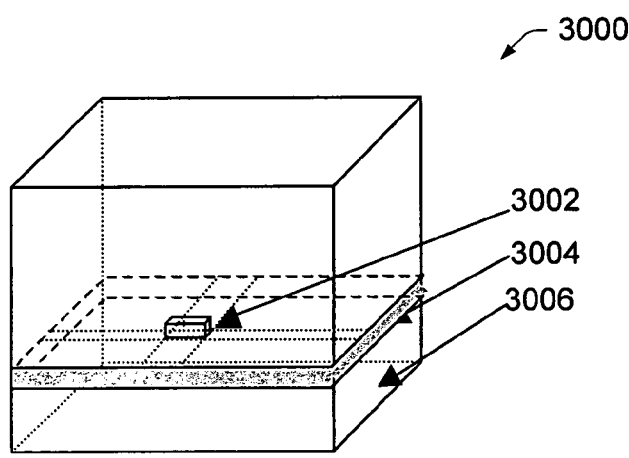
FIG. 30 is a representation of a stacked three-dimensional structure which may be employed with various specific embodiments of the invention.

The magnetic-film structure in FIG. 29A shows another implementation. According to such an implementation, memory cells 2952 in a specific block of memory are built vertically, i.e., on top of each other, rather than horizontally, i.e., next to each other. As shown, n cells may be stacked in consecutive layers, and may represent n bits of memory (where there is one bit per cell). Such a configuration may be useful, for example, where the block of memory is associated with underlying circuits or structures. The number of cells to be stacked in this manner is limited only by processing technology considerations.

According to some implementations, a modular approach to the construction of 3D circuits is provided. According to one such implementation illustrated in FIG. 30, all-metal components in a 3D structure 3000 are fabricated in modular, self-contained "tiles" 3002 of a variety of types. For example, some tiles are arrays (which may be of arbitrary size) of all-metal memory cells which may comprise, for example, the SpinRAM described herein. Such memory cell tiles may or may not include support electronics. Other tiles may be all-metal (e.g., transpinnor-based) electronics which may provide support electronics for corresponding memory arrays or perform some other function.

Tiles 3002 may be contiguously arranged in a two-dimensional "floor" or "level" 3004 which may be fabricated on top of another such level or directly on top of a substrate 3006. As discussed above, substrate 3006 may comprise a wide variety of rigid, flexible, and even organic materials including, for example, glass, polyimide, polycarbons, and silicon.

Figure 31:
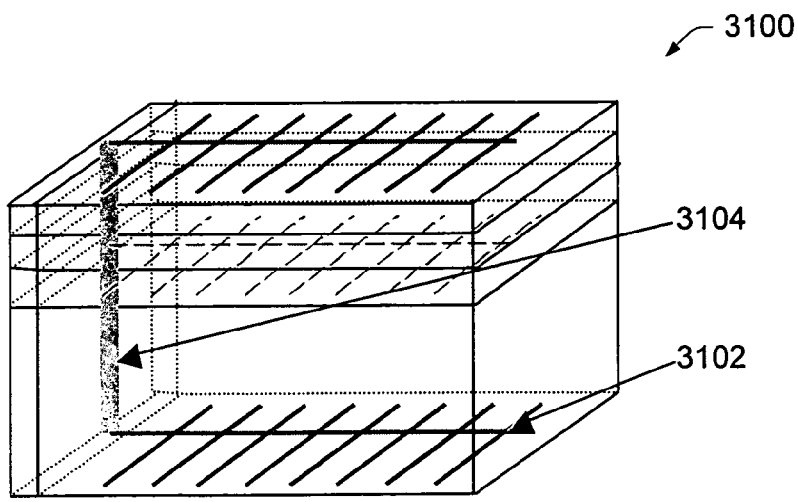
FIG. 31 illustrates an exemplary interconnect for use with various embodiments of the invention.

Whether or not this modular approach is employed, connectivity within and between floors of components, tiles, or modules in such a 3D structure may be provided as shown in FIG. 31. In the implementation shown, each floor has its own dedicated horizontal connection stratum 3102 which provides connections to each circuit, cell, or tile on the floor. Regardless of the particular implementation, connection strata 3102 may be, for example, a network of conventional striplines which are patterned and deposited according to any of a variety of well known techniques.

Connectivity between floors may be provided by a vertical connection structure 3104 which connects with horizontal connection strata 3102. According to various implementations, connection structure 3104 may comprise one or more structures at one or more edges of 3D structure 3100. According to other implementations, connection structure 3104 may comprise one or more structures deployed between the tiles of the various floors of structure 3100. In the implementation shown, vertical connection structure 3104 is provided along one edge of 3D structure 3100 resulting in only a slight increase (e.g., 2–5%) in the structure's footprint. Connectivity between floors can be achieved with more than just one vertical connection structure 3104. Implementation with multiple vertical connections can result in shorter total connectivity. The vertical connection structures can be implemented by utilizing well known and mature metallization techniques.

Figure 32:
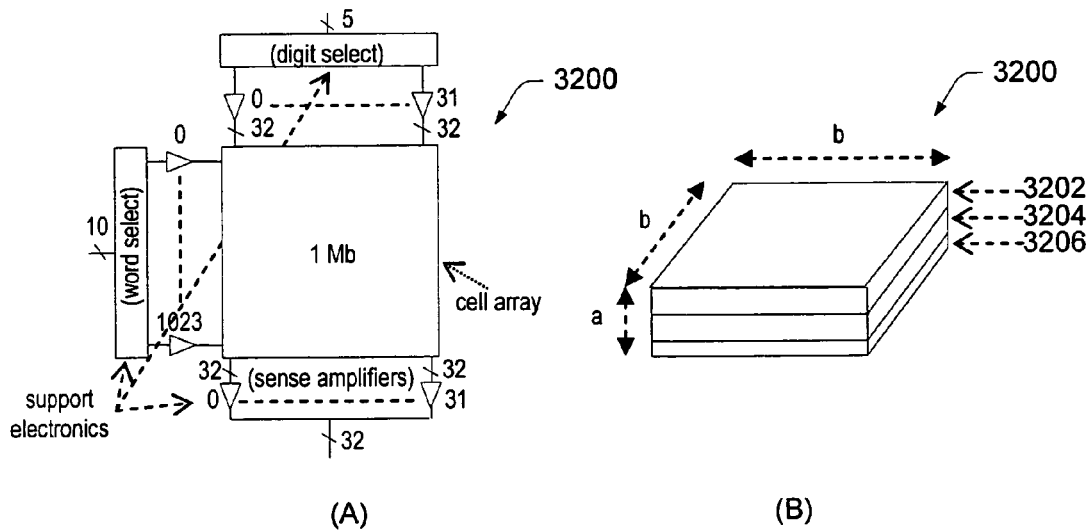
FIGS. 32 and 33 illustrate alternative tile configuration for use with various embodiments of the invention.
Figure 33:
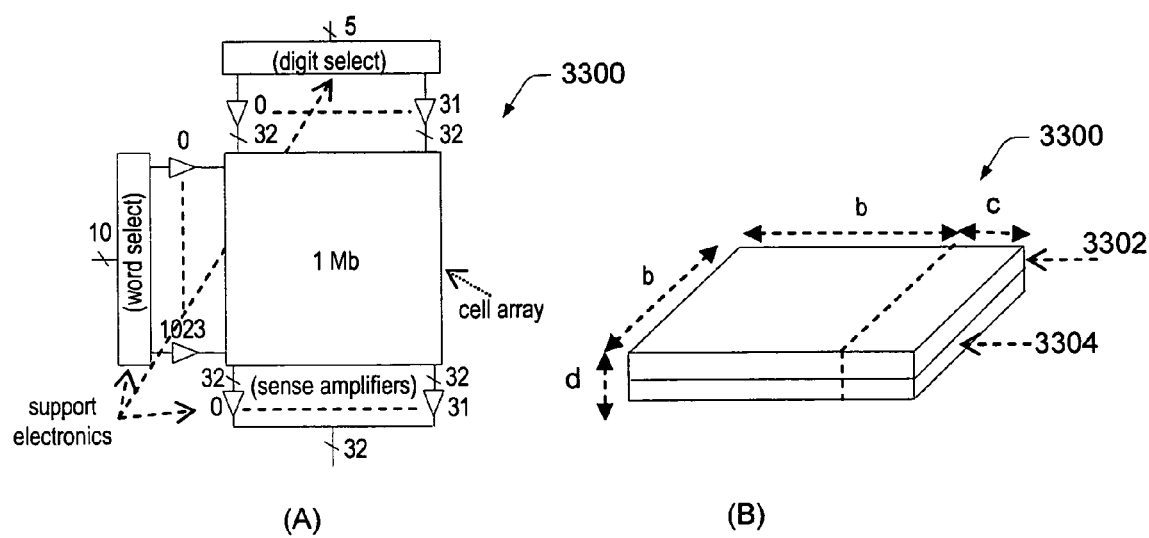

Two alternative memory module tile configurations which may be employed with various embodiments of the invention will now be described with reference to FIGS. 32 and 33. In each of these implementations, a tile is a fully functional memory module with a memory array, selection circuitry, and sense amplifiers. FIGS. 32A and 32B depict schematically and physically, respectively, what is referred to herein as a "folded" tile. In this context, the term "folded" is used to refer to a memory module 3200 in which memory cell arrays 3202 and support electronics 3204 are deployed on separate levels. Support electronics may include, for example, address logic and sense amplifiers. A connection stratum 3206 (preferably deployed on a separate level) provides for intra-tile connections. As with the connection structure of FIG. 31, connection stratum 3206 may comprise, for example, a network of conventional striplines which are patterned and deposited according to any of a variety of well known techniques. As shown, the area of the tile is $b^2$ with a height of a. Exemplary values for b and a are 250 $\mu$m and 0.2 $\mu$m, respectively.

FIGS. 33A and 33B similarly depict an "unfolded" tile corresponding to a memory module 3300 in which memory cells and support electronics are deployed on the same level 3302. Intra-tile connectivity is provided by connection stratum 3304. The area of the tile is now increased (i.e., by b×c), while the height decreases (i.e., d<a). Exemplary values for c and d are 120 $\mu$m and 0.12 $\mu$m, respectively.

It should be noted that the two different implementations are schematically identical as shown in FIGS. 32A and 33A. However, from a physical point of view, the folded tile (memory module 3200) provides a memory cell-array area efficiency of 100%, i.e., the overhead represented by the support electronics and the tile connections do not increase the footprint of the module. On the other hand, the unfolded tile (memory module 3300) has fewer layers, requiring fewer mask and processing steps to fabricate. It should be noted that the 1 Mb size of memory modules 3200 and 3300 is merely exemplary.

Regardless of whether folded or unfolded tiles or some other type of all-metal module is employed to construct the 3D structures described herein, a variety of approaches may be employed to control and/or reduce the defect rates in such structures. As with most processes, the rate of such defects is expected to decrease as the process matures. In addition, block defect isolation logic may be built into tiles or modules using all-metal electronics such as, for example, transpinnor-based electronics. Finer segmentation of the basic tile or module could both reduce the probability of defects in individual modules as well as facilitate the location and isolation of defects without decreasing storage density or reducing access performance. The low cost of building redundancy into such structures may also be leveraged to mitigate the effect of defects.

A 1 Gb memory block will now be described with reference to FIGS. 34A–34D. FIG. 34A shows a top plan view of an all-metal 3D structure 3400 which includes 1023 1 Mb memory modules 3402 and vertical connection structure 3404. In the implementation shown, folded tiles are employed for memory modules 3402, e.g., module 3200 of FIG. 32. FIG. 34B shows a perspective view which shows a floor 3406 of memory cells and a separate floor 3408 of support electronics for the memory cells. Connection stratum 3410 provides intra-tile connectivity as well as connections to vertical connection structure 3404. The footprint of the structure is given by p(p+q), and the height is a. Exemplary values for p, q, and a are 2 mm, 0.1 $\mu$m and 0.2 $\mu$m, respectively.

Figure 34:
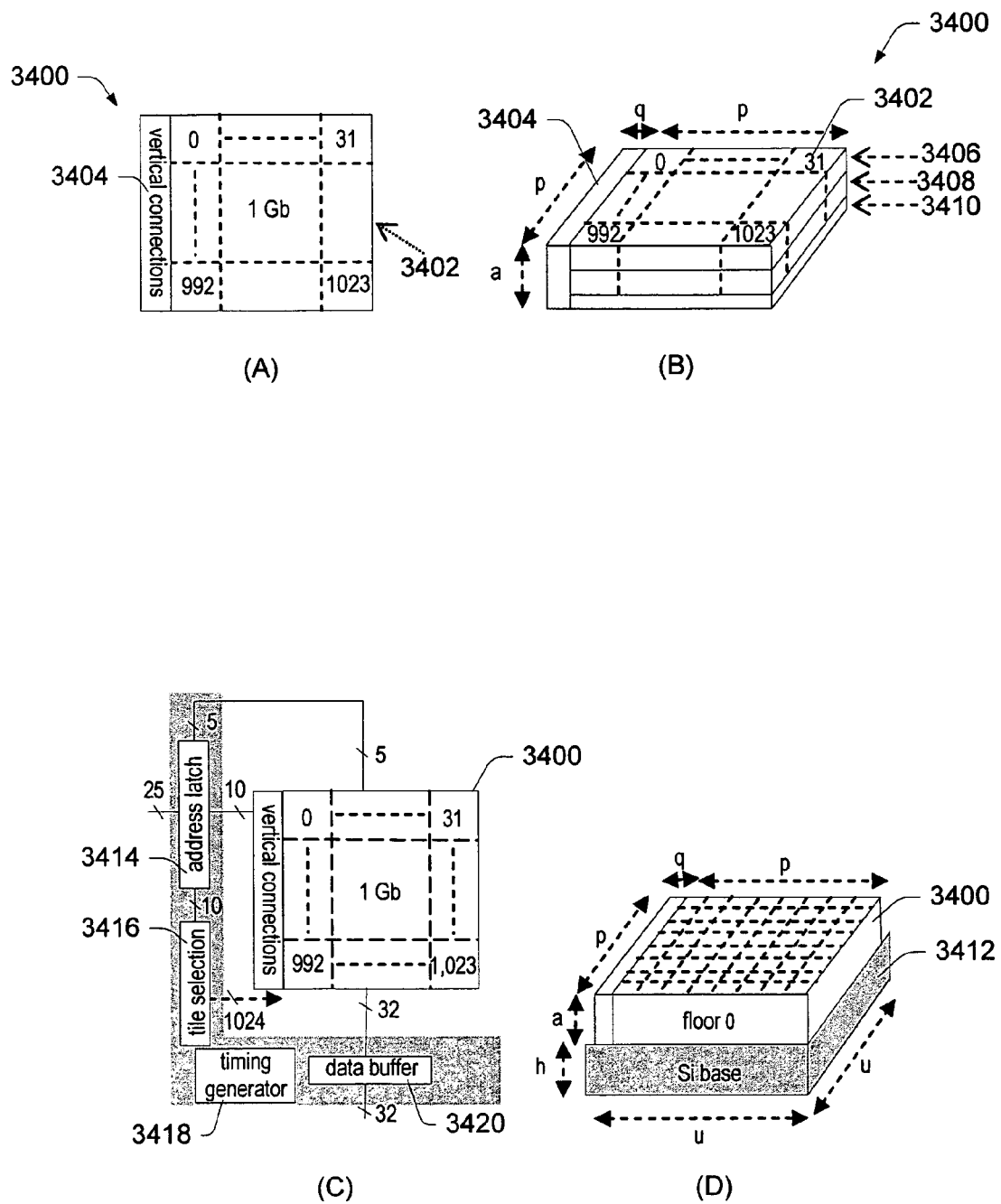

FIGS. 34C and 34D are, respectively, schematic and physical representations of 3D structure 3400 on a silicon base 3412 which includes circuitry for controlling access to the memory cells in 3D structure 3400 including, for example, address latch circuitry 3414, tile selection circuitry 3416, timing generator 3418, and data buffer 3420. The footprint of the base is $u^2$, and the height is h. Exemplary values for u and h are 2.5 mm and 100 $\mu$m, respectively. It should be noted that the semiconductor/magnetic-film hybrid structure of FIG. 34 is exemplary. An equivalent all-metal structure may be constructed.

Figure 35:
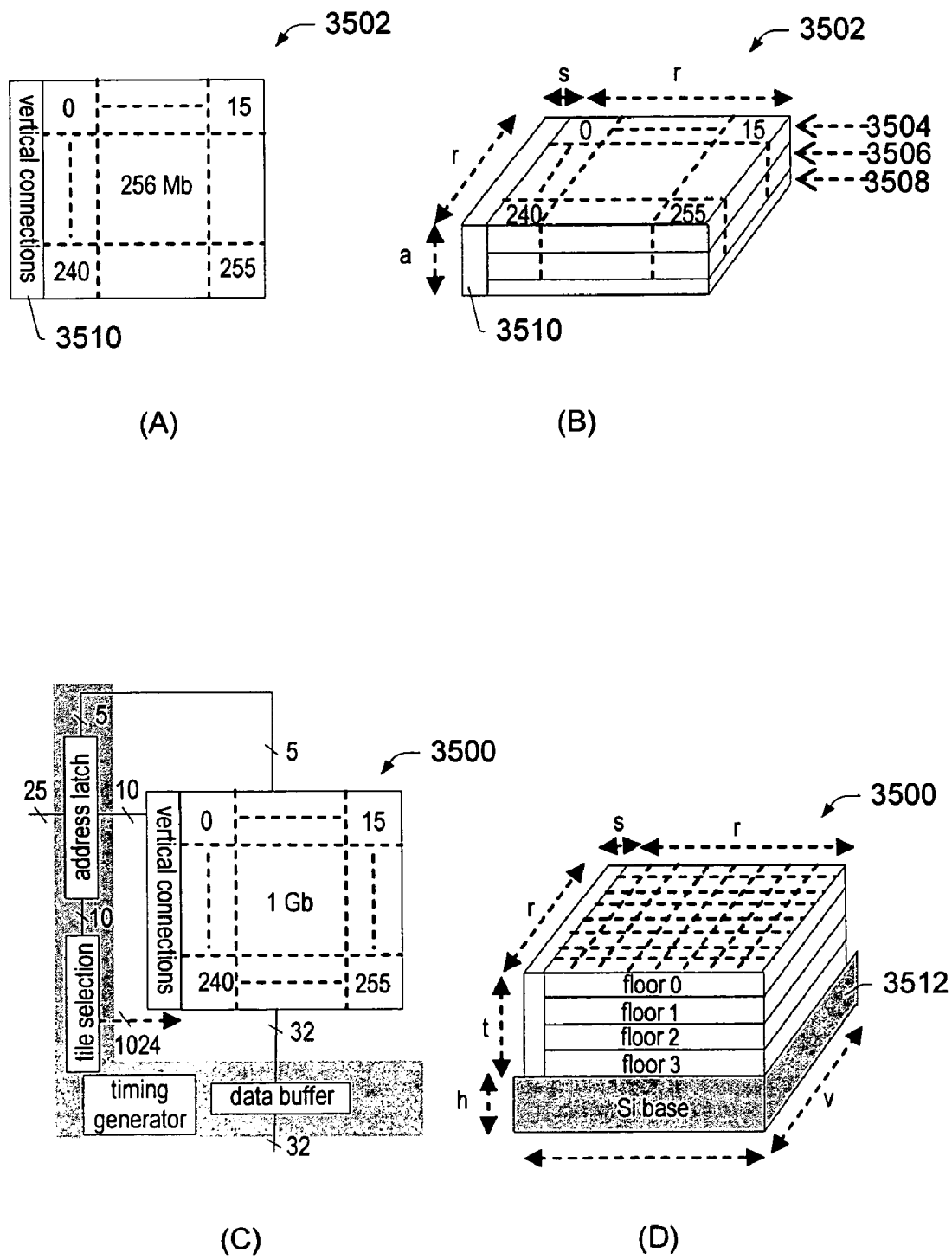
Figure 36:
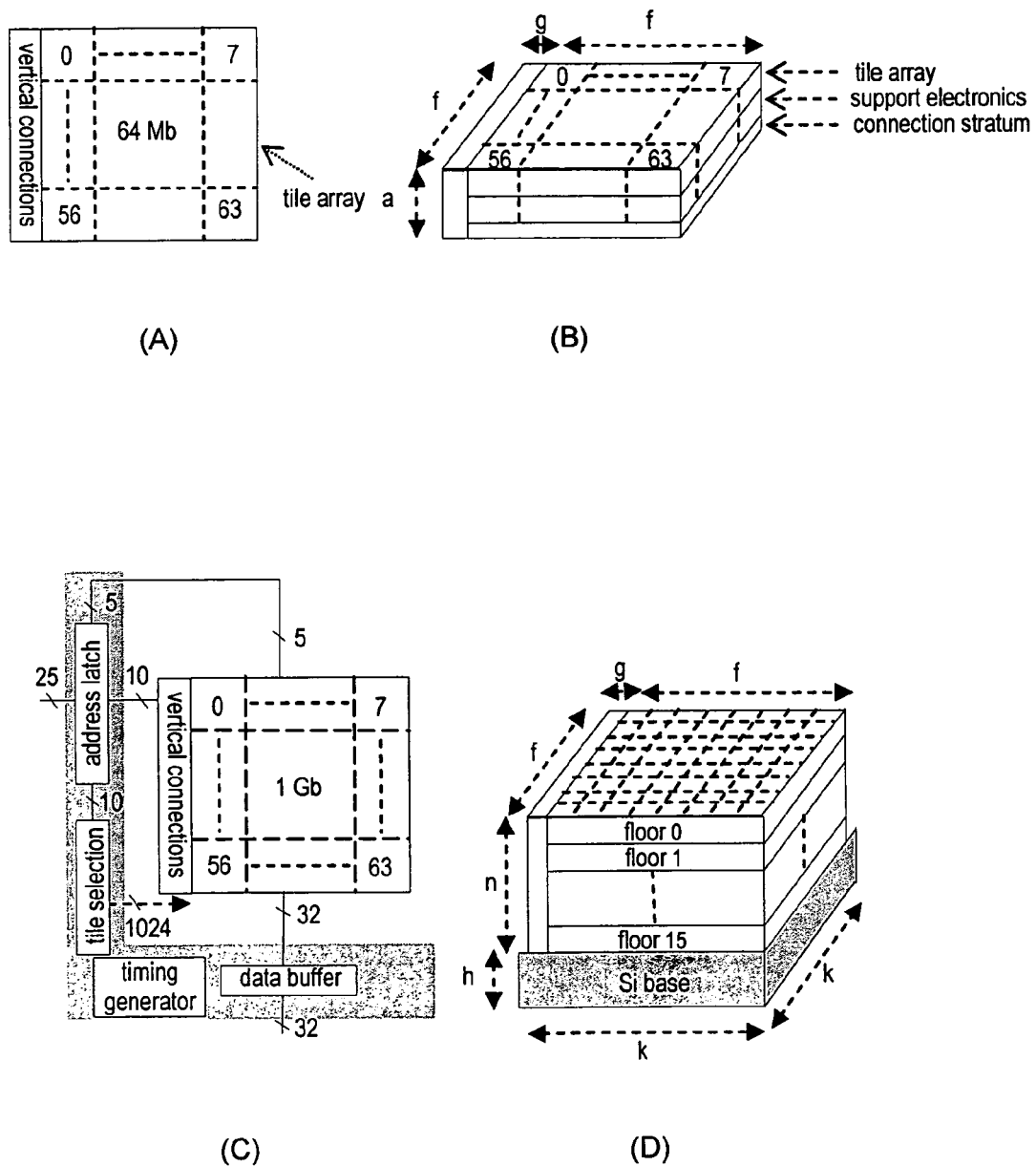

Each of FIGS. 35, 36, and 37 shows a 3D structure for a 1 Gb memory block. FIGS. 35A–35D show views of a multi-floor implementation on a semiconductor substrate. In this implementation, each floor 3502 of memory block 3500 comprises 256 1 Mb memory tiles (e.g., memory module 3200 of FIG. 32) arranged in memory cell level 3504, a support electronics level 3506, and a connection stratum 3508. Vertical connection structure 3510 provides inter-floor connectivity and connections to access control circuitry of semiconductor substrate 3512. The footprint of the memory block is given by r(r+s), and the height is t. Exemplary values for r, s, and t are 1 mm, 0.1 82 m and 0.8 $\mu$m, respectively. The footprint of the base is $v^2$, and the height is h. Exemplary values for v and h are 1.2 mm and 100 µm, respectively.

FIGS. 36A–36D show views of a multi-floor implementation having 16 floors, each having 64 1 Mb memory tiles. The footprint of the memory block is given by f(f+g), and the height is n. Exemplary values for f, g, and n are 2 mm, 0.1 µm and 3.2 µm, respectively. The footprint of the base is $k^2$, and the height is h. Exemplary values for k and h are 2.5 mm and 100 µm, respectively.

FIGS. 37A–37D show views of a multi-floor implementation having 64 floors, each having 16 1 Mb memory tiles. The footprint of the memory block is given by d(d+e), and the height is m. Exemplary values for d, e, and m are 1 mm, 0.1 µm and 12 µm, respectively. The footprint of the base is $i^2$, and the height is h. Exemplary values for i and h are 1.2 mm and 100 µm, respectively. As will be understood, the numbers of floors, tiles per floor, types of tiles (e.g., folded vs. unfolded), dimensions of floors and tiles, etc., in FIGS. 34–37 are merely exemplary and should not be considered to limit the scope of the invention.

It should be noted that the semiconductor-magnetic-film hybrid structures of FIGS. 35, 36, and 37 are merely exemplary. Equivalent magnetic-film structures can be constructed.

Figure 39:
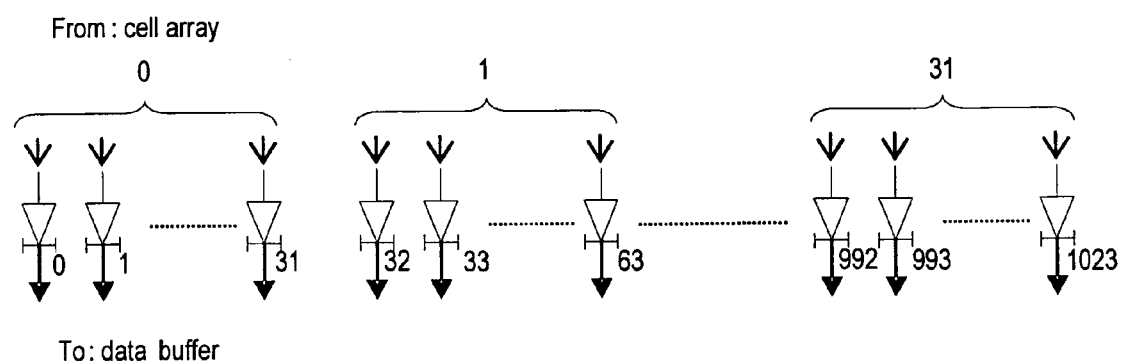

FIGS. 38A, 38B, and 39 illustrate some exemplary support electronics which may be employed to facilitate access to the memory arrays described above. For example, any of the implementations of FIGS. 32–37 may employ such support electronics. FIGS. 38A and 38B illustrate word select and digit select driver circuits, respectively, for selection of memory locations for read and write operations. FIG. 39 illustrates sense amplifiers for receiving data from all-metal memory cells and delivering them to the data buffer. According to a specific implementation, the circuits of FIGS. 38 and 39 are implemented using all-metal transpinnor-based electronics as described herein. According to other implementations, some other form of all-metal technology may be used.

Various of the structures described herein have significant advantages relating to power consumption. For example, in a modular structure constructed from stacked memory modules or tiles which, in turn, comprise all-metal GMR-based memory cell arrays and transpinnor-based support electronics, the memory cells and electronic components are inherently passive devices, i.e., no powered substrate is required. Therefore, power may be applied selectively, i.e., only to the addressed group of cells and ancillary circuitry. That is, for a typically memory access, power is only applied to a single tile at a time, and only to a small subset of that tile's circuitry. As a result, power consumption remains constant, even as the 3D structure scales to higher capacities. In addition, the non-volatile nature of such memory cells eliminates the high power consumption associated with standby and refresh. Moreover, because such structures can be constructed without the use of semiconductors, the leakage currents associated with semiconductors can be eliminated.

It is generally understood that all possible electronic circuits, analog and digital, can be implemented using active components, e.g., transistors, in combination with four basic passive components, i.e., resistors, capacitors, inductors and transformers. It is also well known that neither inductors nor transformers are available in semiconductor bipolar technology. By contrast, GMR transpinnors can be employed to provide both of these components. In fact, transpinnors are well suited to provide the basis of a variety of analog, digital and mixed general-purpose all-metal circuits, subsystems and systems. Since capacitance and resistance can be implemented with the same metal technology as that used for the passive transformer and the transpinnor, all these components can be combined very effectively on the same substrate to produce a comprehensive variety of all-metal circuits. Unlike semiconductor chips, whose performance suffers below a critical size, the characteristics of GMR devices improve as the dimensions are decreased.

Biased in the appropriate operating region, GMR transpinnors can be used as basic building blocks of logic gates, thereby providing the foundation for GMR-based digital electronics. While logic elements can be made with combinations of transpinnors, just as with transistors, there is another alternative. Various logic operations can be implemented with a single transpinnor. These transpinnors have more than one input line. Examples of such transpinnors are shown in FIGS. 40 and 41.

Figure 40:
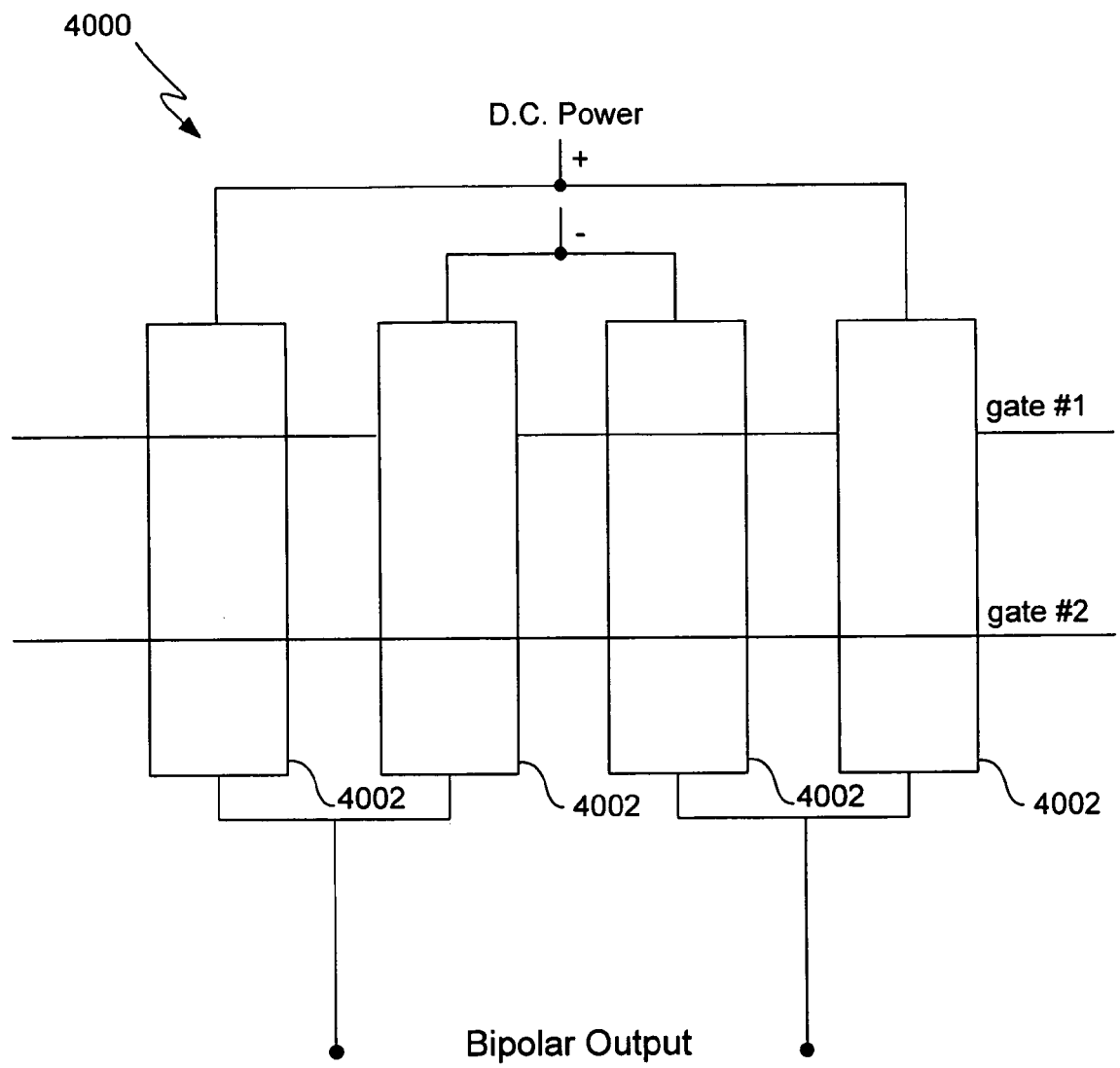
FIG. 40 shows a multiple-input transpinnor configuration.

FIG. 40 shows one such all-metal GMR transpinnor 4000 and two drive lines. Four GMR films 4002 are tied together in a folded Wheatstone bridge configuration. Each GMR film 4002 is shown as a rectangular strip with its easy axis oriented in the long direction. Flux closure is also along the easy axis, but is not shown. The two drive lines (gates #1 and #2) are deposited conductor strips. The application of current on gate #2 tends to magnetize all four GMR films in the same direction. The application of current on gate #1 tends to magnetize adjacent GMR films oppositely. With the proper pulse combinations one can use half-select pulses to magnetize the high-coercivity layers positively or negatively in one direction, or to magnetize alternate strips in alternate directions.

As mentioned above, when a transpinnor is balanced, its output is zero. An input current which exceeds the threshold for switching a lower-coercivity layer in one or more of the GMR films can change the film resistance, thus unbalancing the transpinnor, resulting in an output signal. Particular types of logic gates can be realized from the basic transpinnor by specific configurations of input lines and by suitable choices of input current values. Additional characteristics affecting the operation of transpinnor logic gates include the choice of resistors through which a given input current passes, the current polarities in selected resistors, and the direction of the magnetic field produced by the input current relative to the magnetization of the lower-coercivity layers in the transpinnor.

Two procedures are useful in implementing logic gates with a single transpinnor. One involves setting the transpinnor threshold which is determined by the coercivity of the low-coercivity layers in the GMR film. Various ways of establishing the coercivity of a thin film are known in the art. Thus, the threshold is set by choosing or adjusting the coercivity of at least one of the low-coercivity layers in the GMR films of the transpinnor. The other procedure involves switching the polarity of the GMR films which is determined by the magnetization orientation of all the film layers. The polarity of the transpinnor is thus switched by reversing the direction of magnetization of all layers of all GMR films in the transpinnor.

As described earlier, the balancing of transpinnor GMR elements for a given application may be accomplished using a technique known as magnetoresistive trimming in which the magnetization of selected GMR elements are manipulated to achieve the desired balance. Magnetoresistive trimming techniques are described in U.S. Pat. No. 6,469,927 incorporated herein by reference above.

Logic operations which can be implemented with a single transpinnor include, but are not limited to, the following:

AND gate: A transpinnor will not switch unless the sum of fields from the input lines exceeds the switching threshold. An AND gate is defined as one that yields no output unless all of its inputs are logical "1"s. If the transpinnor has n input lines, and the amplitude of each input pulse is $(1/n)^{th}$ of the threshold, then the transpinnor is an AND gate.

NAND gate: This is the inverse of the AND gate and gives an output if and only if all inputs are zero. A transpinnor NAND gate is made similarly as the AND gate, by reversing the magnetization of all elements so that the gate will just switch if all n inputs are logical "0"s and not switch if one or more are a logical "1".

OR gate: The definition of an OR gate is one that gives an output if one or both inputs are a "1". This can be made by setting the threshold of a transpinnor such that a single input is sufficient to switch the film.

A practical problem is presented by the fact that different switching thresholds are required for different single transpinnor logic gates. There are, however, a variety of ways in which these thresholds may be adjusted for different types of gates on the same substrate. These include manipulation of the order of deposition because the order strongly influences the coercivity of both the low and high coercivity films. This method involves additional deposition steps. Another method of adjusting the switching threshold for a particular transpinnor is derived from the fact that the magnetic field from a current carrying stripline depends on the width of the strip line.

NOR gate: The definition of a NOR gate is one that gives an output if one or both inputs are a "0". This is merely the inverse of an OR. This can be done by reversing the polarity of the GMR films as in the above case of a NAND.

NOT gate: A NOT gate is an inverter that changes the polarity of an input pulse from positive to negative and vice versa. This is easily done with a transpinnor by reversing the polarity of the input winding, or by interchanging the power terminals.

Exclusive OR (XOR) gate: This is a gate that gives an output if one and only one of the inputs is a "1". This can be done with a transpinnor such that one input is sufficient to switch the low-coercivity element, yielding an output, while two or more pulse inputs yield a field large enough to switch the high-coercivity element as well, yielding zero output. The gate must be reset after each use.

A circuit diagram of a transpinnor-based XOR gate 4100 is shown in FIG. 41. As shown, input current 1 goes through resistors R1 and R3 and input current 2 goes through resistors R2 and R4. If the currents in both inputs are less than the switching threshold, the output is zero. If the current in one and only one of the two input currents is above this threshold, then the resistance of either pair of resistors changes, the transpinnor becomes unbalanced, and an output signal is generated. If both input currents are above the switching threshold, all four resistors change equally (if properly trimmed), the transpinnor remains balanced, and the output signal is zero.

A circuit diagrams for other transpinnor configurations are shown in FIGS. 42*a* and 42*b* which may be used to implement AND and OR gates. Unlike XOR gate 4100 in which one input goes through GMR elements R1 and R3 where the other goes through R2 and R4, both inputs for AND gate 4200 and OR gate 4250 go through all four elements. Referring now to FIG. 42*a*, AND gate 4200 is configured to function as an AND gate by selecting the current polarities such that the current from input 1 runs opposite to the current in input 2 through R2 and R4, and in the same direction through R1 and R3. If the currents in both inputs are less than half the switching currents, all four GMR elements remain unchanged, the transpinnor remains balanced, and the output of gate 4200 is zero.

If the current in one, and only one, input is above the switching threshold, all four GMR elements change equally, the transpinnor remains balanced, and the output of gate 4200 is zero. If, on the other hand, the currents in both inputs are above the switching threshold (and thus the net current through R2 and R4 is below the switching threshold), the transpinnor becomes unbalanced and gate 4200 produces an output signal.

Referring now to FIG. 42*b*, operation of gate 4250 as an OR gate is achieved because the input lines generate magnetic fields in GMR elements R1 and R3 opposing the directions of the magnetization vectors in the lower-coercivity layers of these elements, and magnetic fields in R2 and R4 in the same directions as the magnetization vectors in the lower-coercivity layers of these elements. With such a configuration, a sufficiently large current through R1 and R3 will change their resistances but not the resistances of R2 and R4, unbalancing the transpinnor and thereby producing an output.

If currents in both inputs are less than half the switching current, all four GMR elements remain unchanged, the transpinnor remains balanced, and the output of OR gate 4250 is zero. However, if the current in either or both of the inputs are above the switching current, the resistances of elements R1 and R3 change while those of R2 and R4 remain the same, the transpinnor becomes unbalanced, and OR gate 4250 generates an output signal. It will be understood that the net current through R2 and R4 should not be sufficient to produce a magnetic field which could switch the lower-coercivity layers of these elements.

For digital applications, transpinnors with sharp thresholds and square-pulse outputs are desirable. For analog applications, a linear response is better. Transpinnors operating in the linear region can be used to develop a full complement of basic analog circuits, sufficient to create general-purpose analog circuitry based on GMR films.

A specific example of a transpinnor operating in the linear region for application to signal amplification illustrates some of the unique advantages of the dual functionality of the transpinnor over silicon technology. Differential amplifiers are typically used to eliminate common-mode signal and common-mode noise within the frequency range of their operation. As discussed above, the range of operation of the transpinnor in its transformer function extends from (and including) dc to the high-frequency cutoff limit. The GMR transpinnor can advantageously be utilized in its transformer function to remove common-mode signal in the differential-input mode, as well as in its transistor function to amplify a low signal in the single-ended output mode. In low-signal amplification, GMR transpinnors have the additional advantage of eliminating the problem of offset voltage at the input that is so troublesome in silicon integrated circuits. It should be noted that a high premium is paid in silicon technology to achieve low-offset input voltage for integrated differential amplifiers. That is, low-offset input voltage is achieved in silicon circuits only at the expense of degrading other parameters. No such price is associated with the use of transpinnors because of their dual transformer/transistor properties. Specifically, the input signal is applied to a differential input having the properties of a transformer primary with an additional advantage of flat low-frequency response inclusive to dc. The output signal is amplified by an output having transistor properties. Transpinnors are thus especially well suited as differential amplifiers.

Figure 43:
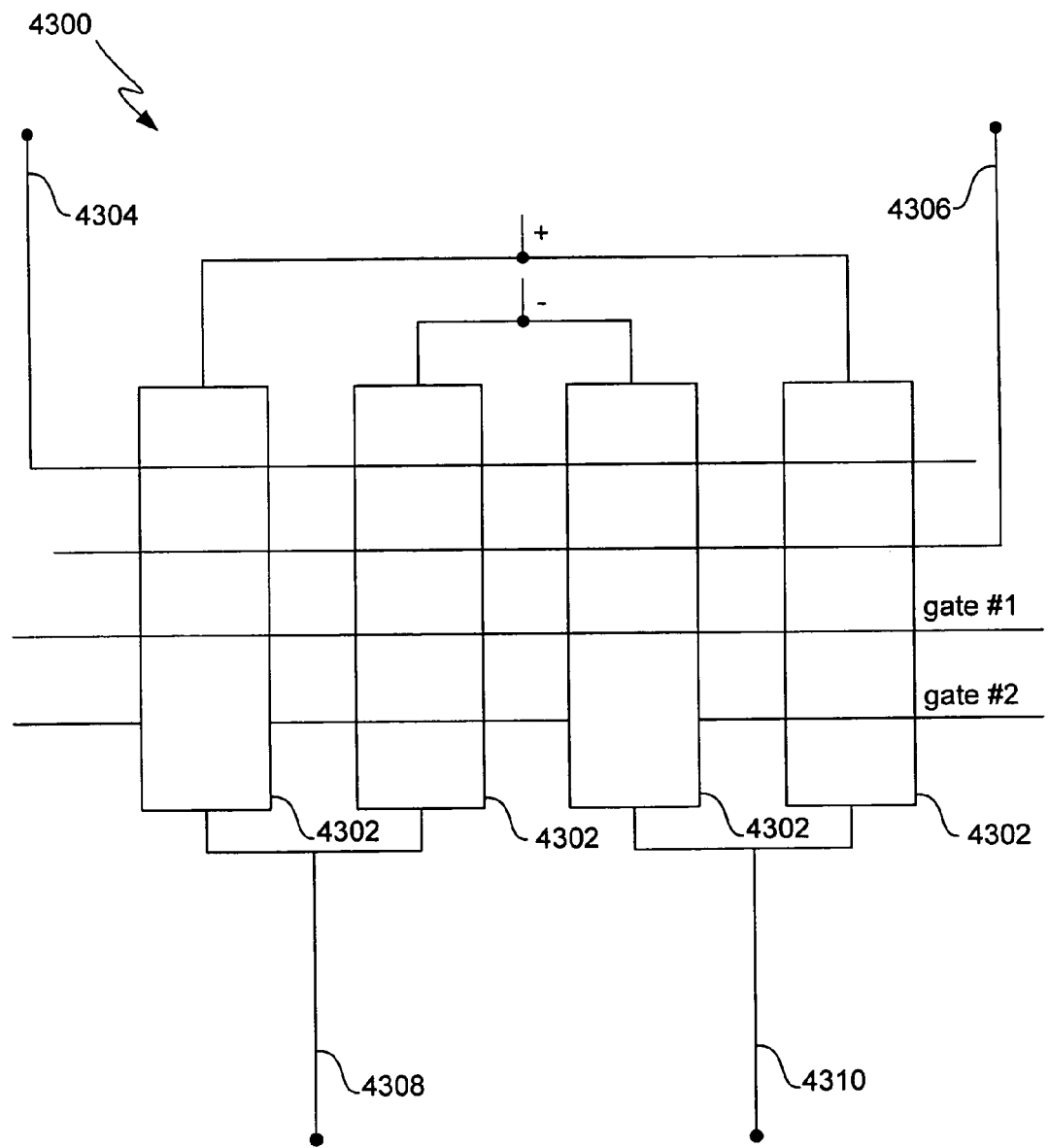
FIG. 43 shows a transpinnor configured as a gated GMR differential amplifier.

FIG. 43 shows a gated GMR differential amplifier 4300. Once again, four GMR films 4302 are arranged in a Wheatstone bridge configuration. Two input lines 4304 and 4306 supply a switching field to the permalloy layers in GMR films 4302. If the signals on lines 4304 and 4306 are identical, no switching takes place and the output (between nodes 4308 and 4310) is zero. Any common mode noise is thus rejected. All four lines (gate lines #1 and #2 and input lines 4304 and 4306) are electrically isolated, i.e., there is no electrical connection between them or to GMR films 4302 in gated differential amplifier 4300.

Many transpinnor-based devices require one transpinnor to switch another transpinnor. Examples include a transpinnor shift register, a transpinnor selection matrix, and a transpinnor multistage amplifier. When a transpinnor is used to switch another transpinnor, the output current of the switching transpinnor becomes the input current of the transpinnor to be switched. A single transpinnor can readily switch multiple transpinnors as shown by the following numerical examples of the performance characteristics of several transpinnor-based devices:

1) shift register: In a transpinnor shift register, one transpinnor switches an identical transpinnor which, in turn, switches another identical transpinnor, an so on. An amplification factor of 1 is required. For w=L=5 microns, $H_c=1$ Oe, gmr=0.06, and $R_{sq}=6$ ohms per square, a power supply voltage of 0.168 is required (see equation (20b)).

2) amplifier: For a power supply voltage of 3 volts on a chip, with the other parameters the same as for example 1 above, the amplification factor is 18.

3) branching logic: For the same parameters as in example 2, one transpinnor can switch a total of 18 other transpinnors.

4) smaller transpinnors: If, from the examples above, w and L were both reduced by a factor of 5 to 1 micron, the required voltage for an amplification factor of 1 would also be reduced by a factor of 5 to 33.6 mV. Thus, for a 3 volt supply, an amplification factor of 90 can be achieved.

5) different aspect ratios: For L=5 microns (as in example 1) and w=1 micron, the required voltage for an amplification factor of 1 is reduced to 6.7 mV.

6) single-transpinnor comparator design: a comparator is a high gain differential amplifier, easily saturated, e.g., FIG. 11; For L=10 microns, w=1 micron, V=0.2 volt, Hc=1 Oe, gmr=0.06, and Rsq=6 ohms/sq for the GMR films, the amplification factor is 63 according to equation (20b), and the output current of the comparator is 0.1 mA according to equation (19). For decoder logic with w=0.5 micron, the magnetic field applied to the decoder logic is 1.26 Oe according to equation (17), large enough to drive the decoder logic.

7) comparator power dissipation: For the same parameters as in example 6, the resistance of each GMR element of the transpinnor is 60 ohms. This is the effective resistance between the power supply and ground of the transpinnor. For a supply voltage of 0.2 volt, the power dissipation of the comparator is $\{(0.2 \text{ volts})^2/60 \text{ ohms}\}=0.67$ mW.

Figure 44A:
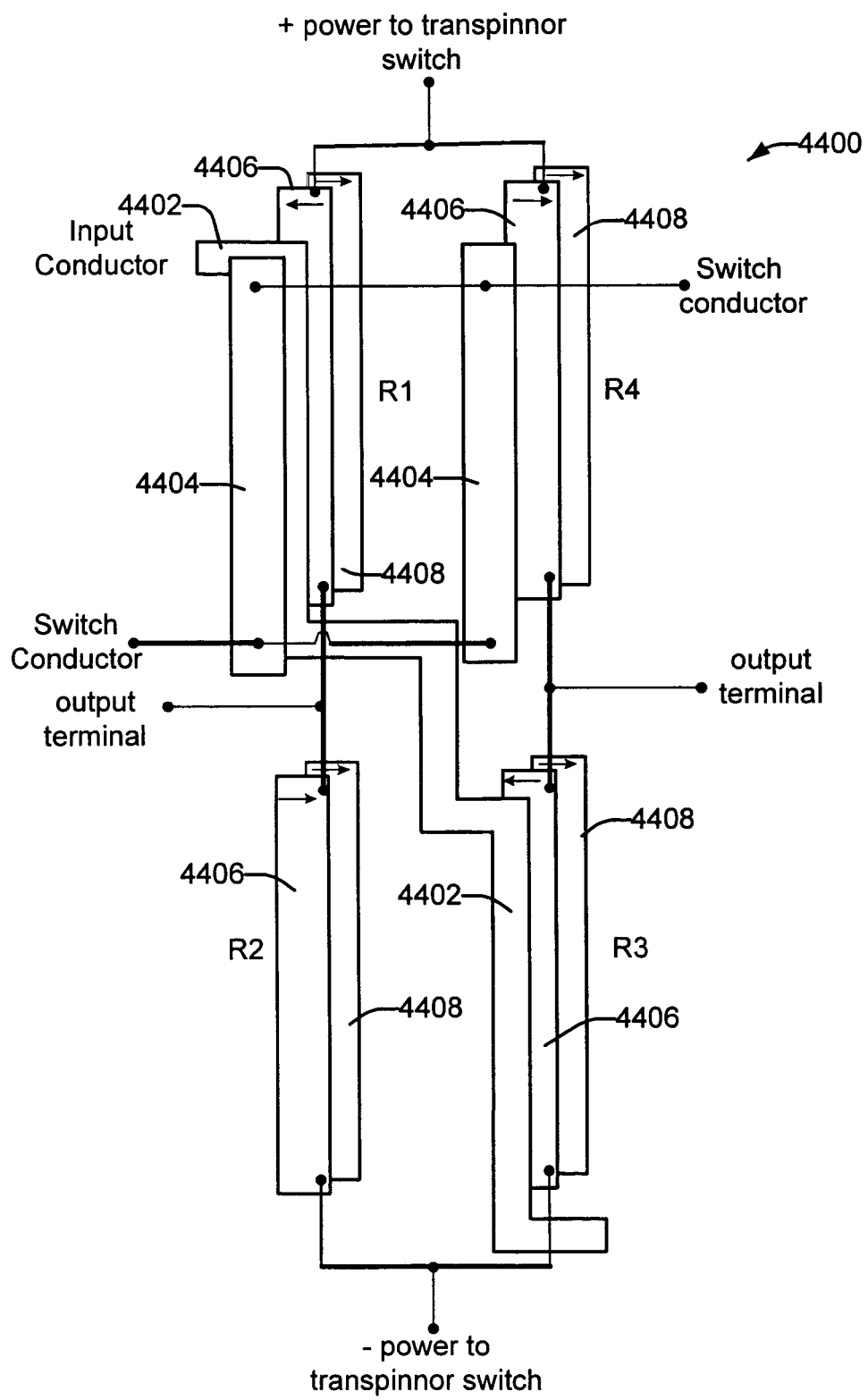
FIGS. 44a and 44b show a transpinnor configured as a switch according to one implementation.
Figure 44B:
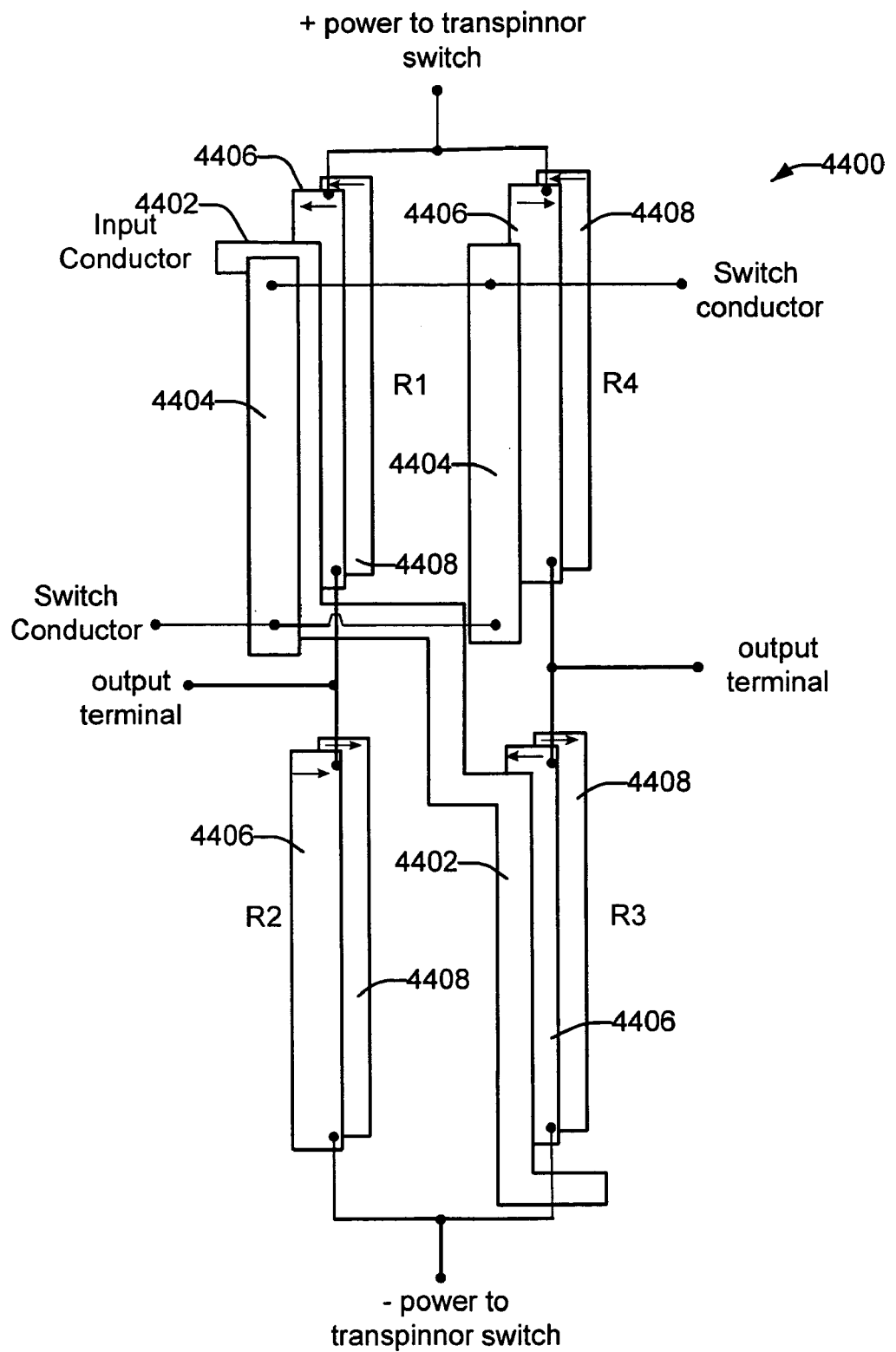

Transpinnors may also be configured to operate as switches that are nonvolatile like EEPROMs yet are characterized by the programming speed associated with SRAMs. FIGS. 44a and 44b show exploded views of a transpinnor switch 4400 configured in this manner. The nonmagnetic conductor layer in each GMR film separating the high coercivity layer 4408 (e.g., cobalt) and the low coercivity layer 4406 (e.g., permalloy) is not shown. The basic operation of switch 4400 involves the selective application of a large enough switching current on switch conductor 4404 to set the directions of the magnetization vectors of both the higher and lower-coercivity layers of GMR elements R1 and R4, while the magnitude of the input current on input conductor 4402 is only large enough to switch the lower-coercivity layers of R1 and R3.

As described above and generally speaking, transpinnor technology operates by impressing a specific magnetization direction on a lower-coercivity layer (e.g., permalloy). In digital applications, two opposing magnetizations of this layer correspond to two logic levels. By contrast, the higher-coercivity layer (e.g., cobalt) in such applications remains pinned to a particular magnetization.

Reconfigurability of a programmable device may be achieved through a transpinnor switch which includes two nonmagnetic, conductor layers magnetically (i.e., not electrically or resistively) coupled to various ones of the GMR films of which the transpinnor is composed, e.g., FIG. 44. In general and as discussed above, the current in the input conductor of the transpinnor switch is large enough to set (reverse) the magnetization of the lower-coercivity layers of the GMR films to which the input conductor is coupled but not that of the higher-coercivity layers. By contrast, the current in the switch conductor can be large enough to set (reverse) the magnetization of both layers in the GMR films to which the switch conductor is coupled.

In some digital applications the transpinnor switch current may be used to control the magnetization of the higher-coercivity layers in selected GMR films of the transpinnor in such a way that the output is either a logic signal following the input, or zero irrespective of the input. It should be noted that there are various ways of configuring the transpinnor switch to realize this functionality. That is, non-magnetic conductors may be magnetically coupled to various subsets of the GMR films to achieve this functionality.

According to the implementation shown in FIGS. 44a and 44b, each of the input conductor 4402 and the switch conductor 4404 are magnetically coupled to two of the GMR films of the transpinnor 4400. That is, input conductor 4402 is coupled to GMR films R1 and R3, and switch conductor 4404 is coupled to R1 and R4. The nonmagnetic conductor layer between the cobalt and permalloy in each GMR film is not shown for simplicity.

Transpinnor switch 4400 is initialized with all magnetizations in all four films parallel to one another (not shown). In this initialized state the resistances in all four films are low and the transpinnor is balanced, so there is no output when a power voltage is applied. A current is then applied via input conductor 4402 to reverse the magnetization in the low coercivity layers 4406 in films R1 and R3, resulting in a magnetization which is antiparallel to that of high coercivity layers 4408 as shown in FIG. 44a. This increases the resistance of films R1 and R3, unbalances the bridge, and produces a current in the output terminals when power is applied. Thus, in this configuration switch 4400 is "on," i.e., an asserted logic signal on input conductor 4402 produces a corresponding logic signal on the output.

To turn switch 4400 "off," a switch current is applied via switch conductor 4404 to set the magnetizations in the high and low coercivity layers of R1 and R4 in a direction opposite the previous magnetization state of the high coercivity layers. Then, a small current is applied via switch conductor 4404 to reverse the low coercivity (but not the high coercivity) magnetizations in R1 and R4. Finally, a current with the same polarity as that used to orient the low coercivity layers in R1 and R3 in FIG. 44a is applied via input conductor 4402. The result is that R1 and R2 are low, R3 and R4 are high, as shown in FIG. 44*b*, and the transpinnor switch is balanced. Now, when an input current of the same polarity as prior to the reversal of the high coercivity layers is applied, the bridge remains balanced and no output is generated, i.e., the switch is "off," irrespective of the asserted input logic level.

In some applications, several transpinnor switches may be connected in series to route a single input signal to a variety of circuits within a system. For example, a two-switch device may be configured with one switch "on" and the other "off" such that one of two circuits in a programmable system is enabled while another is disabled. As described above, the low coercivity layers in the "off" switch do not function, i.e., the output current is zero irrespective of which of the two logic levels is asserted at the input, while those in the "on" switch do, i.e., the output signal corresponds to the input signal. However, when the high coercivity layers of the appropriate films in both switches are magnetized in the other direction, the roles of the low coercivity layers in the two switches are reversed. Reconfiguration is thus achieved by simultaneously turning the "on" switch "off" and vice versa.

It should be noted that, the transition between balanced and unbalanced transpinnor configurations—and hence between output and no output—can be realized by reversing the polarity of the input signal to set the magnetization of the soft layer alone. However, this would obviate the use of a signal of given polarity to operate the logic circuitry in a given configuration.

According to various implementations, there are a variety of ways in which transpinnor switch 4400 may be reconfigured. For example, we have just discussed shutting off the switch by reversing the magnetization of the high coercivity layers in R1 and R4. This shuts off the switch regardless of the input to the low coercivity layers of the films with which the input conductor is associated. It should be understood that one could just as well reverse the high coercivity layers in R2 and R3 to achieve the same effect.

If one instead reverses the high coercivity layers in R1 and R3, this merely reverses the polarity of the output, i.e., the switch conducts with full output for one input polarity. The same is true for switching the high coercivity layers of R2 and R4.

If one reverses the high coercivity layer in only one of the films, the result is a switch with half the output. Reversing the magnetization of the low coercivity layers with an input current does not shut the switch off. Reversing the high coercivity layers in three of the GMR elements (e.g., R1, R2, and R3) also reduces the output by half.

In summary, the two schemes that turn switch 4400 off for both input polarities are either to reverse the magnetization of the high coercivity layers in R1 and R4 or to reverse the magnetization of the high coercivity layers in R2 and R3.

Figure 45A:
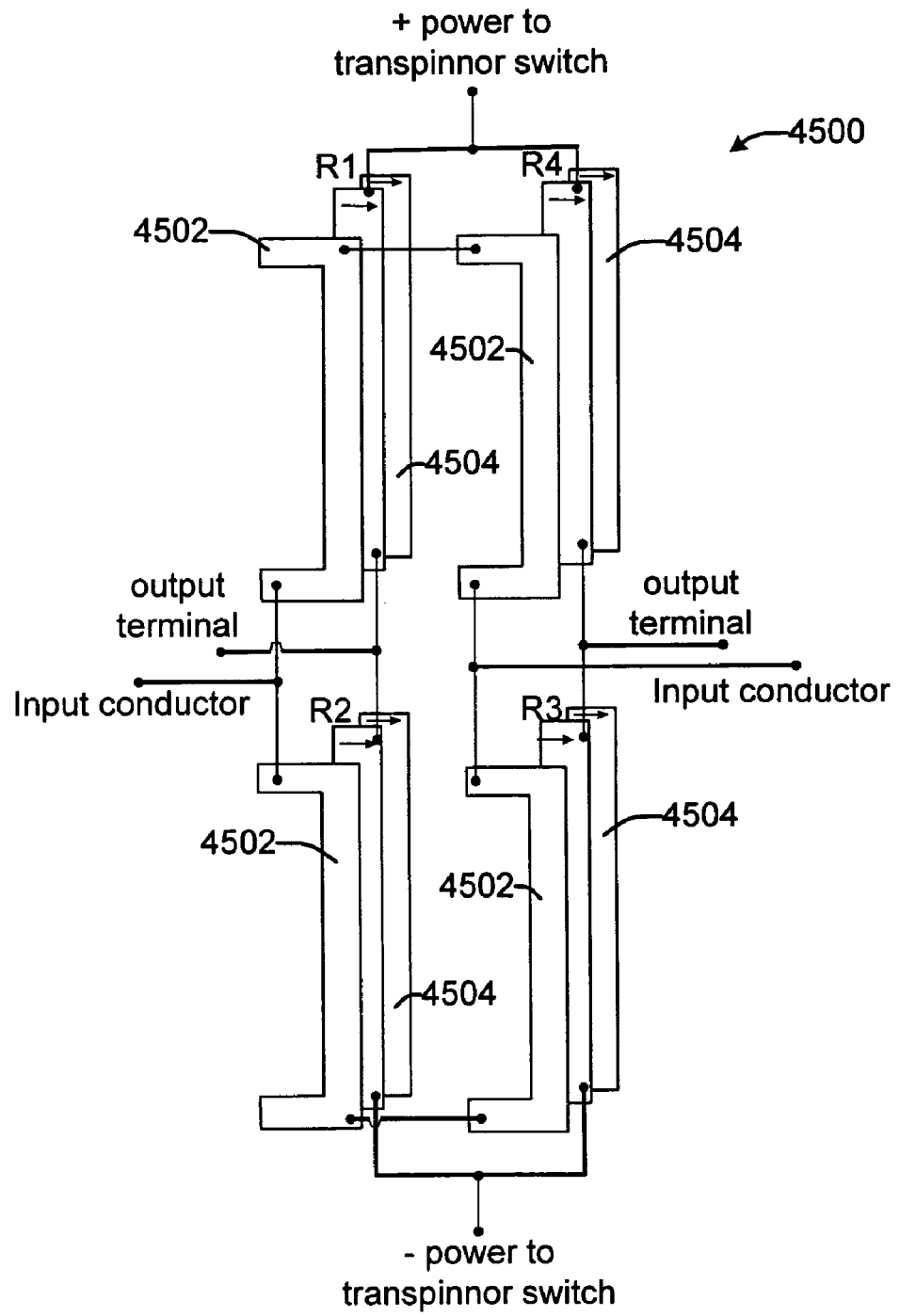
FIGS. 45a and 45b show another transpinnor configured as a switch according to another implementation.

Transpinnor switch 4400 has an input conductor 4402 coupled to only two thin-film elements, i.e., R1 and R3. Other transpinnor switches may have an input conductor over all four thin-film elements in the bridge. Such a switch 4500 is shown in FIG. 45*a*. Input conductor 4502 is coupled to R1–R4 and switch 4500 can be configured to pass input currents of both polarities. Transpinnor switch 4500 can be switched off by reversing the magnetization in high-coercivity layer 4504 of either R1 and R4, or R2 and R3. It should be noted that the switch conductor by which this reversing is accomplished is not shown in FIG. 45*a* for the sake of simplicity and because of the fact that it can be coupled to either combination of R1 and R4 or R2 and R3.

Figure 45B:
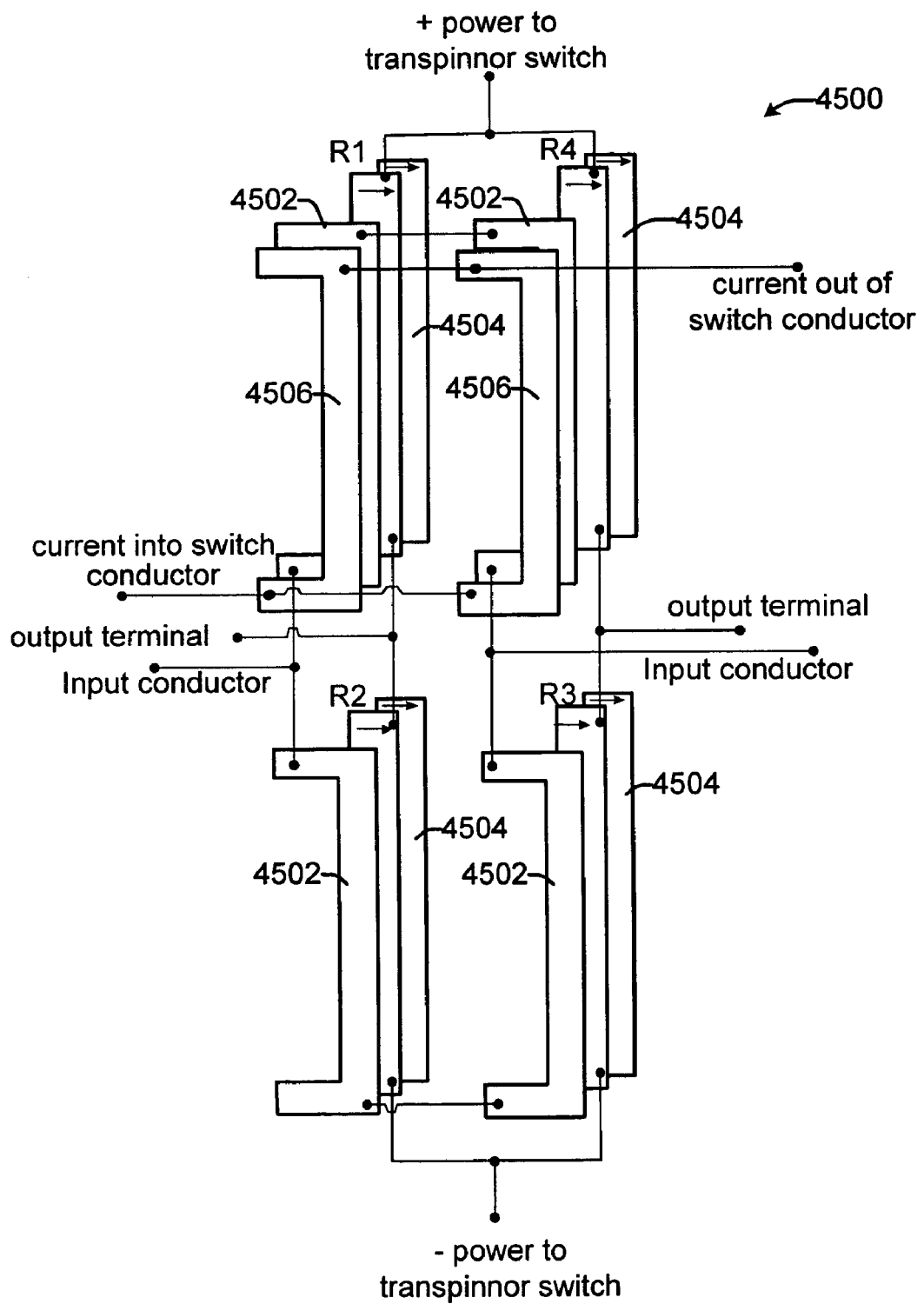

Transpinnor switch 4500 is shown in FIG. 45*b* with switch conductor 4506 magnetically coupled to R1 and R4. This configuration passes both polarities of input current if the high-coercivity layers 4504 of all four thin-film elements are magnetized in the same direction, and blocks all polarities of input current when the magnetization of high-coercivity layers 4504 is reversed in R1 and R4. A similar implementation (not shown) has the switch conductor associated with R2 and R3.

It should be noted that transpinnor switches may be used for either digital or analog applications. According to an application in which a transpinnor switch is employed to transmit analog signals, the switching field generated by the switching current is perpendicular to the easy-axis of the GMR elements rather than parallel. When the switch is enabled, the switching bias field is raised above the anisotropy field of the lower-coercivity layer. This causes the transpinnor to operate like a linear, nearly lossless transformer. When the bias field is turned off, there is no output unless the signal is large enough to exceed the coercivity of the lower-coercivity layer. In this way, analog signals may also be routed point-to-point.

According to other applications, a transpinnor switch may be configured to generate at its output an amplified version of the input. That is, using the techniques described above, transpinnor switches may be configured to provide a wide range of amplification factors including negative amplification factors, i.e., a transpinnor switch may be configured as an inverter. This amplification capability can be important, for example, in applications in which it is desirable to cascade transpinnor switches.

The foregoing examples illustrate that transpinnors and SpinRAM may be configured to perform the analog and digital functions required to implement any of a wide variety of electronic circuits and systems. For example, all-metal microprocessors may be implemented which, when combined with the all-metal memory systems described above, can provide the basis for an all-metal computer system. In addition, the all-metal circuitry described above may be employed to implement the electronics used to control operation of a display device associated with such a computer system.

Display technologies can be of several different types including, for example, transmissive, reflective and emissive. Any of these types can be viewed either directly or indirectly. The image generated by an indirect-view display (e.g., a projection display) needs an optics subsystem to enlarge, focus and project the image, for example, on a screen. The image in a projection display can be projected from the back of the screen (i.e., rear projection) or from the front of the screen (i.e., front projection).

Figure 46:
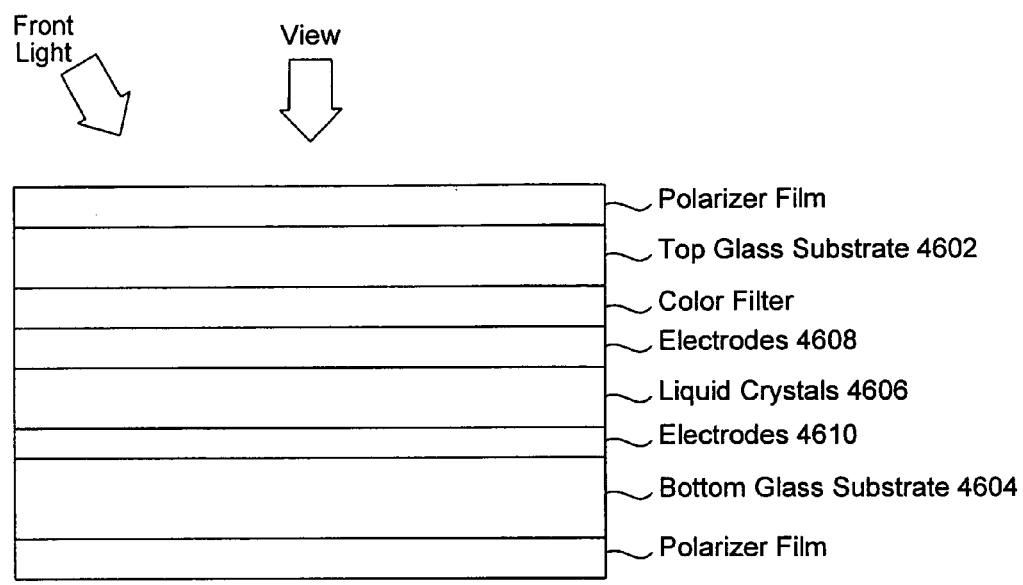
FIG. 46 is a cross-section of an exemplary LCD panel which may be used with specific embodiments of the invention.

In a transmissive type of display, the display light (called back light) is transmitted from the back to the front of the display panel. FIG. 46 shows a transmissive type of liquid crystal display (LCD). As used herein, the term "projection display" refers to either rear projection or front projection.

In a reflective type of display, the display light (called front light) is positioned on the viewing side of the panel, as shown in FIG. 46*a* which also shows an LCD display. In an emissive display, each basic frame element—pixel or subpixel—generates its own light. Emissive displays do not need a separate light source, i.e., a back light or a front light. Neither do they need a display-panel construction of the kind shown in FIG. 46. Examples of emissive types of displays include ones in which the frame element is a light emitting diode (LED), an organically-coated LED (OLED), a field emission display (FED) element, and a plasma element. LED pixels and subpixels are embedded on a physical support structure, i.e., a substratum, that does not play a role in the display mechanism corresponding to that played by the panel for LCD pixels.

As used herein, the term "substratum" or "substrata" refers to any physical support structure on which pixels and subpixels are embedded. The electronics of various embodiments of the invention may be applied to a variety of display technologies, including transmissive, reflective and emissive (e.g., LCDs and LEDs); to a variety of substratum types, including rigid, foldable and flexible; to a variety of substratum materials, including glass, silicon, silicon nitride, silicon oxide, and polyimide; and to both direct-view and projection displays.

The implementation of various portions of electronics used to control operation of a display device is described below in the context of a liquid-crystal display (LCD) device. It should be noted, however, that the LCD implementation described is merely exemplary and should not be used to limit the scope of the invention.

FIG. 46 shows a cross section of a typical liquid-crystal display (LCD). LCD 4600 is typically made of two glass panels (a front panel 4602 and a back panel 4604) which sandwich between them a liquid 4606 containing dissolved crystals composed of molecules with a permanent electric dipole moment. Dipole orientation, which is achieved by an externally imposed electric field, can be used to control (i.e., allow or block) the transmission of polarized light incident on the liquid.

The complete image (called a frame) is built from the collection of individual signals emanating from basic visible elements (e.g., pixels or subpixels) which are arranged across the display in some pattern, e.g., rows and columns. A moving image is created by a succession of frames changing at or above a given rate. In an LCD the light signal from each basic visible element is created by separately controlling the orientation of the associated dipoles to act like a shutter for transmitting the polarized light.

Liquid crystal molecules are typically cigar or disk shaped. As shown in FIG. 47*a*, liquid crystal molecules 4702 in the isotropic phase are completely disordered, i.e., randomly oriented and positioned. In the nematic phase (FIG. 47*b*), liquid crystal molecules 4704 are still randomly positioned, but most of their axes point more or less in a common direction referred to as the director. Some liquid crystals also exhibit a smectic phase (FIG. 47*c*) in which the molecules 4706 are aligned as in the nematic phase except that, while their position in the x-y plane is still random, they are stacked vertically in the z-direction in well-defined planes.

The operation of an LCD requires electronics for several functions. As described above, conventional LCD electronics are implemented with semiconductor components. To control the shutter operation of each individual element (pixel or subpixel) in a conventional LCD, transistors are physically placed beneath each such element. In general, the quality of a frame improves if the pixels are bigger and the inter-pixel gap is smaller. Aperture ratio is the metric that defines the ratio between the pixel pitch area and the actual pixel area. An aperture ratio closer to 1 signifies a higher quality display.

Color in an LCD is achieved by aggregating a plurality of subpixels into one pixel and by controlling the subpixels individually. Typically, three subpixels are aggregated, one for each fundamental color (R-red, G-green, B-blue). Alternative approaches involve more than three subpixels for each pixel, wherein two or more subpixels are used for the same color to enhance its intensity. An LCD that can actively control each subpixel, and therefore each pixel, separately is called an active matrix liquid crystal display (AMLCD).

Each pixel or subpixel has an associated memory block that contains the information needed to build a full color image. The number of bits per pixel varies from 1 bit/pixel for a basic black-and-white display, to 24 (i.e., 3×8) bits/pixel for a typical multiple-shades-of-gray display or for a typical full-color display. An SXGA (1,280×1,024=1.3 Megapixels) full-color display has 8 bits of frame memory per subpixel (i.e., 24 bits per pixel) which translates into approximately 32 Megabits of frame memory. Although the range of pixel sizes varies widely, typical pixel size is on the order of 0.1 mm$^2$. Finally, the display module has associated selection and driver electronics to address each pixel or subpixel individually.

In an AMLCD each pixel (or subpixel) is provided with its own switch to control the voltage that produces the electric field used to orient the dipoles associated with that pixel. The voltage applied to each pixel is thus controlled independently, resulting in higher contrast. In AMLCDs, the addressing circuitry is placed on the backside of the liquid crystal film. The front surface of the display is coated with a continuous electrode film 4608, while the back is patterned into individual pixels (electrode film 4610).

Figure 48:
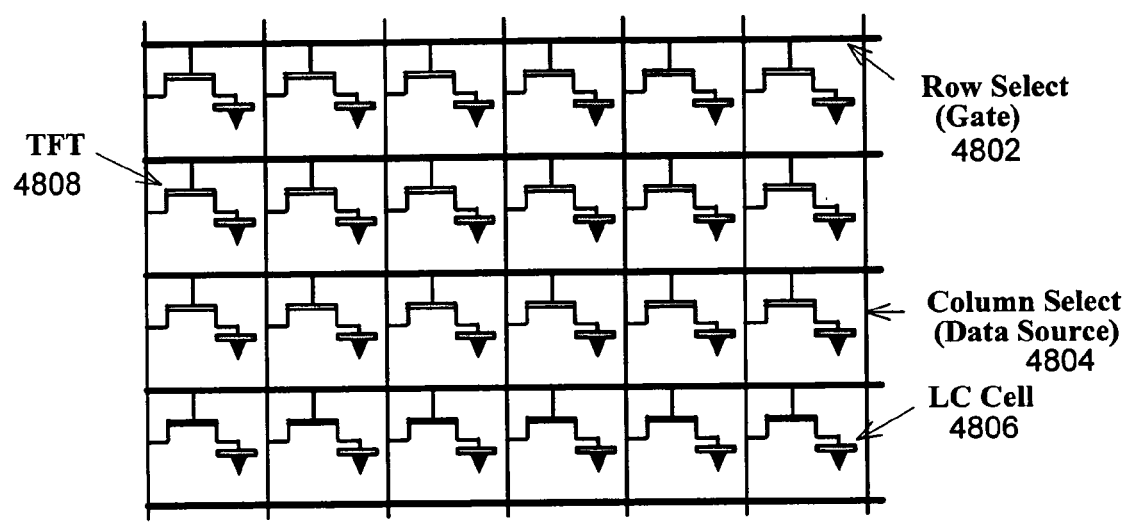
FIG. 48 is a schematic representation of a gate and source lines in a conventional LCD.

In conventional LCDs, a transistor is fabricated at the site of each pixel, acting as a switch to control the voltage—supplied by the system—to the pixel. The physical area of the transistor is thus effectively limited by that of the pixel. A grid of conducting lines, referred to as gate and source lines 4802 and 4804, runs between pixels 4806 and is used to address each transistor 4808 as shown in FIG. 48.

As described above, building the switch transistors of a conventional LCD, as well as any other silicon-based electronics circuits, on the glass panel presents difficulties in that crystalline silicon cannot be grown on glass. As a result, selection and driver electronics, as well as the frame memory blocks, are typically implemented in separately manufactured silicon integrated circuits which are then attached to the glass panel. This necessitates wiring to connect these electronic components to the pixel-controlling transistors.

By contrast, the present invention takes advantage of the techniques described above which enable the fabrication of electronic components on a variety of surfaces, including glass. According to specific embodiments of the invention, all of the electronic components necessary for an AMLCD are fabricated directly on the display's glass panel, thus eliminating the difficulties associated with using semiconductor electronics for an AMLCD.

According to one such embodiment, all-metal electronics (such as those described above) implement storage functions using the all-metal nonvolatile memory cell called SpinRAM. In addition, memory and pixel/subpixel selection and logic functions are implemented using circuits based on the all-metal transpinnor. These all-metal components are combined to implement all the essential electronic functional components needed for an AMLCD. These may include, but are not limited to, direct voltage control to each pixel/subpixel by a transpinnor switch, full-color all-metal frame memory (e.g., 24 bits/pixel or 8 bits/subpixel), selection electronics, and driver electronics.

Use of nonvolatile SpinRAM for the frame blocks eliminates the need to refresh the frame memory unless its contents are changed by the system controller. In addition, general-purpose controller functions, such as those needed for image-correction routines, can also be implemented using transpinnor electronics. Image-correction routines include, but are not limited, to gamma (color) correction for the pixel color quality, space dithering, time dithering, and prevention of color breakup.

As described above, and unlike semiconductor circuits, all-metal memory cells and transpinnor circuits can be built on a variety of surfaces, including glass and plastic substrates. They can be fabricated both in planar and three-dimensional stacked configurations. This enables all the necessary functional components of a display to be built onto the panel or other display substratum during the manufacturing process. The performance and quality level of all-metal components promises to match if not exceed that of crystalline silicon components. In addition, the cost of building all-metal components directly on glass or plastic is expected to be significantly lower than building polysilicon or continuous grain silicon (CGS) transistors. According to some embodiments, all-metal electronics will enable all display circuits, not only the pixel-driving devices, to be deposited directly on the display substratum. Moreover, transpinnor circuitry for the pixel drivers will have significantly higher performance than either polysilicon or CGS circuitry. Such embodiments will thereby significantly improve display-module functionality and reliability, as well as significantly reduce display-module costs.

Figure 49:
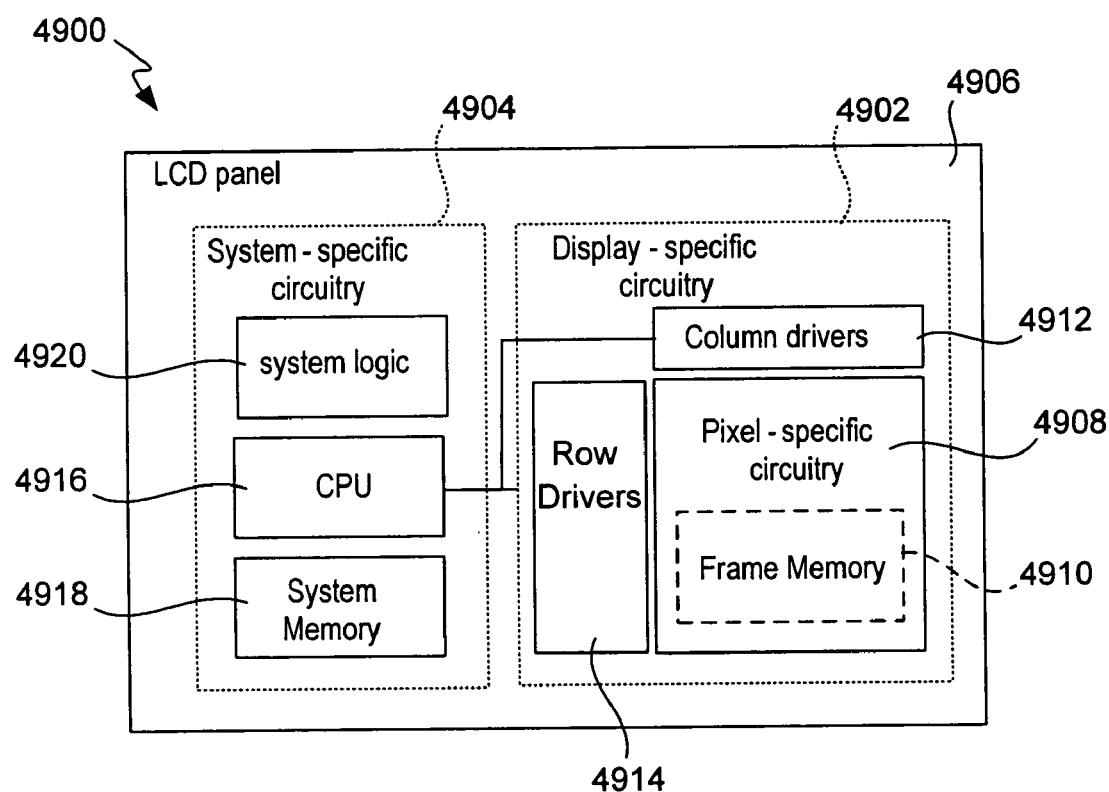
FIG. 49 is a simplified block diagram of a display device designed according to a specific embodiment of the invention.

FIG. 49 is a block diagram of an exemplary display device 4900 which includes both display-specific all-metal circuitry 4902 and system-specific all-metal circuitry 4904. As described above, the term "all-metal" refers to circuitry which does not include any semiconductor components, but which may include non-metallic materials, e.g., insulators. According to various embodiments, some or all of the all-metal circuitry is fabricated directly on display panel 4906. For example, embodiments are contemplated in which only circuitry 4902 is fabricated on panel 4906. Other embodiments are also contemplated in which circuitry 4902 and at least some portion of circuitry 4904 are fabricated on panel 4906.

In the embodiment shown, panel 4906 is an LCD panel such as the structure depicted in FIG. 46. However, according to different embodiments, panel 4906 may correspond to a variety of other display technologies (e.g., plasma), a variety of materials (e.g., glass, plastic, etc.), as well as a variety of substrate types (e.g., rigid and flexible).

Figure 50:
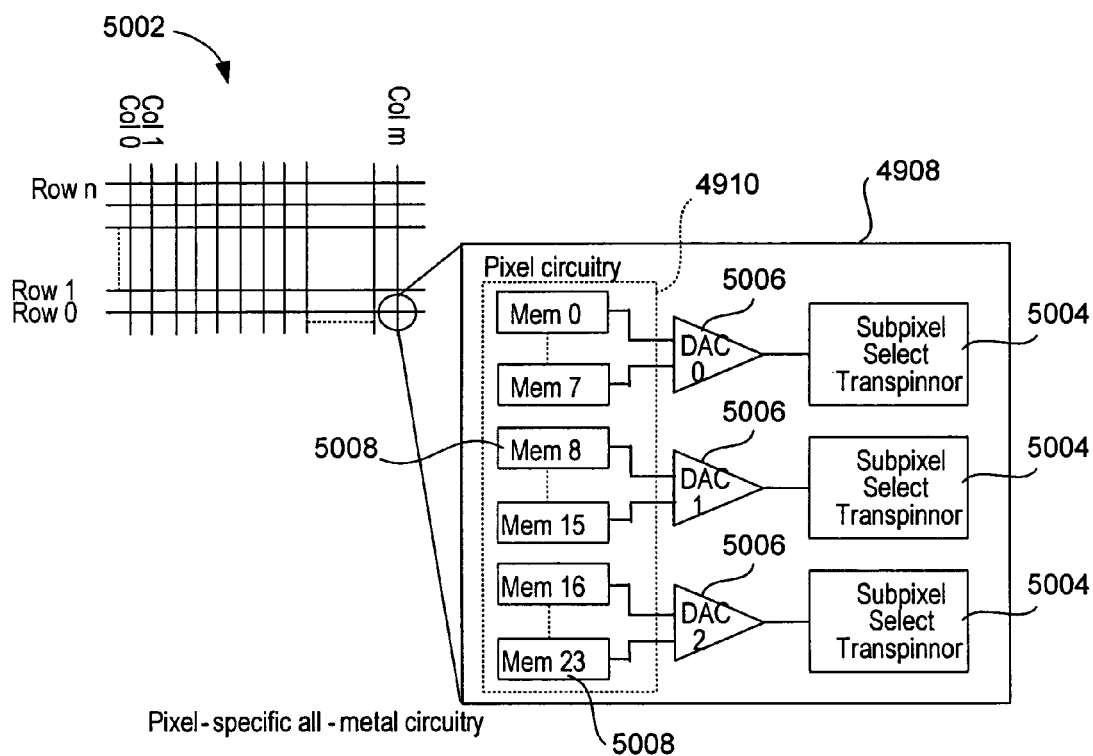
FIG. 50 is simplified schematic diagram of pixel-specific circuitry according to a specific embodiment of the invention.

Display-specific circuitry 4902 includes pixel-specific circuitry 4908 for controlling the operation of each individual pixel or subpixel in the display. Included in circuitry 4908 is all-metal frame memory 4910 which stores the frame data representing the voltages to be applied to the pixels. A specific implementation of circuitry 4908 is represented in FIG. 50.

In the color display embodiment depicted, display-specific circuitry 4908 includes row and column select lines 5002 by which individual subpixel select transpinnors 5004 are selected. Transpinnors 5004 may be implemented as described above. Alternatively, transpinnors 5004 may be replaced by an alternative all-metal switch. Frame memory 4910 comprises blocks of memory cells 5008. In the embodiment shown, blocks of eight memory cells 5008 are allocated to store the frame data for each subpixel. The frame data are converted to analog voltages by DACs 5006 and applied to the individual pixels or subpixels by transpinnors 5004.

According to various embodiments, frame memory 4910 may be implemented using any of a wide variety of all-metal memory technologies. According to specific embodiments, frame memory 4910 may be implemented according to any of the SpinRAM implementations described above. Such implementations include memory selection and read/write circuitry which have not been shown for clarity. Some of these implementations may employ the stacked architectures described herein. According to one such embodiment, the cells of a block of memory associated with a particular pixel or subpixel are stacked (along with the select transpinnor and DAC) over the corresponding pixel or subpixel as shown, for example, in FIG. 29A.

Referring once again to FIG. 49, display specific circuitry 4902 also includes row driver circuitry 4912 and column driver circuitry 4914. This circuitry includes line drivers and selection logic, all of which may be implemented using transpinnors as described above. Thus, all of the circuitry necessary for implementing a fully functional display device may be fabricated directly on the display panel itself.

According to some embodiments, display devices may be implemented which include circuitry beyond the display-specific circuitry necessary for a functional display. In FIG. 49, an example of such circuitry is shown as system-specific circuitry 4904. In the embodiment shown, system-specific circuitry 4904 includes a central processing unit (CPU) 4916, system memory 4918, and system logic 4920. According to various embodiments, CPU 4916 may comprise one or more microprocessors implemented using transpinnor based circuitry as described above. In addition, system memory 4918 may comprise any of the SpinRAM implementations described herein, and may include various levels of cache memory, main memory, and long term storage memory. Alternatively, CPU 4916 and system memory 4920 may be implemented using a wide range of all-metal solutions.

System logic 4920 may include any circuitry or functionality for controlling specific aspects of system operation. For example, system logic 4920 may include one or more memory controllers for controlling access to system memory 4918 by CPU 4916. System logic 4920 may also include a graphics controller and any associated circuitry necessary for generating the frame data for the display. System logic 4920 may also include all-metal image correction logic which includes, but is not limited to, gamma correction, and the prevention of space dithering, time dithering, and color breakup. According to various specific embodiments, system logic 4920 may be implemented using transpinnor-based circuits or any other all-metal alternatives.

As will be understood with reference to FIG. 49, embodiments of the invention are contemplated in which an entire computing system, e.g., a personal computer, is implemented on the panel of a display device. It will also be understood that the scope of the invention is not limited to any particular computer architecture. Rather, any general or special purpose computer may be implemented using all-metal circuits and components in the manner described herein.

Figure 51:
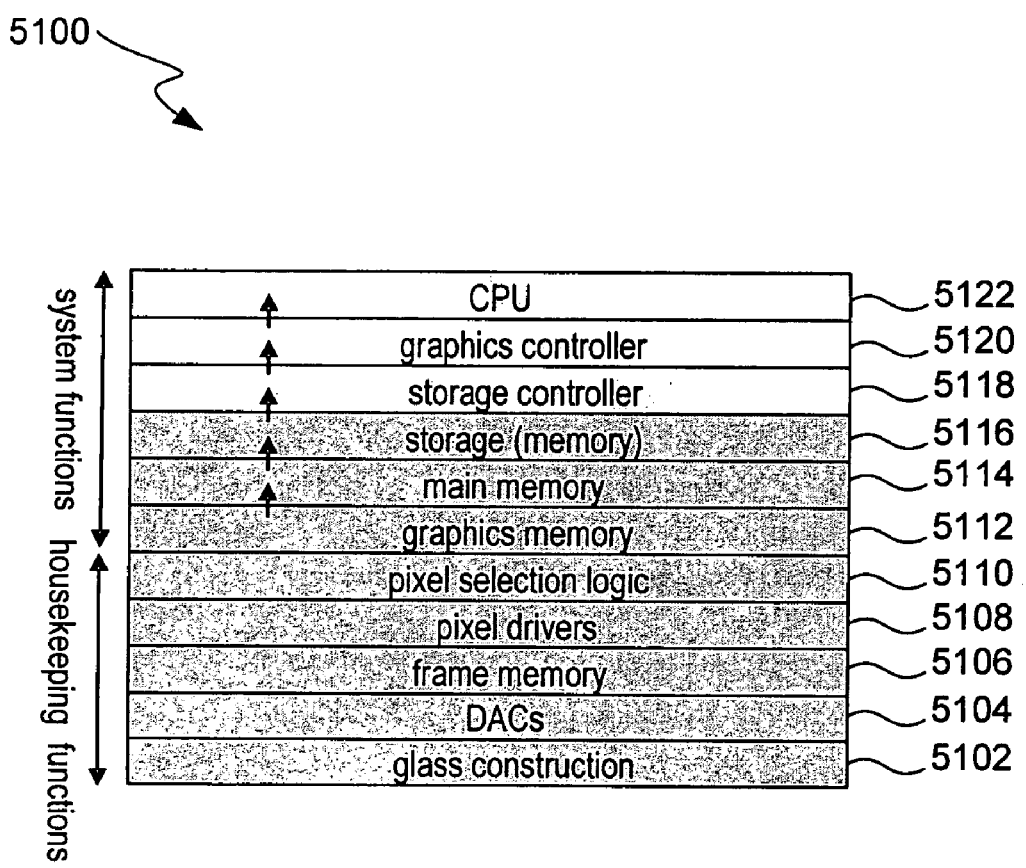
FIG. 51 is a representation of various functionalities of a display device designed according to a specific embodiment of the invention.

FIG. 51 is a generalized representation of a display device 5100 which may be implemented according to the present invention. According to various implementations, different combinations of the circuits and memory represented by the various levels may be implemented as all-metal circuits and memories on the panel of the display. The first five levels correspond to the display's housekeeping functions, i.e., those functions necessary for implementing a fully functional display device. These include the display panel 5102 itself (e.g., the back glass panel of an LCD), the pixel control switches and DACs (layer 5104), frame memory 5106, pixel drivers 5108, and pixel selection logic 5110. These housekeeping functions may correspond, for example, to display-specific circuitry 4902 of FIG. 49.

Display device 5100 may also include various types of system memory which are fabricated in the layers on panel 5102. These levels of memory may include graphics memory 5112, main memory 5114 (which may also include different levels of cache memory), and long term storage 5116. These levels of memory may correspond, for example, to system memory 4918 of FIG. 49.

Finally, display device 5100 may include additional system level processing, arithmetic, or control functions. In the embodiment shown, these functions include a memory or storage controller 5118, a graphics controller 5120, and a CPU 5122. These may correspond, for example, to CPU 4916 and system logic 4920 of FIG. 49.

As mentioned above, various embodiments of the invention may include different subsets of the functions identified in FIG. 51 implemented as all-metal circuitry in one or more layers of all-metal circuitry fabricated directly on display panel 5102. For example, a display device may be implemented which includes only circuitry and memory corresponding to the housekeeping functions. An augmented display device may also be implemented to include some or all of the system level memory represented by layers 5112, 5114, and 5116. Finally, a complete "system-on-a-display" may be implemented by including some or all of the functions represented by layers 5118, 5120, and 5122 among the all-metal circuitry.

It should be understood that the representation of FIG. 51 is a conceptual representation which should not be used to unduly limit the scope of the invention. That is, the various functions identified are depicted as being on separate levels for the purpose of clarity. However, these levels and the order in which they are depicted may or may not correspond to the layers of all-metal circuitry in an actual system or display implemented according to the invention. In addition, the circuit components implementing the functions depicted may be distributed among the physical layers of an actual implementation such that circuitry corresponding a particular function is distributed across multiple layers, and circuitry corresponding to different functions on the same layer.

For example, the pixel control switches and DACs represented by layer 5104 may be implemented in one or multiple layers of transpinnor circuitry. Similarly, the frame memory represented by layer 5106 may be implemented in different numbers of layers of all-metal memory cells and support electronics as described above with reference to various 3D structures. In addition, the circuitry implementing the functions represented by layers 5118, 5120, and 5122, or by layers 5108 and 5110 may distributed among multiple layers of all-metal circuitry in a variety of ways.

While the invention has been particularly shown and described with reference to specific embodiments thereof, it will be understood by those skilled in the art that changes in the form and details of the disclosed embodiments may be made without departing from the spirit or scope of the invention. For example, and as described above, display devices designed according to the invention may employ substratum comprising a variety of materials including, but not limited to, glass, plastic, metal, silicon, silicon nitride, silicon oxide, and polyimide. In addition, the substratum in various embodiments may be either rigid, flexible, or foldable. Moreover, various embodiments of the invention provide LCD, LED display, and plasma display devices. Various embodiments are also either transmissive, reflective, or emissive.

Therefore, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A display device, comprising a substratum and all-metal electronics formed on a surface of the substratum and operable to control operation of a plurality of basic visible elements associated with the substratum.

2. The display device of claim 1 wherein the substratum comprises one of glass, plastic, metal, silicon, silicon nitride, silicon oxide, or polyimide.

3. The display device of claim 1 wherein the substratum is part of a rigid assembly, a foldable assembly, or a flexible assembly.

4. The display device of claim 1 wherein the display device is one of transmissive, reflective or emissive.

5. The display device of claim 1 wherein an image generated by the display device is one of directly viewed or projected.

6. The display device of claim 1 wherein each of the plurality basic visible elements comprises a pixel, and each pixel comprises a plurality of subpixels.

7. The display device of claim 6 wherein the all-metal electronics are operable to control operation of each of the subpixels independently.

8. The display device of claim 1 wherein the all-metal electronics comprise a plurality of transpinnors, each transpinnor comprising a network of multi-layer thin-film elements, at least one thin-film element in the transpinnor exhibiting giant magnetoresistance, the transpinnor further comprising a conductor magnetically coupled to the at least one thin-film element for controlling operation of the transpinnor, wherein the transpinnor is operable to generate an output signal which is a function of a resistive imbalance among the thin-film elements and which is substantially proportional to a power current in the network of thin-film elements.

9. The display device of claim 8 wherein the plurality of transpinnors includes first transpinnors configured as switches, at least one of the first transpinnors being associated with each of the basic visible elements and being operable to control operation of the associated basic visible element.

10. The display device of claim 9 wherein the plurality of transpinnors includes second transpinnors configured as digital-to-analog converters (DACs), at least one of the DACs being associated with each of the basic visible elements and being operable to provide a control signal to the at least one first transpinnor corresponding to the associated basic visible element.

11. The display device of claim 10 further comprising a plurality of blocks of all-metal memory, at least one of the blocks of memory being associated with each of the basic visible elements and being operable to store image data for use by the at least one DAC corresponding to the associated basic visible element.

12. The display device of claim 11 wherein each basic visible element comprises a pixel comprising a first number of subpixels, and wherein the at least one first transpinnor comprises the first number of first transpinnors, the at least one DAC comprises the first number of DACs, and the at least one block of memory comprises the first number of blocks of memory, each subpixel corresponding to and being controlled by one of the first transpinnors, one of the DACs, and one of the blocks of memory.

13. The display device of claim 12 wherein each of the memory blocks is operable to store a plurality of bits of the image data.

14. The display device of claim 11 wherein the plurality of blocks of memory comprises frame memory and the image data comprise frame data.

15. The display device of claim 11 wherein the first transpinnors, the DACs, and the memory blocks are arranged in a plurality of stacked levels of the all-metal electronics.

16. The display device of claim 11 wherein the at least one first transpinnor, the at least one DAC, and the at least one memory block associated with each basic visible element are disposed in multiple layers of all-metal circuitry and comprise one of a plurality of interchangeable circuit modules.

17. The display device of claim 1 wherein the all-metal electronics comprise control switches for directly controlling operation of the basic visible elements, digital-to-analog converters (DACs) for converting image data to control the control switches, frame memory for storing the image data, and selection circuitry for enabling individual ones of the basic visible elements.

18. The display device of claim 17 wherein the all-metal electronics further comprise system memory for a computing system associated with the display device.

19. The display device of claim 18 wherein the system memory comprises graphics memory, main memory, and mass storage memory.

20. The display device of claim 18 wherein the all-metal electronics further comprises processing circuitry for carrying out processing functions of the computing system.

21. The display device of claim 20 wherein the processing circuitry comprises a memory controller, a graphics controller, and a central processing unit.

22. The display device of claim 17 wherein the frame memory comprises a plurality of memory cells, each memory cell comprising a multi-layer structure exhibiting magnetoresistance.

23. The display device of claim 22 wherein each multi-layer structure comprises:
 a plurality of magnetic layers, at least one of the magnetic layers being for magnetically storing one bit of information; and
 a plurality of the access lines integrated with the plurality of magnetic layers and configured such that the bit of information may be accessed using selected ones of the plurality of access lines and the giant magnetoresistive effect;
 wherein the magnetic layers are part of a substantially closed flux structure.

24. The display device of claim 22 wherein the plurality of memory cells are arranged in a plurality of substantially identical and interchangeable memory array modules.

25. The display device of claim 24 wherein each memory array module further comprises all-metal support electronics for controlling access to the corresponding memory array module.

26. The display device of claim 24 wherein the memory array modules are arranged in two dimensions and stacked in a third dimension.

27. The display device of claim 1 wherein the all-metal electronics comprise a computer.

28. A computer system, comprising at least one central processing unit, main memory, mass storage memory, a display device, display control electronics, and display memory, wherein the at least one central processing unit, the main memory, the mass storage memory, the display electronics, and the display memory are all implemented as all-metal electronics on a surface of the display device.

29. The computer system of claim 28 wherein the all-metal electronics comprise a plurality of transpinnors, each transpinnor comprising a network of multi-layer thin-film elements, at least one thin-film element in the transpinnor exhibiting giant magnetoresistance, the transpinnor further comprising a conductor magnetically coupled to the at least one thin-film element for controlling operation of the transpinnor, wherein the transpinnor is operable to generate an output signal which is a function of a resistive imbalance among the thin-film elements and which is substantially proportional to a power current in the network of thin-film elements.

30. The computer system of claim 28 wherein each of the main memory, the mass storage memory, and the display memory comprises a plurality of memory cells, each memory cell comprising a multi-layer structure exhibiting magnetoresistance.

31. The computer system of claim 30 wherein each multi-layer structure comprises:
 a plurality of magnetic layers, at least one of the magnetic layers being for magnetically storing one bit of information; and
 a plurality of the access lines integrated with the plurality of magnetic layers and configured such that the bit of information may be accessed using selected ones of the plurality of access lines and the giant magnetoresistive effect;
 wherein the magnetic layers are part of substantially closed flux structure.

* * * * *

UNITED STATES PATENT AND TRADEMARK OFFICE
CERTIFICATE OF CORRECTION

PATENT NO.         : 7,005,852 B2
APPLICATION NO.    : 10/806895
DATED              : February 28, 2006
INVENTOR(S)        : Andrei et al.

It is certified that error appears in the above-identified patent and that said Letters Patent is hereby corrected as shown below:

In the Claims:

In Column 44, please add the following claims after claim 31:

--32.   A liquid crystal display (LCD) device, comprising:

a display panel having a front substrate, a back substrate, a layer of liquid crystals between the front and back substrates, and an electrode layer for applying electric fields to the layer of liquid crystals, the liquid crystals and the electrode layer defining a plurality of basic visible elements;

all-metal electronics formed on the back substrate of the display panel, the all metal-electronics comprising control switches for directly controlling operation of the basic visible elements, digital-to-analog converters (DACs) for converting image data to control the control switches, frame memory for storing the image data, and selection circuitry for enabling individual ones of the basic visible elements.--

UNITED STATES PATENT AND TRADEMARK OFFICE
CERTIFICATE OF CORRECTION

| | |
|---|---|
| PATENT NO. | : 7,005,852 B2 |
| APPLICATION NO. | : 10/806895 |
| DATED | : February 28, 2006 |
| INVENTOR(S) | : Andrei et al. |

It is certified that error appears in the above-identified patent and that said Letters Patent is hereby corrected as shown below:

In the Claims (continued):

--33. The LCD device of claim 32 wherein the control switches and the DACs are implemented with transpinnors, each transpinnor comprising a network of multi-layer thin-film elements, at least one thin-film element in the transpinnor exhibiting giant magnetoresistance, the transpinnor further comprising a conductor magnetically coupled to the at least one thin-film element for controlling operation of the transpinnor, wherein the transpinnor is operable to generate an output signal which is a function of a resistive imbalance among the thin-film elements and which is substantially proportional to a power current in the network of thin-film elements.--

--34. The LCD device of claim 33 wherein the frame memory comprises a plurality of blocks of all-metal memory, at least one of the blocks of memory being associated with each of the basic visible elements and being operable to store the image data therefor.--

--35. The LCD device of claim 34 wherein each basic visible element comprises a pixel having a plurality of subpixels, each subpixel corresponding to and being controlled by one of the control switches, one of the DACs, and one of the blocks of memory.--

UNITED STATES PATENT AND TRADEMARK OFFICE
CERTIFICATE OF CORRECTION

PATENT NO. : 7,005,852 B2
APPLICATION NO. : 10/806895
DATED : February 28, 2006
INVENTOR(S) : Andrei et al.

It is certified that error appears in the above-identified patent and that said Letters Patent is hereby corrected as shown below:

In the Claims (continued):

--36. The LCD device of claim 35 wherein each of the memory blocks is operable to store at least one bit of the image data.--

--37. The LCD device of claim 34 wherein the control switches, the DACs, and the memory blocks are arranged in a plurality of stacked levels of the all-metal electronics.--

--38. The LCD device of claim 37 wherein the control switches, the DACs, and the memory blocks associated with each basic visible element comprises one of a plurality of interchangeable circuit modules.--

--39. The LCD device of claim 32 wherein the frame memory comprises a plurality of memory cells, each memory cell comprising a multi-layer structure exhibiting magnetoresistance.--

UNITED STATES PATENT AND TRADEMARK OFFICE
CERTIFICATE OF CORRECTION

| | |
|---|---|
| PATENT NO. | : 7,005,852 B2 |
| APPLICATION NO. | : 10/806895 |
| DATED | : February 28, 2006 |
| INVENTOR(S) | : Andrei et al. |

It is certified that error appears in the above-identified patent and that said Letters Patent is hereby corrected as shown below:

In the Claims (continued):

--40. The LCD device of claim 39 wherein each multi-layer structure comprises:

a plurality of magnetic layers, at least one of the magnetic layers being for magnetically storing one bit of information; and a plurality of the access lines integrated with the plurality of magnetic layers and configured such that the bit of information may be accessed using selected ones of the plurality of access lines and the giant magnetoresistive effect;

wherein the magnetic layers are part of a substantially closed flux structure.--

--41. The LCD device of claim 32 wherein the selection circuitry comprises a plurality of transpinnors, each transpinnor comprising a network of multi-layer thin-film elements, at least one thin-film element in the transpinnor exhibiting giant magnetoresistance, the transpinnor further comprising a conductor magnetically coupled to the at least one thin-film element for controlling operation of the transpinnor, wherein the transpinnor is operable to generate an output signal which is a function of a resistive imbalance among the thin-film elements and which is substantially proportional to a power current in the network of thin-film elements.--

UNITED STATES PATENT AND TRADEMARK OFFICE
CERTIFICATE OF CORRECTION

| | | |
|---|---|---|
| PATENT NO. | : 7,005,852 B2 | |
| APPLICATION NO. | : 10/806895 | |
| DATED | : February 28, 2006 | |
| INVENTOR(S) | : Andrei et al. | |

It is certified that error appears in the above-identified patent and that said Letters Patent is hereby corrected as shown below:

In the Claims (continued):

--42. The LCD device of claim 41 wherein first ones of the transpinnors are configured as drivers, and second ones of the transpinnors are configured as logic gates which are operable as selection logic.--

--43. A light-emitting diode (LED) display device, comprising:

a display panel having a substrate and a plurality of LEDs on the substrate defining a plurality of basic visible elements; and all-metal electronics formed on the substrate of the display panel, the all metal-electronics comprising control switches for directly controlling operation of the basic visible elements, digital-to-analog converters (DACs) for converting image data to control the control switches, frame memory for storing the image data, and selection circuitry for enabling individual ones of the basic visible elements.--

UNITED STATES PATENT AND TRADEMARK OFFICE
CERTIFICATE OF CORRECTION

| | |
|---|---|
| PATENT NO. | : 7,005,852 B2 |
| APPLICATION NO. | : 10/806895 |
| DATED | : February 28, 2006 |
| INVENTOR(S) | : Andrei et al. |

It is certified that error appears in the above-identified patent and that said Letters Patent is hereby corrected as shown below:

In the Claims (continued):

--44. The LED display device of claim 43 wherein the control switches and the DACs are implemented with transpinnors, each transpinnor comprising a network of multi-layer thin-film elements, at least one thin-film element in the transpinnor exhibiting giant magnetoresistance, the transpinnor further comprising a conductor magnetically coupled to the at least one thin-film element for controlling operation of the transpinnor, wherein the transpinnor is operable to generate an output signal which is a function of a resistive imbalance among the thin-film elements and which is substantially proportional to a power current in the network of thin-film elements.--

--45. The LED display device of claim 44 wherein the frame memory comprises a plurality of blocks of all-metal memory, at least one of the blocks of memory being associated with each of the basic visible elements and being operable to store the image data therefor.--

--46. The LED display device of claim 45 wherein each basic visible element comprises a pixel having a plurality of subpixels, each subpixel corresponding to and being controlled by one of the control switches, one of the DACs, and one of the blocks of memory.--

UNITED STATES PATENT AND TRADEMARK OFFICE
CERTIFICATE OF CORRECTION

PATENT NO. : 7,005,852 B2
APPLICATION NO. : 10/806895
DATED : February 28, 2006
INVENTOR(S) : Andrei et al.

It is certified that error appears in the above-identified patent and that said Letters Patent is hereby corrected as shown below:

In the Claims (continued):

--47. The LED display device of claim 46 wherein each of the memory blocks is operable to store at least one bit of the image data.--

--48. The LED display device of claim 45 wherein the control switches, the DACs, and the memory blocks are arranged in a plurality of stacked levels of the all-metal electronics.--

--49. The LED display device of claim 48 wherein the control switches, the DACs, and the memory blocks associated with each basic visible element comprises one of a plurality of interchangeable circuit modules.--

--50. The LED display device of claim 43 wherein the frame memory comprises a plurality of memory cells, each memory cell comprising a multi-layer structure exhibiting magnetoresistance.--

UNITED STATES PATENT AND TRADEMARK OFFICE
CERTIFICATE OF CORRECTION

PATENT NO.          : 7,005,852 B2
APPLICATION NO. : 10/806895
DATED                  : February 28, 2006
INVENTOR(S)        : Andrei et al.

It is certified that error appears in the above-identified patent and that said Letters Patent is hereby corrected as shown below:

In the Claims (continued):

--51. The LED display device of claim 50 wherein each multi-layer structure comprises:

a plurality of magnetic layers, at least one of the magnetic layers being for magnetically storing one bit of information; and a plurality of the access lines integrated with the plurality of magnetic layers and configured such that the bit of information may be accessed using selected ones of the plurality of access lines and the giant magnetoresistive effect;

wherein the magnetic layers are part of a substantially closed flux structure.--

--52. The LED display device of claim 43 wherein the selection circuitry comprises a plurality of transpinnors, each transpinnor comprising a network of multi-layer thin-film elements, at least one thin-film element in the transpinnor exhibiting giant magnetoresistance, the transpinnor further comprising a conductor magnetically coupled to the at least one thin-film element for controlling operation of the transpinnor, wherein the transpinnor is operable to generate an output signal which is a function of a resistive imbalance among the thin-film elements and which is substantially proportional to a power current in the network of thin-film elements.--

UNITED STATES PATENT AND TRADEMARK OFFICE
CERTIFICATE OF CORRECTION

PATENT NO. : 7,005,852 B2
APPLICATION NO. : 10/806895
DATED : February 28, 2006
INVENTOR(S) : Andrei et al.

It is certified that error appears in the above-identified patent and that said Letters Patent is hereby corrected as shown below:

In the Claims (continued):

--53. The LED display device of claim 52 wherein first ones of the transpinnors are configured as drivers, and second ones of the transpinnors are configured as logic gates which are operable as selection logic.--

--54. A plasma display device, comprising:

a plasma display panel having a substrate, the display panel defining a plurality of basic visible elements;

all-metal electronics formed on the substrate of the display panel, the all metal-electronics comprising control switches for directly controlling operation of the basic visible elements, digital-to-analog converters (DACs) for converting image data to control the control switches, frame memory for storing the image data, and selection circuitry for enabling individual ones of the basic visible elements.--

UNITED STATES PATENT AND TRADEMARK OFFICE
CERTIFICATE OF CORRECTION

PATENT NO. : 7,005,852 B2
APPLICATION NO. : 10/806895
DATED : February 28, 2006
INVENTOR(S) : Andrei et al.

It is certified that error appears in the above-identified patent and that said Letters Patent is hereby corrected as shown below:

In the Claims (continued):

--55. The plasma display device of claim 54 wherein the control switches and the DACs are implemented with transpinnors, each transpinnor comprising a network of multi-layer thin-film elements, at least one thin-film element in the transpinnor exhibiting giant magnetoresistance, the transpinnor further comprising a conductor magnetically coupled to the at least one thin-film element for controlling operation of the transpinnor, wherein the transpinnor is operable to generate an output signal which is a function of a resistive imbalance among the thin-film elements and which is substantially proportional to a power current in the network of thin-film elements.--

--56. The plasma display device of claim 55 wherein the frame memory comprises a plurality of blocks of all-metal memory, at least one of the blocks of memory being associated with each of the basic visible elements and being operable to store the image data therefor.--

UNITED STATES PATENT AND TRADEMARK OFFICE
CERTIFICATE OF CORRECTION

| | |
|---|---|
| PATENT NO. | : 7,005,852 B2 |
| APPLICATION NO. | : 10/806895 |
| DATED | : February 28, 2006 |
| INVENTOR(S) | : Andrei et al. |

It is certified that error appears in the above-identified patent and that said Letters Patent is hereby corrected as shown below:

In the Claims (continued):

--57. The plasma display device of claim 56 wherein each basic visible element comprises a pixel having a plurality of subpixels, each subpixel corresponding to and being controlled by one of the control switches, one of the DACs, and one of the blocks of memory.--

--58. The plasma display device of claim 57 wherein each of the memory blocks is operable to store at least one bit of the image data.--

--59. The plasma display device of claim 56 wherein the control switches, the DACs, and the memory blocks are arranged in a plurality of stacked level of the all-metal electronics.--

--60. The plasma display device of claim 59 wherein the control switches, the DACs, and the memory blocks associated with each basic visible element comprises one of a plurality of interchangeable circuit modules.--

UNITED STATES PATENT AND TRADEMARK OFFICE
CERTIFICATE OF CORRECTION

| | | |
|---|---|---|
| PATENT NO. | : 7,005,852 B2 | |
| APPLICATION NO. | : 10/806895 | |
| DATED | : February 28, 2006 | |
| INVENTOR(S) | : Andrei et al. | |

It is certified that error appears in the above-identified patent and that said Letters Patent is hereby corrected as shown below:

In the Claims (continued):

--61.  The plasma display device of claim 54 wherein the frame memory comprises a plurality of memory cells, each memory cell comprising a multi-layer structure exhibiting magnetoresistance.--

--62.  The plasma display device of claim 61 wherein each multi-layer structure comprises:

a plurality of magnetic layers, at least one of the magnetic layers being for magnetically storing one bit of information; and a plurality of the access lines integrated with the plurality of magnetic layers and configured such that the bit of information may be accessed using selected ones of the plurality of access lines and the giant magnetoresistive effect;

wherein the magnetic layers are part of a substantially closed flux structure.--

UNITED STATES PATENT AND TRADEMARK OFFICE
CERTIFICATE OF CORRECTION

| | | |
|---|---|---|
| PATENT NO. | : 7,005,852 B2 | |
| APPLICATION NO. | : 10/806895 | |
| DATED | : February 28, 2006 | |
| INVENTOR(S) | : Andrei et al. | |

It is certified that error appears in the above-identified patent and that said Letters Patent is hereby corrected as shown below:

In the Claims (continued):

--63.  The plasma display device of claim 54 wherein the selection circuitry comprises a plurality of transpinnors, each transpinnor comprising a network of multi-layer thin-film elements, at least one thin-film element in the transpinnor exhibiting giant magnetoresistance, the transpinnor further comprising a conductor magnetically coupled to the at least one thin-film element for controlling operation of the transpinnor, wherein the transpinnor is operable to generate an output signal which is a function of a resistive imbalance among the thin-film elements and which is substantially proportional to a power current in the network of thin-film elements.--

--64.  The plasma display device of claim 63 wherein first ones of the transpinnors are configured as drivers, and second ones of the transpinnors are configured as logic gates which are operable as selection logic.--

Signed and Sealed this

Twenty-fifth Day of March, 2008

JON W. DUDAS
*Director of the United States Patent and Trademark Office*